(12) United States Patent
Remersaro

(10) Patent No.: US 10,215,803 B1
(45) Date of Patent: Feb. 26, 2019

(54) METHOD AND APPARATUS FOR CONCURRENT INTER-TEST RESPONSE COMPACTION AND DIAGNOSIS

(71) Applicant: Santiago Remersaro, Folsom, CA (US)

(72) Inventor: Santiago Remersaro, Folsom, CA (US)

( * ) Notice: Subject to any disclaimer, the term of this patent is extended or adjusted under 35 U.S.C. 154(b) by 262 days.

(21) Appl. No.: 14/515,249

(22) Filed: Oct. 15, 2014

(51) Int. Cl.
*G01R 31/28* (2006.01)
*G01R 31/3177* (2006.01)
*G01R 11/25* (2006.01)

(52) U.S. Cl.
CPC ................ *G01R 31/3177* (2013.01)

(58) Field of Classification Search
CPC .... G01R 31/318533; G01R 31/318547; G01R 31/318591; G01R 31/31926; G01R 31/3177; G01R 31/3192; G11C 11/5642; G11C 15/04; G11C 16/24; G11C 16/3495; G11C 29/00; G11C 29/52
See application file for complete search history.

(56) References Cited

U.S. PATENT DOCUMENTS

| | | | |
|---|---|---|---|
| 6,028,983 A * | 2/2000 | Jaber .............. | G01R 31/318536 714/30 |
| 6,327,687 B1 | 12/2001 | Rajski et al. | |
| 6,353,842 B1 | 3/2002 | Rajski et al. | |
| 7,185,253 B2 * | 2/2007 | Mitra ................ | G01R 31/3172 714/734 |
| 7,313,742 B2 * | 12/2007 | Takahashi ...... | G01R 31/318558 714/724 |
| 7,370,254 B2 | 5/2008 | Rajski et al. | |

(Continued)

OTHER PUBLICATIONS

Embedded Deterministic Test for Low Cost Manufacturing Test Rajski, Janusz. ITC International Test Conference, 0-7803-7542-4/02 $17.00 © 2002 IEEE, pp. 301-310.

(Continued)

*Primary Examiner* — Phung M Chung
(74) *Attorney, Agent, or Firm* — Mullen Law Firm P.C.; Karl Mullen

(57) ABSTRACT

Compressed electronic test response using multiple compressed samples of inner scan chains spanning a plurality of concatenated test patterns responses into a single entity in a manner that each scan cell of those scan chains is observed in at least two different compressed inner scan chain samples. At least two compressed scan chain samples that contain at least one sampled scan cell value in common are used to remove undefined values (Xs) from the compressed inner scan chain samples and to identify a scan cell sample containing an error (D or Dbar). Concatenating test pattern responses into a single entity increases test time and test data compression by allowing further reduction of scan chain length.

24 Claims, 50 Drawing Sheets

(56) References Cited

U.S. PATENT DOCUMENTS

| | | | | |
|---|---|---|---|---|
| 7,412,637 | B2* | 8/2008 | Wang | G01R 31/31926 714/729 |
| 7,487,420 | B2* | 2/2009 | Keller | G01R 31/318547 714/732 |
| 7,721,172 | B2* | 5/2010 | Wang | G01R 31/31926 714/724 |
| 7,743,302 | B2 | 6/2010 | Rajski et al. | |
| 7,882,409 | B2* | 2/2011 | Gizdarski | G01R 31/318547 714/25 |
| 7,890,827 | B2 | 2/2011 | Rajski et al. | |
| 7,945,833 | B1* | 5/2011 | Wang | G01R 31/318547 714/729 |
| 7,949,921 | B2* | 5/2011 | Gizdarski | G01R 31/318547 714/727 |
| 8,103,926 | B2* | 1/2012 | Gizdarski | G01R 31/318547 714/25 |
| 8,365,029 | B2* | 1/2013 | von Wendorff | G01R 31/318533 714/726 |
| 8,707,227 | B2* | 4/2014 | Gizdarski | G01R 31/318335 716/104 |
| 2003/0056164 | A1* | 3/2003 | Lauga | G01R 31/318536 714/726 |
| 2006/0200719 | A1* | 9/2006 | Keller | G01R 31/318547 714/732 |

OTHER PUBLICATIONS

Response Compaction with any Number of Unknowns using a new LFSR Architecture Volkerink, Erik, DAC 2005. Jun. 13-17, 2005. Anaheim, California, USA. Copyright 2005 ACM 1-59593-058-2/05/0006 . . . $5.00, pp. 117-122.

X-Press Compactor for 1000x Reduction of Test Data Rajski, J., International Test Conference, Paper 18.1, 1-4244-0292-1/06/$20.00 © 2006 IEEE, pp. 1-10.

X-Tolerant Test Response Compaction Mitra, Subhasish, 0740-7475/05/$20.00 © 2005 IEEE Copublished by the IEEE C S and the IEEE CASS IEEE Design & Test of Computers, pp. 566-574.

X-Compact: An Efficient Response Compaction Technique Mitra, Subhasish, IEEE Transactions on Computer-Aided Design of Integrated Circuits and Systems, vol. 23, No. 3, Mar. 2004, pp. 421-432.

X-Canceling MISR—An X-Tolerant Methodology for Compacting Output Responses with Unknowns Using a MISR Touba, Nur. International Test Conference, Paper 6.2 1-4244-1128-9/07/$25.00 © 2007 IEEE pp. 1-10

* cited by examiner

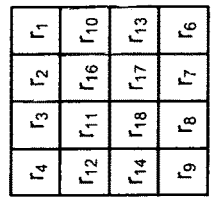
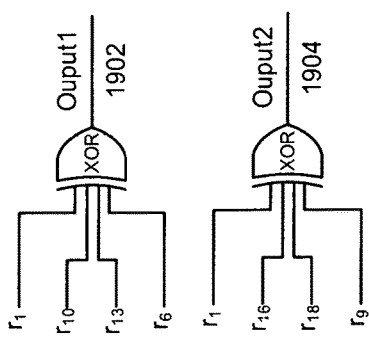
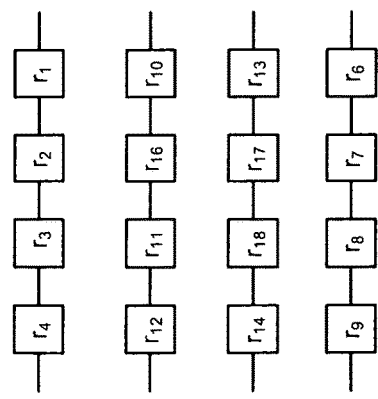
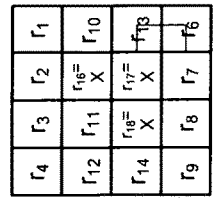
FIG. 19C Resulting Scan Cells in Matrix Form from FIG. 17 and FIG. 18
FIG. 19B Scan Output Wiring from FIG. 17 and FIG. 18
FIG. 19A Scan Chain Stitching from FIG. 17 and FIG. 18
FIG. 19D Resulting X Map from FIG. 17 and FIG. 18
FIG. 19

FIG. 21C Different Output Wiring from FIG. 19B due to Different Ouputs

FIG. 21B Resulting X Map from FIG. 19D

FIG. 21A Resulting Scan Cell Map from FIG. 19C

FIG. 22

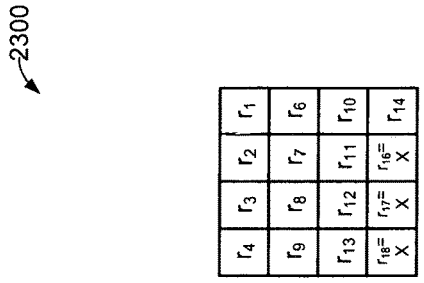
FIG. 23C Resulting X Map from FIG. 23A and FIG. 23B
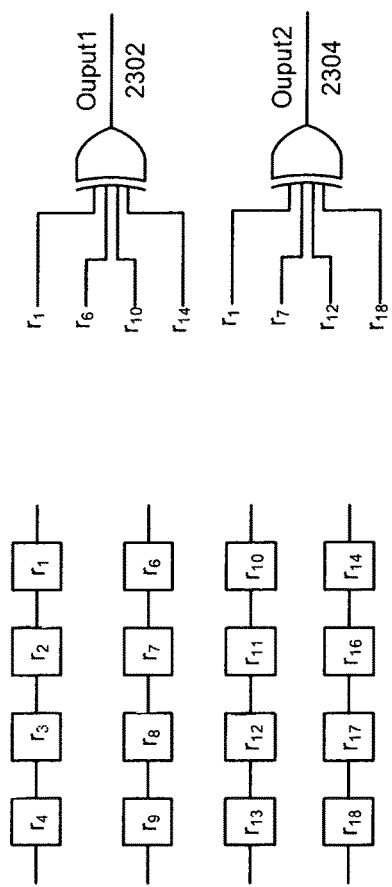
FIG. 23B Scan Output Wiring
FIG. 23A Scan Chain Stitching
FIG. 23

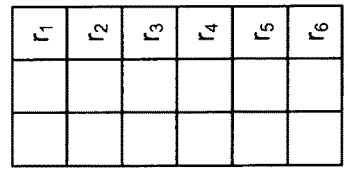
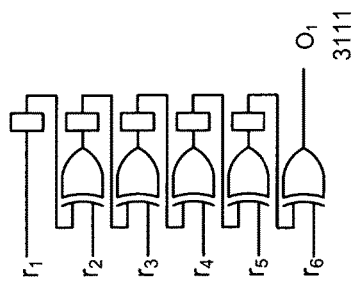
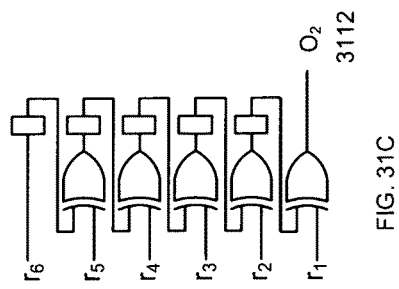
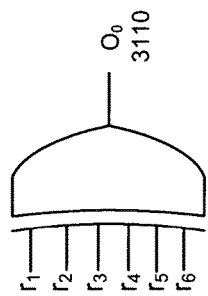
FIG. 31

| A | B | $f(A,B) = \overline{A}B + A\overline{B} = A \oplus B$ |
|---|---|---|
| 0 | 0 | 0 |
| 0 | 1 | 1 |
| 1 | 0 | 1 |
| 1 | 1 | 0 |

Figure 32

| $r_{i1}$ | $r_{i2}$ | .......... | $r_{il}$ |

Figure 33

| $r_{11}$ | $r_{12}$ | | $r_{1l}$ |
|---|---|---|---|
| $r_{21}$ | | | |
| • | | | |
| $r_{m1}$ | | | $r_{ml}$ |

Figure 34

| $r_{11}$ | $r_{12}$ | ... | $r_{1N}$ | $T_1$ |
|---|---|---|---|---|
| $r_{21}$ | | | | $T_2$ |
| . | | | . | . |
| $r_{N1}$ | $r_{N2}$ | | $r_{NN}$ | $T_N$ |
| $S_1$ | $S_2$ | ... | $S_N$ | |

Figure 35

| $a_{11}$ | $a_{12}$ | $a_{13}$ | $a_{14}$ | $a_{15}$ | ... | $a_{1N}$ | $r_1$ |
|---|---|---|---|---|---|---|---|
| $a_{21}$ | $a_{22}$ | $a_{23}$ | $a_{24}$ | $a_{25}$ | ... | $a_{2N}$ | $r_2$ |
| $a_{31}$ | $a_{32}$ | $a_{33}$ | $a_{34}$ | $a_{35}$ | ... | $a_{3N}$ | $r_3$ |
| $a_{41}$ | $a_{42}$ | $a_{43}$ | $a_{44}$ | $a_{45}$ | ... | $a_{4N}$ | $r_4$ |
| $a_{51}$ | $a_{52}$ | $a_{53}$ | $a_{54}$ | $a_{55}$ | ... | $a_{5N}$ | $r_5$ |
| . | . | . | . | . | ... | . | . |
| . | . | . | . | . | ... | . | . |
| . | . | . | . | . | ... | . | . |
| $a_{N1}$ | $a_{N2}$ | $a_{N3}$ | $a_{N4}$ | $a_{N5}$ | ... | $a_{NN}$ | $r_N$ |
| $c_1$ | $c_2$ | $c_3$ | $c_4$ | $c_5$ | ... | $c_N$ | |

Figure 36

| $a_{11}$ | $a_{12}$ | $a_{13}$ | $a_{14}$ | $a_{15}$ | ... | $a_{1N}$ | $r_1$ |
|---|---|---|---|---|---|---|---|
| $a_{21}$ | $a_{22}$ | $a_{23}$ | $a_{24}$ | $a_{25}$ | ... | $a_{2N}$ | $r_2$ |
| $a_{31}$ | $a_{32}$ | $a_{33}$ | $a_{34}$ | $a_{35}$ | ... | $a_{3N}$ | $r_3$ |
| $a_{41}$ | $a_{42}$ | $a_{43}$ | $a_{44}$ | $a_{45}$ | ... | $a_{4N}$ | $r_4$ |
| $a_{51}$ | $a_{52}$ | $a_{53}$ | $a_{54}$ | $a_{55}$ | ... | $a_{5N}$ | $r_5$ |
| . | . | . | . | . | ... | . | . |
| . | . | . | . | . | ... | . | . |
| . | . | . | . | . | ... | . | . |
| $a_{N1}$ | $a_{N2}$ | $a_{N3}$ | $a_{N4}$ | $a_{N5}$ | ... | $a_{NN}$ | $r_N$ |
| $c_1$ | $c_2$ | $c_3$ | $c_4$ | $c_5$ | ... | $c_N$ | |

Figure 37

| $a_{11}$ | $a_{12}$ | $a_{13}$ | $a_{14}$ | $a_{15}$ | $r_1$ |
|---|---|---|---|---|---|
| $a_{21}$ | $a_{22}$ | $a_{23}$ | $a_{24}$ | $a_{25}$ | $r_2$ |
| $a_{31}$ | $a_{32}$ | X | $a_{34}$ | $a_{35}$ | $r_3$ |
| $a_{41}$ | $a_{42}$ | $a_{43}$ | $a_{44}$ | $a_{45}$ | $r_4$ |
| $a_{51}$ | $a_{52}$ | $a_{53}$ | $a_{54}$ | $a_{55}$ | $r_5$ |
| $c_1$ | $c_2$ | $c_3$ | $c_4$ | $c_5$ | |

Figure 38

|  $a_{11}$ | $a_{12}$ | $a_{13}$ | $a_{14}$ | $a_{15}$ | $a_{16}$ | $r_1$ |
|---|---|---|---|---|---|---|
| $a_{21}$ | $a_{22}$ | $a_{23}$ | $a_{24}$ | $a_{25}$ | $a_{26}$ | $r_2$ |
| $a_{31}$ | $a_{32}$ | $a_{33}$ | $a_{34}$ | $a_{35}$ | $a_{36}$ | $r_3$ |
| $a_{41}$ | $a_{42}$ | $a_{43}$ | $a_{44}$ | X | $a_{46}$ | $r_4$ |
| $a_{51}$ | $a_{52}$ | $a_{53}$ | $a_{54}$ | $a_{55}$ | $a_{56}$ | $r_5$ |
| $c_1$ | $c_2$ | $c_3$ | $c_4$ | $c_5$ | $c_6$ | |

Figure 38A

|     |     |     |     |     |       |
|-----|-----|-----|-----|-----|-------|
| $a_{11}$ | $a_{12}$ | $a_{13}$ | $a_{14}$ | $a_{15}$ | $r_1$ |
| $a_{21}$ | $a_{22}$ | $a_{23}$ | $a_{24}$ | $a_{25}$ | $r_2$ |
| $a_{31}$ | $a_{32}$ | X   | $a_{34}$ | $a_{35}$ | $r_3$ |
| $a_{41}$ | $a_{42}$ | $a_{43}$ | $a_{44}$ | $a_{45}$ | $r_4$ |
| $a_{51}$ | $a_{52}$ | $a_{53}$ | $a_{54}$ | $a_{55}$ | $r_5$ |
| $c_1$ | $c_2$ | $c_3$ | $c_4$ | $c_5$ |   |

Figure 39

| $a_{11}$ | $a_{12}$ | $a_{13}$ | $a_{14}$ | $a_{15}$ | $a_{16}$ | $r_1$ |
|---|---|---|---|---|---|---|
| $a_{21}$ | $a_{22}$ | $a_{23}$ | $a_{24}$ | $a_{25}$ | $a_{26}$ | $r_2$ |
| $a_{31}$ | $a_{32}$ | X | $a_{34}$ | $a_{35}$ | $a_{36}$ | $r_3$ |
| $a_{41}$ | $a_{42}$ | $a_{43}$ | $a_{44}$ | $a_{45}$ | $a_{46}$ | $r_4$ |
| $a_{51}$ | $a_{52}$ | $a_{53}$ | $a_{54}$ | $a_{55}$ | $a_{56}$ | $r_5$ |
| $a_{61}$ | $a_{62}$ | $a_{63}$ | $a_{64}$ | $a_{65}$ | $a_{66}$ | $r_6$ |
| $a_{71}$ | $a_{72}$ | $a_{73}$ | $a_{74}$ | $a_{75}$ | $a_{76}$ | $r_7$ |
| $c_1$ | $c_2$ | $c_3$ | $c_4$ | $c_5$ | $c_6$ | |

Figure 40

| $a_{11}$ | $a_{12}$ | $a_{13}$ | $a_{14}$ | $a_{15}$ | $a_{16}$ | $a_{17}$ | $r_1$ |
|---|---|---|---|---|---|---|---|
| $a_{21}$ | $a_{22}$ | $a_{23}$ | $a_{24}$ | $a_{25}$ | $a_{26}$ | $a_{27}$ | $r_2$ |
| $a_{31}$ | $a_{32}$ | X | $a_{34}$ | $a_{35}$ | $a_{36}$ | $a_{37}$ | $r_3$ |
| $a_{41}$ | $a_{42}$ | $a_{43}$ | $a_{44}$ | $a_{45}$ | $a_{46}$ | $a_{47}$ | $r_4$ |
| $a_{51}$ | $a_{52}$ | $a_{53}$ | $a_{54}$ | $a_{55}$ | $a_{56}$ | $a_{57}$ | $r_5$ |
| $c_1$ | $c_2$ | $c_3$ | $c_4$ | $c_5$ | $c_6$ | $c_7$ | |

Figure 41

|   | M | N |
|---|---|---|
| j | X | X |
|   | D |   |
| k | X |   |

| $a_{11}$ | $a_{12}$ | $a_{13}$ | $a_{14}$ |
|---|---|---|---|
| $a_{21}$ | $a_{22}$ | $a_{23}$ | $a_{24}$ |

Figure 44A

| $a_{14}$ | $a_{11}$ | $a_{12}$ | $a_{13}$ |
|---|---|---|---|
| $a_{24}$ | $a_{21}$ | $a_{22}$ | $a_{23}$ |

Figure 44B

| $a_{13}$ | $a_{14}$ | $a_{11}$ | $a_{12}$ |
|---|---|---|---|
| $a_{23}$ | $a_{24}$ | $a_{21}$ | $a_{22}$ |

Figure 44C

| $a_{12}$ | $a_{13}$ | $a_{14}$ | $a_{11}$ |
|---|---|---|---|
| $a_{22}$ | $a_{23}$ | $a_{24}$ | $a_{21}$ |

|   | X | B |   | 1, 1' |
|---|---|---|---|---|
| X | X |   | 2 | 2' |
|   |   | 3 |   | 3' |
|   | 4 |   |   | 4' |
| 5 |   |   |   | 5' |

Figure 45A

|   |   | X | B | 1, 1' |
|---|---|---|---|---|
|   | X | X | 2 | 2' |
|   |   | 3 |   | 3' |
|   | 4 |   |   | 4' |
| 5 |   |   |   | 5' |

Figure 45B

|   |   |   | X | B 1, 1' |
|---|---|---|---|---|
|   |   | X | X 2 | 2' |
|   |   | 3 |   | 3' |
|   | 4 |   |   | 4' |
| 5 |   |   |   | 5' |

Figure 45C

|   |   |   | X | B 1, 1' |
|---|---|---|---|---|
|   |   | X | X 2 | 2' |
|   |   | 3 |   | 3' |
|   | 4 |   |   | 4' |
| 5 |   |   |   | 5' |

| $a_{11}$ | $a_{12}$ | $a_{13}$ | $a_{14}$ | $a_{15}$ | ... | $a_{1N}$ | $r_1$ |
|---|---|---|---|---|---|---|---|
| $a_{21}$ | $a_{22}$ | $a_{23}$ | $a_{24}$ | $a_{25}$ | ... | $a_{2N}$ | $r_2$ |
| $a_{31}$ | $a_{32}$ | $a_{33}$ | $a_{34}$ | $a_{35}$ | ... | $a_{3N}$ | $r_3$ |
| $c_1$ | $c_2$ | $c_3$ | $c_4$ | $c_5$ | ... | $c_N$ | |

Figure 46

| $a_{11}$ | $a_{12}$ | $a_{13}$ | $a_{14}$ | $a_{15}$ | $r_1$ |
|---|---|---|---|---|---|
| $a_{21}$ | $a_{22}$ | $a_{23}$ | $a_{24}$ | $a_{25}$ | $r_2$ |
| $a_{31}$ | $a_{32}$ | $a_{33}$ | $a_{34}$ | $a_{35}$ | $r_3$ |
| $c_1$ | $c_2$ | $c_3$ | $c_4$ | $c_5$ | |

Figure 47A

| $a_{35}$ | $a_{11}$ | $a_{12}$ | $a_{13}$ | $a_{14}$ | $r_1$ |
|---|---|---|---|---|---|
| $a_{25}$ | $a_{21}$ | $a_{22}$ | $a_{23}$ | $a_{24}$ | $r_2$ |
| $a_{15}$ | $a_{31}$ | $a_{32}$ | $a_{33}$ | $a_{34}$ | $r_3$ |
| $c_1$ | $c_2$ | $c_3$ | $c_4$ | $c_5$ | |

Figure 47B

| $a_{31}$ | $a_{32}$ | $a_{33}$ | $a_{34}$ | $a_{35}$ | $r_1$ |
|---|---|---|---|---|---|
| $a_{21}$ | $a_{22}$ | $a_{23}$ | $a_{24}$ | $a_{25}$ | $r_2$ |
| $a_{11}$ | $a_{12}$ | $a_{13}$ | $a_{14}$ | $a_{15}$ | $r_3$ |
| $c_1$ | $c_2$ | $c_3$ | $c_4$ | $c_5$ | |

| $a_{11}$ | $a_{12}$ | $a_{13}$ | $a_{14}$ | X |
|---|---|---|---|---|
| $a_{21}$ | $a_{22}$ | $a_{23}$ | $a_{24}$ | $a_{25}$ |
| $a_{31}$ | $a_{32}$ | $a_{33}$ | $a_{34}$ | $a_{35}$ |

Figure 48A

| $a_{35}$ | $a_{11}$ | $a_{12}$ | $a_{13}$ | $a_{14}$ |
|---|---|---|---|---|
| $a_{25}$ | $a_{21}$ | $a_{22}$ | $a_{23}$ | $a_{24}$ |
| X | $a_{31}$ | $a_{32}$ | $a_{33}$ | $a_{34}$ |

Figure 48B

| $a_{14}$ | $a_{35}$ | $a_{11}$ | $a_{12}$ | $a_{13}$ |
|---|---|---|---|---|
| $a_{24}$ | $a_{25}$ | $a_{21}$ | $a_{22}$ | $a_{23}$ |
| $a_{34}$ | X | $a_{31}$ | $a_{32}$ | $a_{33}$ |

Figure 48C

| $a_{13}$ | $a_{14}$ | $a_{35}$ | $a_{11}$ | $a_{12}$ |
|---|---|---|---|---|
| $a_{23}$ | $a_{24}$ | $a_{25}$ | $a_{21}$ | $a_{22}$ |
| $a_{33}$ | $a_{34}$ | X | $a_{31}$ | $a_{32}$ |

Figure 48D

| $a_{12}$ | $a_{13}$ | $a_{14}$ | $a_{35}$ | $a_{11}$ |
|---|---|---|---|---|
| $a_{22}$ | $a_{23}$ | $a_{24}$ | $a_{25}$ | $a_{21}$ |
| $a_{32}$ | $a_{33}$ | $a_{34}$ | X | $a_{31}$ |

Figure 48E

| $a_{11}$ | $a_{12}$ | $a_{13}$ | $a_{14}$ | X |
|---|---|---|---|---|
| $a_{21}$ | $a_{22}$ | $a_{23}$ | $a_{24}$ | $a_{25}$ |
| $a_{31}$ | $a_{32}$ | $a_{33}$ | $a_{34}$ | $a_{35}$ |

METHOD AND APPARATUS FOR CONCURRENT INTER-TEST RESPONSE COMPACTION AND DIAGNOSIS

RELATED APPLICATION

This application is related to U.S. application Ser. No. 14/515,236 filed on Oct. 15, 2014 titled "Method and Apparatus for Concurrent Test Response Compaction and Diagnosis" which is hereby incorporated by reference in its entirety.

FIELD OF THE INVENTION

The present invention pertains to electronic tests. More particularly, the present invention relates to Method and Apparatus for Concurrent Inter-Test Response Compaction and Diagnosis.

BACKGROUND OF THE INVENTION

Electronic circuits are tested to verify performance (e.g. performance and/or correct functioning and/or functional behavior). Integrated circuits (ICs) with millions and billions of transistors present a testing challenge because external testing alone is not effective because of unknown states (denoted by UPPER CASE X, NOT lower case x (which generally denotes a don't care state)) and complete testing times would take longer than the age of the universe for a 64 bit microprocessor. Test patterns are run in sequences of tests, one after another. However between these tests, that is, inter-test the circuits are not tested because the tests must be loaded to be run. This wastes time and resources. This presents a technical problem for which a technical solution using a technical means is needed.

Various other approaches have been used for testing. The following summaries are not an admission that anything discussed below is prior art or known to one skilled in the art.

"EMBEDDED DETERMINISTIC TEST FOR LOW COST MANUFACTURING TEST" Rajski, Janusz, ITC INTERNATIONAL TEST CONFERENCE, 0-7803-7542-4/02 $17.00 @ 2002 IEEE, pages 301-310 presents an approach. However as may be seen in FIG. 6 the test response compaction requires the use of a pattern mask to handle X (unknown) states propagating to scan cells. Rajski specifically mentions the need for scan chain masking and the added logic required (pg 306).

"Response Compaction with any Number of Unknowns using a new LFSR Architecture" Volkerink, Erik, DAC 2005, Jun. 13-17, 2005, Anaheim, Calif., USA. Copyright 2005 ACM 1-59593-058-2/05/0006 . . . $5.00, pages 117-122 presents an approach. However as may be seen Volkerink handles X's (unknown states) by forcing the X's to known values and additionally requires mask data (see Abstract). FIGS. 2-9 clearly show this.

"X-Press Compactor for 1000x Reduction of Test Data" Rajski, J., INTERNATIONAL TEST CONFERENCE, Paper 18.1, 1-4244-0292-1/06/$20.00© 2006 IEEE, pages 1-10 presents an approach. However as Rajski notes the approach requires scan chain selection logic (Abstract). Additionally mask registers are required (FIGS. 1, 3, 4).

"X-Tolerant Test Response Compaction" Mitra, Subhasish, 0740-7475/05/$20.00© 2005 IEEE Copublished by the IEEE C S and the IEEE CASS IEEE Design & Test of Computers, pages 566-574 presents an approach. However as may be seen Mitra requires an additional layer of logic and careful selection of bits (FIG. 2.(b)) plus an additional output (Output 5 in FIG. 2.(b)). Further Mitra uses AND gates for blocking (AND box in FIG. 4 and FIG. 5).

"X-Compact: An Efficient Response Compaction Technique" Mitra, Subhasish, IEEE TRANSACTIONS ON COMPUTER-AIDED DESIGN OF INTEGRATED CIRCUITS AND SYSTEMS, VOL. 23, NO. 3, MARCH 2004, pages 421-432 presents an approach. However as may be seen Mitra requires an additional layer of logic and careful selection of bits (FIG. 10) plus additional outputs (Outputs 5 and 6 in FIG. 10). Further Mltra's approach as noted is similar to Hamming codes used for single error correction (pg. 427) and so can only tolerate a single X per output.

" X-Canceling MISR—An X-Tolerant Methodology for Compacting Output Responses with Unknowns Using a MISR" Touba, Nur, INTERNATIONAL TEST CONFERENCE, Paper 6.2 1-4244-1128-9/07/$25.00© 2007 IEEE pages 1-10 presents an approach. However Touba uses a programmable XOR to cancel out X values and uses AND blocking (see FIGS. 4, 6, 7). Additionally Touba tolerates Xs as does an error detection and correction circuit.

U.S. Pat. No. 6,327,687 B1 "TEST PATTERN COMPRESSION FOR AN INTEGRATED CIRCUIT TEST ENVIRONMENT" Rajski et al., presents an approach. However Rajski is just concerned with compressing test patterns (Abstract) and if a solution is not found then he tries another set of equations (FIG. 11 at 94, 100, 96). Rajski introduces lower case x value as a don't care condition. Lower case x is not to be confused with upper case X as an unknown state. Rajski solves the equations with lower case x values to compress a test pattern.

U.S. Pat. No. 6,353,842 B1 "METHOD FOR SYNTHESIZING LINEAR FINITE STATE MACHINES" Rajski et al., presents an approach. However here Rajski is concerned with generating a smaller state machine given a polynomial for the circuit.

U.S. Pat. No. 7,370,254 B2 "COMPRESSING TEST RESPONSES USING A COMPACTOR" Rajski et al., presents an approach. However even in this approach masking or blocking of inputs to the compactor is required (see FIG. 14).

U.S. Pat. No. 7,743,302 B2 "COMPRESSING TEST RESPONSES USING A COMPACTOR" Rajski et al., presents an approach. However even in this approach masking or blocking of inputs to the compactor is required (see FIG. 14).

U.S. Pat. No. 7,890,827 B2 "COMPRESSING TEST RESPONSES USING A COMPACTOR" Rajski et al., presents an approach. However even in this approach masking or blocking of inputs to the compactor is required (see FIG. 14).

BRIEF DESCRIPTION OF THE DRAWINGS

The invention is illustrated by way of example and not limitation in the figures of the accompanying drawings.

FIG. 19 illustrates various embodiments of the invention.

FIG. 21 and FIG. 22 illustrate various embodiments of the invention.

FIG. 23 and FIG. 24 illustrate various embodiments of the invention.

FIG. 31 illustrates one embodiment of the invention showing other diagonal outputs inter-test.

FIG. 32 illustrates the XOR (exclusive OR) function table referred to in paragraph [0057].

FIG. 33 illustrates the example row of a scan chain of scan cells referred to in paragraph [0065].

FIG. 34 illustrates the example table of a set of scan chains and its scan cells referred to in paragraph [0065].

FIG. 35 illustrates the table showing the computation of the Slices (columns) and rows referred to in paragraph [0069].

FIG. 36 illustrates the table showing the test response referred to in paragraph [0077].

FIG. 37 illustrates the table showing $r_3 \oplus c_3$ no longer having the $a_{33}$ (the X) and therefore allowing the detection of the presenceof defects as referred to in paragraph [0079].

FIG. 38 illustrates the simple straight "diagonal" reffered to in paragraph [0081].

FIG. 38A illustrates the straight diagonal that wraps from $c_1$ to $c_5$ at $a_{35}$ as referred to in paragraph [0082].

FIG. 39 illustrates the table where a diagonal $m_1$ is straight and slants to the upper right while a straight diagonal $m_2$ slants to the left as referred to in paragraph [0083].

FIG. 40 illustrates the table showing a simple 6×7 chain to illustrate using $r_3$ and the shaded "diagonal" denoted m as referred to in paragraph [0084].

FIG. 41 illustrates the table showing column $c_3$ used in combination with a "diagonal" that uses scattered cells as referred to in paragraph [0085].

FIG. 42 illustrates the table showing blank rows or columns that can be any number of rows or columns as referred to in paragraph [0088].

FIG. 43 illustrates the table showing FIG. 42 but placing D at k,n, as referred to in paragraph [0089].

FIG. 44A illustrates the table showing 2 scan rows and 4 scan cells in each row as referred to in paragraph [0099].

FIG. 44B illustrates the table shown in FIG. 44A at the next clock, with both rows rotated and $a_{14}$ rotated to where $a_{11}$ is above and $a_{24}$ rotated to where $a_{21}$ is above and all the cells rotated right as referred to in paragraph [0099].

FIG. 44C illustrates the table shown in FIG. 44B at the next clock, showing as shaded cells the input to the XOR, as referred to in paragraph [0099].

FIG. 44D illustrates the table shown in FIG. 44B at the next clock, again showing as shaded cells the input to the XOR, as referred to in paragraph [0099].

FIG. 45A illustrates a table showing the initial state of a combination having a blocked diagonal and using an additional diagonal or a row or column as shown in paragraph [0101].

FIG. 45B illustrates the table shown in FIG. 45A at the next clock, having no terms involving X or B in output 1 or output 2, as referred to in paragraph [0101].

FIG. 45C illustrates the table shown in FIG. 45B at the next clock, where B is blocked because of the use of a diagonal in this output, as referred to in paragraph [0101].

FIG. 45D illustrates the table shown in FIG. 45C, where the output 3 blocks are shaded, as referred to in paragraph [0101].

FIG. 46 illustrates the table showing differing diagonals obtained when the $a_{3N}$ row $r_3$ output is fed back to the row $r_1$ $a_{11}$ input and the $a_{1N}$ row $r_1$ output is fed back to the row $r_3$ $a_{31}$ input, as referred to in paragraph [0109].

FIG. 47A illustrates the table having five columns and three rows, as referred to in paragraph [0110].

FIG. 47B illustrates the table shown in FIG. 47A at the next clock, as referred to in paragraph [0110].

FIG. 47C illustrates the table shown in FIG. 47B after a number of repeated clocks, as referred to in paragraph [0110].

FIG. 48A illustrates the table shown in FIG. 47A with an X at $a_{15}$ as referred to in paragraph [0111].

FIG. 48B illustrates the table shown in FIG. 48A at the next clock, as referred to in paragraph [0111].

FIG. 48C illustrates the table shown in FIG. 48B at the next clock, as referred to in paragraph [0111].

FIG. 48D illustrates the table shown in FIG. 48C at the next clock, as referred to in paragraph [0111].

FIG. 48E illustrates the table shown in FIG. 48D at the next clock, as referred to in paragraph [0111].

FIG. 48F illustrates the table shown in FIG. 48E after XORing, as described in paragraph [0111].

DETAILED DESCRIPTION

In one embodiment of the invention unknown states (X) can be removed without the use of a pattern mask. In one embodiment of the invention there is no need for scan chain masking.

In one embodiment of the invention there is no need to force X's to known values. In one embodiment of the invention there is no need for mask data.

In one embodiment of the invention there is no need for scan chain selection logic. In one embodiment of the invention there is no need for mask registers.

In one embodiment of the invention there is no need for a programmable XOR (exclusive OR) to cancel out X values. In one embodiment of the invention there is no need for AND blocking.

In one embodiment of the invention there is no need for masking or blocking of inputs to a compactor.

In one embodiment of the invention data, such as scan chain output data is combined using column data, row data, and "diagonal data" to remove unknown states denoted Xs (singular X, plural Xs) so that the combination will not have Xs since U XOR U=0. U denoting an X. XOR denoted ⊕. That is U⊕U=0.

In one embodiment of the invention the "diagonal data" is diagonal in a monotonic fashion and does not consist of strictly row and/or column data.

In one embodiment of the invention the "diagonal data" is diagonal only to the extent that it is not a column or row. That is, in some embodiments the diagonal data can be scattered non-monotonically across the data.

In one embodiment of the invention a XOR linear tree of scan chain outputs plus one or more XOR linear tree of inner scan chain scan cells are used to remove unknowns (X).

In one embodiment of the invention no attempt is made to avoid Xs corrupting the signature (output signature) on-chip.

In one embodiment of the invention an output signature is reconstructed in a tester by XORing outputs.

In one embodiment of the invention scan chain outputs are cycled with a multiplexer to the scan chain input.

The XOR (exclusive OR) function is understood to be and has these properties for variables A and B as shown in FIG. 32. p The bar will be denoted ' at times so $\overline{A}$ may be denoted A'

Using this notation the XOR Definition: A⊕B=AB'+A'B
From Table 1 we see that
IF B=$\overline{A}$ then A⊕B=1
and A⊕$\overline{A}$=1
Also if B=A then A⊕B=0 and A⊕A=0

Equation 1:

A⊕A=0

If B=0 than A⊕B=A then A⊕0=A

Equation 2:

A⊕0=A

It can also be proven from Table 1 that A⊕B=B⊕A that is commutative. (Since: 0⊕1=1 and 1⊕0=1 it holds that 0⊕1=1⊕0 then it is commutative.)

Equation 3:

A⊕B=B⊕A

Additionally the associative property may be confirmed as follows:

$$(A \oplus B) \oplus C = (A \oplus B)C' + (A \oplus B)'C \quad \text{from XOR Definition}$$
$$A \oplus B = AB' + A'B$$
$$= (AB' + A'B)C' + (AB + A'B')C$$
$$= AB'C' + A'BC' + ABC + A'B'C$$

Collect terms and simplify:

$$= A(B'C' + BC) + A'(BC' + B'C)$$
$$= A(B \oplus C)' + A'(B \oplus C)$$
$$= A \oplus (B \oplus C)$$

Equation 4:

(A⊕B)⊕C=A⊕(B⊕C)

Figure 3:
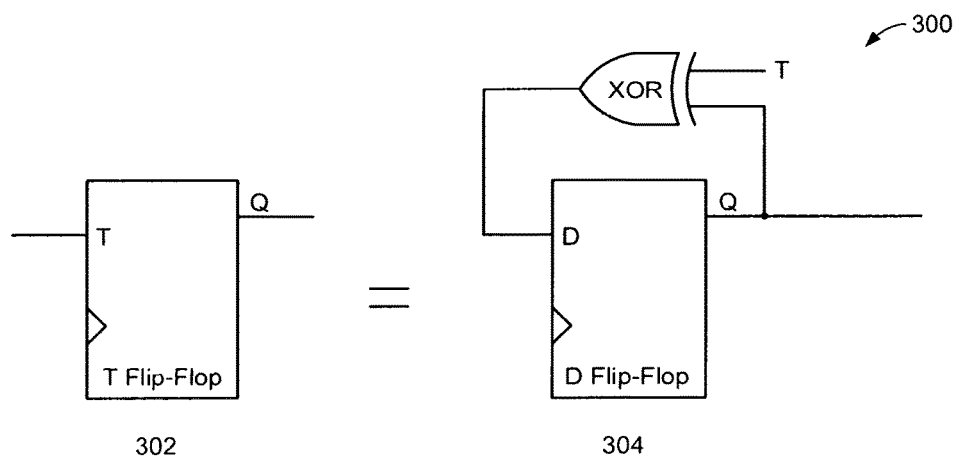
FIG. 3 illustrates one embodiment of the invention showing a T flip flop and the equivalent implemented in a D flip flop.

It is also noted that the (clock-set-reset) T flip flop may be smaller than a D flip flop in practice and that a T flip flop function is: $Q^{NEXT}=Q \oplus T$ where T in the input and Q is the output. FIG. 3 shows a T flip flop 302 and the equivalent implemented in a D flip flop 304. For the D flip flop with the logic shown:

Equation 5:

Q(n+1)=Q(n)⊕T where n are the stable intervals in between clock pulses (e.g. rising edges).

Q(n+1)=Q(n)⊕T. Other sequential elements, when combined with logic, can exhibit this behavior. The T flip-flop has exactly this behavior without any extra logic.

Notation

In general, a square will be a generic symbol for a scan cell of any type.

A row of squares will be a scan chain of scan cells of any type.

Figure 33:
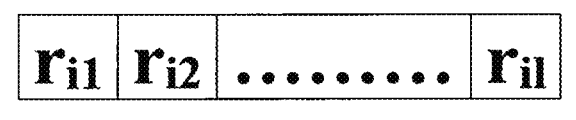

An example is shown in FIG. 33:

A column of squares will be called a slice and it will represent a set of scan cells that are unloaded from the scan chains at the same time period.

Figure 34:
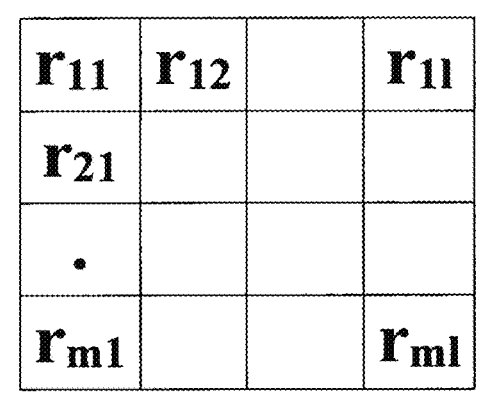

A table (or matrix) of squares will represent a set of scan chains and its scan cells as shown in FIG. 34.

In one embodiment of the invention an optimal case is to divide the scan cells in as many scan chains as the longest scan chain has scan cells. Then if m is the number of scan chains and l is the length of the longest scan chain: m=l. In this case:

m=l=√|scan cells|

In one embodiment of the invention, because loading cycles for the scan cells are separated from the unloading cycles of the scan cells, test time will increase by a factor of 2, since it takes one set of operations to load the scan chains and another to unload the scan chains.

In one embodiment of the invention the hardware uses XOR to generate a scan chain row set. For example, in FIG.

3 the $T_i$ elements $T_1, T_2, \ldots, T_N$ can be T flip flops or any other circuit elements that behave according to Equation 5.

In one embodiment of the invention, a test controller will execute in the following order after the capture of the Device Under Test (DUT) scan chains capture the DUT response to the test:

(1) Slices will be unloaded via the parity function:
$S_i = a_{1i} \oplus a_{2i} \oplus \ldots \oplus a_{Ni}$ (2) While this happens (1) $T_j$ will capture the XOR (parity function) of all elements of row j.

(3) Then the T flip-flops will not be pulsed and they will be unloaded through any output.

(4) At the same time as (3) the scan chains can be loaded with the next test.

Then for a response to a test a matrix R(N,N) exists, we have added to it the computation of the Slices (columns) and rows ($T_i$ in the table).

Referring to FIG. 35 as an example:

Now, if for all i, $r_{ii} = X$ (an unknown) then all $S_i$ and $T_j$ have an X and we can't detect any errors (D). However through logic simulation it is known where the Xs are, that all $r_{ii}$ are X and that there are no more Xs. So let's consider removing the X's via $S_i \oplus T_i$. We will show that $r_{ii}$ is not present in this computation result. Here's the proof:

$$S_i \oplus T_i = (r_{1,i} \oplus \ldots \oplus r_{N,i}) \oplus (r_{i,1} \oplus \ldots \oplus r_{i,N})$$

Using Equation 4 and Equation 3 (iteratively):

$$S_i \oplus T_i = (r_{1,i} \oplus \ldots \oplus r_{i-1,i} \oplus r_{i+1,i} \oplus \ldots \oplus r_{N,i} \oplus r_{i,1} \oplus \ldots \oplus r_{i,i-1} \oplus r_{i,i+1} \oplus \ldots \oplus r_{i,N}) \oplus r_{i,i} \oplus r_{i,i}$$

Using Equation 1:

$$S_i \oplus T_i = (r_{1,i} \oplus \ldots \oplus r_{i-1,i} \oplus r_{i+1,i} \oplus \ldots \oplus r_{N,i} \oplus r_{i,1} \oplus \ldots \oplus r_{i,i-1} \oplus r_{i,i+1} \oplus \ldots \oplus r_{i,N}) \oplus 0$$

Using Equation 2:

$$S_i \oplus T_i = r_{1,i} \oplus \ldots \oplus r_{i-1,i} \oplus r_{i+1,i} \oplus \ldots \oplus r_{N,i} \oplus r_{i,1} \oplus \ldots \oplus r_{i,i-1} \oplus r_{i,i+1} \oplus \ldots \oplus r_{i,N}$$

Then $r_{ii}$ not present in $S_i \oplus T_i$, and if a single D occurs in either slice i (column i) or row i, it will be detected when the ATE (automatic test equipment) computes $S_i \oplus T_i$.

In the previous example $r_{ii} = X$ for all $i = 1 \ldots N$ and therefore all Xs could be removed.

Also it will be noted that if $r_{jk} = D$ (a defect or error) then, $S_j \oplus T_k$ and $S_k \oplus T_j$ will differ from the golden response (known good response). This leaves $r_{jk}$ and $r_{kj}$ as the only places where the D may have occurred (which creates the possibility of real-time diagnosis). Since only $r_{jk}$ or $r_{kj}$ have a D, there is a very small set of faults that may have created the error.

In one embodiment of the invention the load cycles for a scan chain are separated from the unload cycles of a scan chain. In one embodiment this separation of the load and unload cycles for a scan chain results in the time required to test an IC by a factor of 2. However, in one embodiment of the invention scan chain division (more chains of shorter length) improves the test time by the factor of the division.

In one embodiment of the invention:

Total Single Pattern Data=Number of Scan Cells in the largest Scan Chain×Number of Outputs and since Total Single Pattern Data<Total Number of Scan Cells therefore compactor obtains compaction in data volume.

In the case where M is the number of scan chains and N is the length of the scan chains and where M=N then M=$\sqrt{\text{NumberofScanCells}}$ then time reduction=M/2.

In order to illustrate the technique of the present invention we will use some examples.

Figure 4:
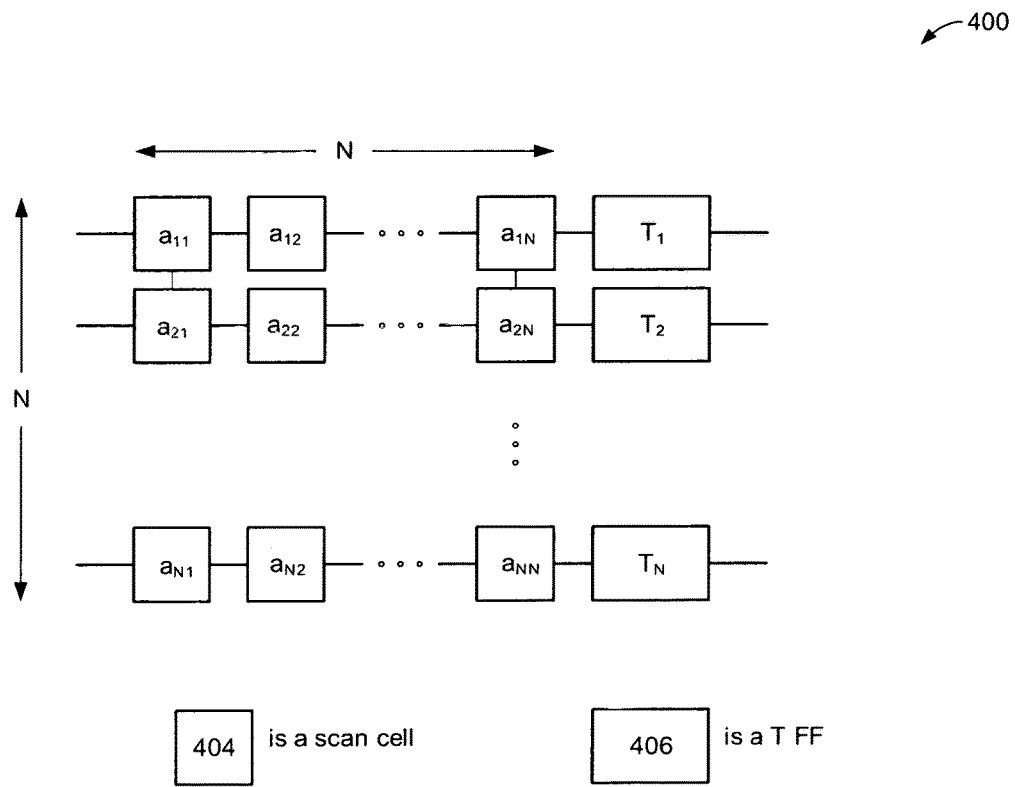
FIG. 4 illustrates one embodiment of the invention showing a N×N array.

In one embodiment of the invention the scan cells are arranged in a N×N array as indicated in FIG. 4 generally at 400 where 404 represents a scan cell and 406 represents a T flip flop (T FF). In operation after the scan chains (represented in FIG. 4 by the interconnected scan cells, $a_{11}, a_{12}$, to $a_{1N}, a_{21}, a_{22}$, to $a_{2N}$, and $a_{N1}, a_{N2}$ to $a_{NN}$) capture a circuit response that columns are unloaded by the parity function, $T_1, T_2, \ldots, T_N$ contain the rows. If unloaded through the same output that unloaded the parity function (or another way) what we have here if all tests is a test response i where $i = 1 \ldots$ to the number of tests.

For example the test response could be as shown in FIG. 36:

Where $a_{XY}$ denotes a test response and $r_x$ denotes a row x, and $c_y$ denotes a column y.

For discussion and illustration assume that $a_{33} = X$ (upper case X denoting an unknown value) potentially destroying detection in $c_3$ and $r_3$. And assume that we are aware that $a_{33} = X$ through simulation (for example an EDA program (electronic design automation)). In fact through the circuit or device under test (CUT, DUT) simulation we know all such locations for X denoted here as $d_{jk} = X$. If no compaction method is used then this non-compaction method will fail when comparing the response to a golden (known good) response if for that capture the X took the other value. Now $$r_3 = \bigoplus_{i=1}^{N} a_{3i}$$

and $$c_3 = \bigoplus_{i=1}^{N} a_{i3}$$

Then if during "post processing" we can perform $r_3 \oplus c_3$ then $a_{33}$ is not present in that computation.

This is proven as follows:

$$r_3 = a_{31} \oplus a_{32} \oplus a_{33} \oplus a_{34} \oplus \ldots \oplus a_{3N}$$

$$c_3 = a_{13} \oplus a_{23} \oplus a_{33} \oplus a_{43} \oplus \ldots \oplus a_{N3}$$

so $r_3 \oplus c_3 = a_{31} \oplus a_{32} \oplus a_{33} \oplus a_{34} \oplus \ldots \oplus a_{3N} \oplus a_{13} \oplus a_{23} \oplus a_{33} \oplus a_{43} \oplus \ldots \oplus a_{N3}$ Now we commute $a_{33}$ to the end from both ($r_3$ and $c_3$) and we have:

$$r_3 \oplus c_3 = a_{31} \oplus a_{32} \oplus a_{34} \oplus \ldots \oplus a_{3N} \oplus a_{13} \oplus a_{23} \oplus a_{43} \oplus \ldots \oplus a_{N3} \oplus a_{33} \oplus a_{33}$$

As we have shown $A \oplus A = 0$ so $a_{33} \oplus a_{33} = 0$ so now we have $$r_3 \oplus c_3 = a_{31} \oplus a_{32} \oplus a_{34} \oplus \ldots \oplus a_{3N} \oplus a_{13} \oplus a_{23} \oplus a_{43} \oplus \ldots \oplus a_{N3} \oplus 0$$

and as we have shown $A \oplus 0 = A$ so we are left with the expression $$r_3 \oplus c_3 = a_{31} \oplus a_{32} \oplus a_{34} \oplus \ldots \oplus a_{3N} \oplus a_{13} \oplus a_{23} \oplus a_{43} \oplus \ldots \oplus a_{N3}$$

Thus $r_3 \oplus c_3$ no longer has the $a_{33}$ (the X) and therefore we can detect the presence of defects (denoted Ds) in these regions (the rest of the column without $a_{33}$ and the rest of the row without $a_{33}$). These regions are shaded in FIG. 37.

Thus we see that the technique of XORing a row and column which have a common X removes that X and allows the detection of a defect (D) in the remaining row cells or column cells.

Nor is this technique limited to only rows and columns. To illustrate a simple straight "diagonal" we will use the simple 5×5 chain illustrated in FIG. 38 where at $a_{33}$ we have the unknown value X, and we will use row $r_3$ however rather than using a vertical column as we did in the example above we will use the shaded straight "diagonal" as the second term for XORing.

So the terms are now:

$$r_3 = a_{31} \oplus a_{32} \oplus a_{33} \oplus a_{34} \oplus a_{35N}$$

and the straight "diagonal" terms denoted sd are:

$$sd = a_{15} \oplus a_{24} \oplus a_{33} \oplus a_{42} \oplus a_{51}$$

Replacing $a_{33}$ with the unknown value X we have:

$$r_3 = a_{31} \oplus a_{32} \oplus X \oplus a_{34} \oplus a_{35}$$

$$sd = a_{15} \oplus a_{24} \oplus X \oplus a_{42} \oplus a_{51}$$

so $r_3 \oplus sd = a_{31} \oplus a_{32} \oplus X \oplus a_{34} \oplus a_{35} \oplus a_{15} \oplus a_{24} \oplus X \oplus a_{42} \oplus a_{51}$
and commuting X to the front this time we have:

$$r_3 \oplus sd = X \oplus X \oplus a_{31} \oplus a_{32} \oplus a_{34} \oplus a_{35} \oplus a_{15} \oplus a_{24} \oplus a_{42} \oplus a_{51}$$

$X \oplus X = 0$ so $$r_3 \oplus sd = 0 \oplus a_{31} \oplus a_{32} \oplus a_{34} \oplus a_{35} \oplus a_{15} \oplus a_{24} \oplus a_{42} \oplus a_{51}$$

and $0 \oplus A = A$ so:

$$r_3 \oplus sd = a_{31} \oplus a_{32} \oplus a_{34} \oplus a_{35} \oplus a_{15} \oplus a_{24} \oplus a_{42} \oplus a_{51}$$

and the X is removed.

The straight "diagonal" technique above can be used on any sized array and the straight "diagonal" terms used can simply wrap-around once they hit a boundary. For example, in the illustration in FIG. 38A the straight "diagonal" "starts" at $a_{12}$ and wraps from $c_1$ to $c_5$ at $a_{35}$ where the unknown X is at $a_{45}$.

For illustration purposes we have not shown the diagonal from $a_{54}$ wrapping to $a_{13}$ if all columns were to be covered. This would simply add another term to the m diagonal and would not affect the removal of the X.

To remove the X in this case we will use the straight "diagonal" m and column $c_5$.

$$c_5 = a_{15} \oplus a_{25} \oplus a_{35} \oplus X \oplus a_{55}$$

$$m = a_{12} \oplus a_{21} \oplus a_{36} \oplus X \oplus a_{54}$$

Again as illustrated in FIG. 38A we can remove the X and have $$m \oplus c_5 = a_{12} \oplus a_{21} \oplus a_{36} \oplus a_{54} \oplus a_{15} \oplus a_{25} \oplus a_{35} \oplus a_{55}$$

Nor must the technique use a column or row. What is to be appreciated is that the terms XORed share a common X. In the example in FIG. 39 diagonal $m_1$ is straight and slants to the upper right while straight diagonal $m_2$ slants to the left.

$$m_1 = a_{51} \oplus a_{42} \oplus X \oplus a_{24} \oplus a_{15}$$

$$m_2 = a_{11} \oplus a_{22} \oplus X \oplus a_{44} \oplus a_{55}$$

Manipulating as above we arrive at:

$$m_1 \oplus m_2 = a_{51} \oplus a_{42} \oplus a_{24} \oplus a_{15} \oplus a_{11} \neq a_{22} \oplus a_{44} \oplus a_{55}$$

Nor is this technique limited to straight "diagonals". We will use a simple 6×7 chain to illustrate using $r_3$ and the shaded "diagonal" denoted m as shown in FIG. 40.

Here $$r_3 = a_{31} \oplus a_{32} \oplus X \oplus a_{34} \oplus a_{35} \oplus a_{36}$$

$$m = a_{16} \oplus a_{15} \oplus a_{24} \oplus X \oplus a_{42} \oplus a_{51} \oplus a_{61} \oplus a_{71}$$

Again as above we can commute the X's together and remove them and we have $$m \oplus r_3 = a_{16} \oplus a_{15} \oplus a_{24} \oplus a_{42} \oplus a_{51} \oplus a_{61} \oplus a_{71} \oplus a_{31} \oplus a_{32} \oplus a_{34} \oplus a_{35} \oplus a_{36}$$

where X is removed from the scan chain output and so we can detect a defect in row $r_3$ and diagonal m at $a_{31}$, $a_{32}$, $a_{34}$, $a_{35}$, $a_{36}$, $a_{16}$, $a_{15}$, $a_{24}$, $a_{42}$, $a_{51}$, $a_{61}$, $a_{71}$.

Nor is this technique limited to only rows and columns or a monotonic "diagonal". For example, using the chain outputs in FIG. 52 we will show that a "diagonal" of outputs can be used to remove the same X. Here the column $c_3$ is used in combination with a "diagonal" that uses scattered cells as illustrated in FIG. 41 by the shading. "Diagonal" indicates that the cells selected are not a full horizontal row and not a full vertical column, full meaning including all the respective rows in a column or columns in a row.

This example will be shown in detail to illustrate several points.

Now for the column $c_3$ we have:

$$c_3 = a_{13} \oplus a_{23} \oplus X \oplus a_{43} \oplus a_{53}$$

and for the "diagonal" m we have:

$$m = a_{13} \oplus X \oplus a_{37} \oplus a_{58}$$

Now $$m \oplus c_3 = a_{13} \oplus X \oplus a_{37} \oplus a_{58} \oplus a_{13} \oplus a_{23} \oplus X \oplus a_{43} \oplus a_{53}$$

Now commuting the X's and removing we have $$m \oplus c_3 = a_{13} \oplus a_{37} \oplus a_{58} \oplus a_{13} \oplus a_{23} \oplus a_{43} \oplus a_{53}$$

But we also have in this equation two $a_{13}$ terms as highlighted here:

$$m \oplus c_3 = \underline{a_{13}} \oplus a_{37} \oplus a_{58} \oplus \underline{a_{13}} \oplus a_{23} \oplus a_{43} \oplus a_{53}$$

So just like the X terms, $a_{13} \oplus a_{13} = 0$ and the $a_{13}$ term is removed resulting in:

$$m \oplus c_3 = a_{37} \oplus a_{58} \oplus a_{23} \oplus a_{43} \oplus a_{53}$$

Now the significance of the $a_{13}$ term being removed is that we can no longer detect a defect (D) at $a_{13}$. Thus scan "coverage" for $a_{13}$ has been lost. This may be of detriment or it may be of benefit depending on the circumstances. It is a detriment if we are looking for a defect at $a_{13}$, on the other hand if we are not then the benefit is a reduced term expression for testing purposes. In this scenario $a_{13}$ is effectively hidden.

The illustrations above dealt with 2 intersecting terms that were XORed. That is a row and a column, or a row and a diagonal. or a column and a diagonal, or two "diagonals". Additionally, 2 scatter patterns could be used as long as they have a common X.

The present invention is not so limited and more than two terms or intersections my be handled.

Figure 42:
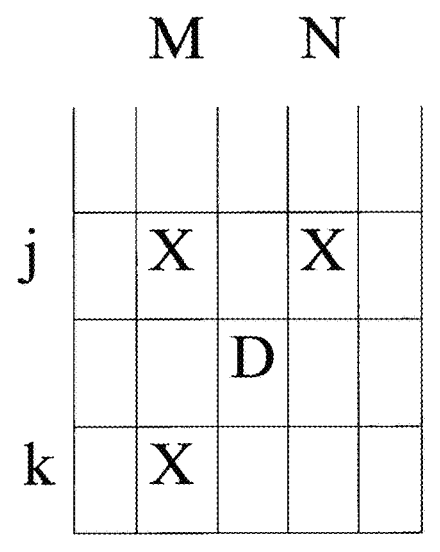

For example, denoting a row "r" and a subscript after the "r" as the specific row, and "c" as a column and a subscript after the "c" as the specific column consider the following where blank rows or columns can be any number of rows or columns i.e., as shown in FIG. 42:

So here we have $r_j$, $r_k$, $c_m$, and $c_n$ where there are unknowns (X) at row,column of j,m and jn, and k,m and a defect D not in row j or k or column m or n.

Now $r_j \oplus c_m$ will remove the X at j,m but not the X at k,m or the X at j,n.

Adding in $r_k$ so that we have $r_j \oplus c_m \oplus r_k$ will remove the X at k,m.

Adding in $c_n$ so that we have $r_j \oplus c_m \oplus r_k \oplus c_n$ will remove the X at j,n.

Thus the D can be detected.

Figure 43:
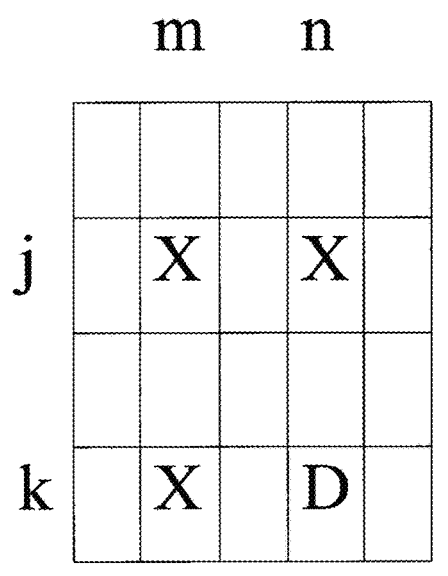

There are instances where there is possible "shadowing". Shadowing is also referred to as a blind spot or a blocked spot. For example, using the arrangement above but placing D at k,n as shown in FIG. 43.

So here we have $r_j$, $r_k$, $c_m$, and $c_n$ where there are unknowns (X) at row,column of j,m and j,n, and k,m and a defect D at k,n.

Now $r_j \oplus c_m$ will remove the X at j,m but not the X at k,m or the X at j,n.

Adding in $r_k$ so that we have $r_j \oplus c_m \oplus r_k$ will remove the X at k,m Adding in $c_n$ so that we have $r_j \oplus c_m \oplus r_k \oplus c_n$ will remove the X at j,n.

However the term $\oplus r_k \oplus c_n$ will also remove k,n from observation and so a D at k,n will not be observed and so a defect D at this location k,n cannot be detected. It is "shadowed" by the operations where just rows and columns are used for X elimination. This blind spot cannot be observed using this approach. As we will see the use of "diagonals" can make blind spots visible.

Figure 5:
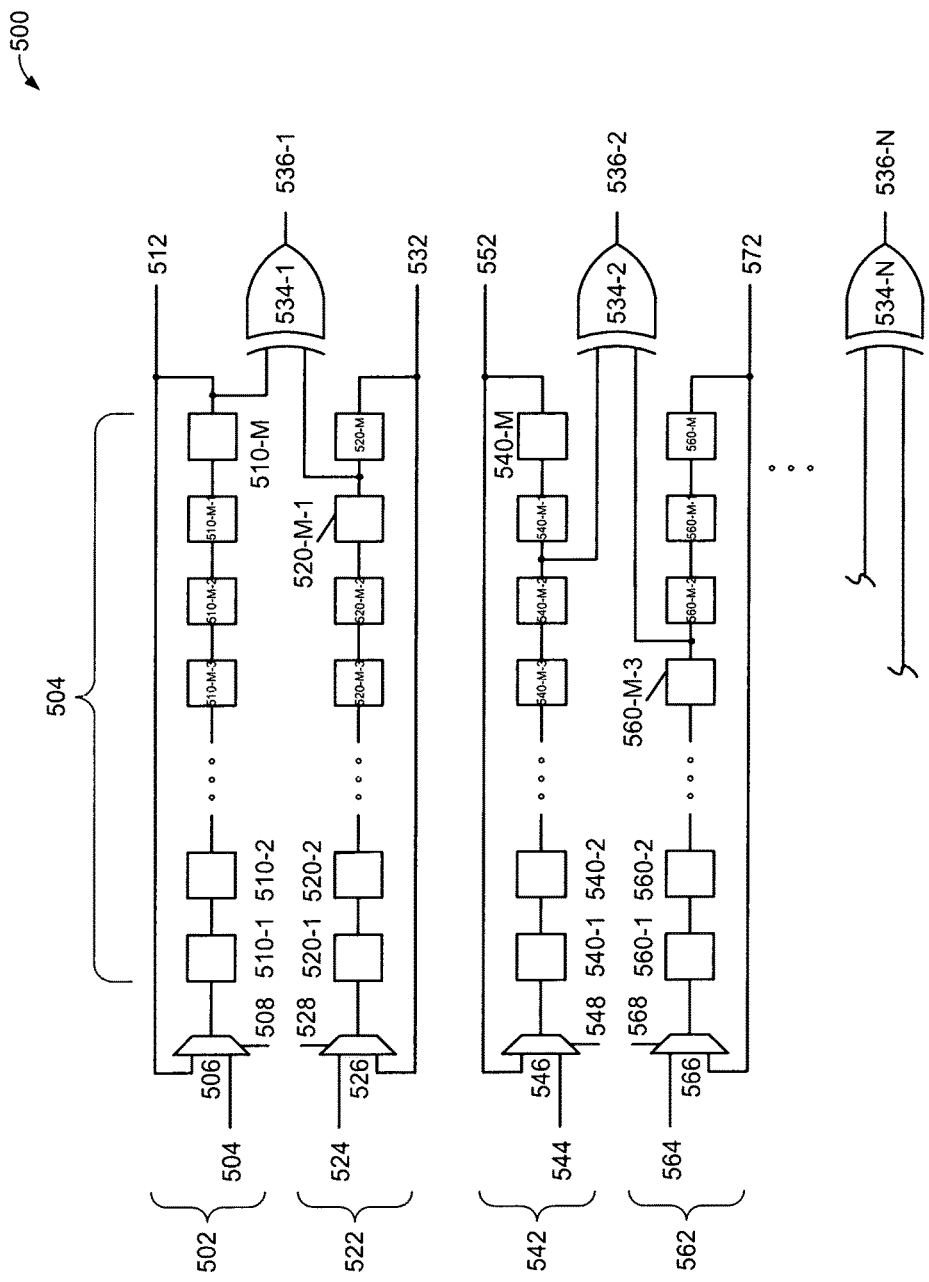
FIG. 5 illustrates one embodiment of the invention showing scan chains.

FIG. 5 illustrates, generally at 500, one embodiment of the invention. At 502 is a scan chain with major parts shown as follows. 506 is control block which takes 504 a scan in, an input receiving 512 (which happens to be the column output of scan chain 502), at 508 is a shift out control. At 504 for each scan chain are scan cells, here shown for scan chain 502 are 510-1, 510-2, . . . , 510-M. The scan cell 510-M output which is 512 is a column output and also goes to one input of 2-input XOR 534-1 which produces output 536-1.

At 522 is a second scan chain with major parts shown as follows. 526 is control block which takes 524 a scan in, an input receiving 532 (which happens to be the column output of scan chain 522), at 528 is a shift out control. At 504 for each scan chain are scan cells, here shown for scan chain 522 are 520-1, 520-2, . . . , 520-M. The scan cell 520-M-1 output goes to one input of 2-input XOR 534-1 which produces output 536-1.

This repeats for the 3rd and 4th scan chain 542 and 562 respectively as follows.

At 542 is a third scan chain with major parts shown as follows. 546 is control block which takes 544 a scan in, an input receiving 552 (which happens to be the column output of scan chain 542), at 548 is a shift out control. At 504 for each scan chain are scan cells, here shown for scan chain 542 are 540-1, 540-2, . . . , 540-M. The second scan cell output back from the output 552 which is 520-M-2 (not labeled) output goes to one input of 2-input XOR 534-2 which produces output 536-2.

At 562 is a fourth scan chain with major parts shown as follows. 566 is control block which takes 564 a scan in, an input receiving 572 (which happens to be the column output of fourth scan chain 562), at 568 is a shift out control. At 504 for each scan chain are scan cells, here shown for scan chain 562 are 560-1, 560-2, . . . , 560-M. The third scan cell output back from the output 572 which is 520-M-3 (labeled) output goes to one input of 2-input XOR 534-2 which produces output 536-2.

This sequence of chains and diagonal taps (e.g. 510-M. 520-M-1, 540M-3, 560M-3 . . . ) continues and produces to XOR gate 534-N outputs to 536-N for N*2 scan chains. If there are an odd number of scan chains then a 3 input XOR may be used.

In the embodiment shown in FIG. 5 the 536-1 to 536-N XOR outputs may be further fed to other multiple input XORs to finally produce a single XOR output In FIG. 5 the "tap" points for the XOR 534 proceed diagonally from the output and so this is an illustration of the "straight" diagonal.

FIG. 5 has the scan in to the scan cells 504 in each scan chain separated from the clocking out of the scan cell outputs. This is accomplished by, for example, in scan chain 502 by 506. Additionally, the output of scan cell 510-M which is a column output gets fed back via 512 to 506 which when clocking will "recirculate" the output of the last scan cell (510-M) to the input of the first scan cell 510-1. Since the scan cells are coupled in a chain fashion this recirculating causes the diagonal outputs (via the taps) to consider different inputs from the scan cells on each clock out cycle producing up to M outputs before repeating.

For example assume that we have 2 scan rows (like 502, and 522) and only 4 scan cells in each row as shown in FIG. 44A:

Let $a_{14}$ be 510-M and $a_{23}$ be 520M-1 so the first inputs to 534-1 would be the shaded cells $a_{14}$ and $a_{23}$.

On the next clock both rows rotate and $a_{14}$ rotates to where $a_{11}$ is above and $a_{24}$ rotates to where $a_{21}$ is above and all the cells rotate right so we end up with the layout shown in FIG. 44B.

So the inputs to the XOR are now $a_{13}$ and $a_{22}$.

On the next clock we have the layout shown in FIG. 44C where the shaded cells are the input to the XOR.

On the next clock we have as shown in FIG. 44D where the shaded cells are the input to the XOR.

And if we clock again we end up with the original arrangement as shown in FIG. 44A.

Thus by decoupling the scan in from the scan out and recirculating the outputs we can generate a variety of XOR terms.

In this simple case if we fully recirculate we get $$a_{14} \oplus a_{23}, a_{13} \oplus a_{22}, a_{12} \oplus a_{21}, a_{11} \oplus a_{24}$$

What is to be appreciated is that we have generated a whole set of "diagonal" terms that can be used to eliminate X's when for example, rows and columns are not enough to eliminate an X for example the example in FIG. 43, where D was shadowed by the three X's.

Recalling from the above shadowed example shown in FIG. 43:

So in FIG. 43 we have $r_j$, $r_k$, $c_m$, and $c_n$ where there are unknowns (X) at row,column of j,m and j,n, and k,m and a defect D at k,n.

Now $r_j \oplus c_m$ will remove the X at j,m but not the X at k,m or the X at j,n.

Now rather than using row k or column n to remove the X at j,n and the X at k,m which we saw shadowed D we will use the diagonal (diag) running from k,m through j,n and columns m and n and then demonstrate using rows j and k.

Using column m and the diagonal we have: $diag \oplus c_m$ which will remove the X at k,m and from column n and the diagonal we have: $diag \oplus c_n$ which will remove the X at j,n. Likewise we can use the rows j and k in combination with the diagonal (diag) to remove X at k,m and X at j,n.

Using row k and the diagonal we have: $diag \oplus r_k$ which will remove the X at k,m and from row j and the diagonal we have: $diag \oplus r_j$ which will remove the X at j,n.

Now some combinations using a diagonal may become blocked in which case another diagonal or a row or column may be needed. X's appear generally due to hold and/or setup violations (e.g. paths that are either too short or long)

or uninitialized state elements (e.g. memory, flip flops, etc.). Give an X configuration in a CUT (circuit under test) or a DUT (device under test) and a given diagonal set selected to observe the response some state elements may become unobservable for that pattern. In other words it's possible they are blocked. For example given the cells shown in FIG. 45A:

Where the observations are the last column on the right and the diagonal. Thus output $1=1\oplus2\oplus3\oplus4\oplus5$ that is the diagonal output $2=1'\oplus2'\oplus3'\oplus4'\oplus5'$ that is the last vertical column X denotes an unknown state and B is blocked.

We can observe this by looking at the equations as the cell values advance toward the right.

The initial state is shown in FIG. 45A.

After the next clock we have as shown in FIG. 45B:

Which has no terms involving X or B in output 1 or output 2

Then we have as shown in FIG. 45C:

So here:

output $1=B\oplus X\oplus3\oplus4\oplus5$ and output $2=B\oplus2'\oplus3'\oplus4'\oplus5'$ if we output $1\oplus$ output 2 then B is removed and X remains. That is B is blocked because of the use of this diagonal in this output. Clearly if output 2 alone is selected B is observable. Another diagonal may be used which will allow B to be observed without the need for selecting the output to observe.

For example if we define an output 3 to consist of the shaded blocks shown in FIG. 45D That is output $3=1\oplus2$ then for the above we would have output $1=B\oplus X\oplus3\oplus4\oplus5$ output $2=B\oplus2'\oplus3'\oplus4'\oplus5'$ output $3=B\oplus X$ now output $1\oplus$output $2\oplus$output $3=B\oplus X\oplus3\oplus4\oplus5\oplus B\oplus 2'\oplus3'\oplus4'\oplus5'\oplus B\oplus X$ which gathering terms we have:

output $1\oplus$output $2\oplus$output $3=B\oplus B\oplus B\oplus X\oplus X\oplus3\oplus4\oplus5\oplus2'\oplus3'\oplus5'$ where $B\oplus B\oplus B=0\oplus B=B$ $X\oplus X=0$ so we have output $1\oplus$output $2\oplus$output $3=B\oplus3\oplus4\oplus5\oplus2'\oplus3'\oplus4'\oplus5'$ so B is observable and not blocked.

Thus depending on the known positions for unknown values X it is possible to construct "diagonals" to observe cells even in the presence of unknowns and clusters of unknowns.

Figure 6:
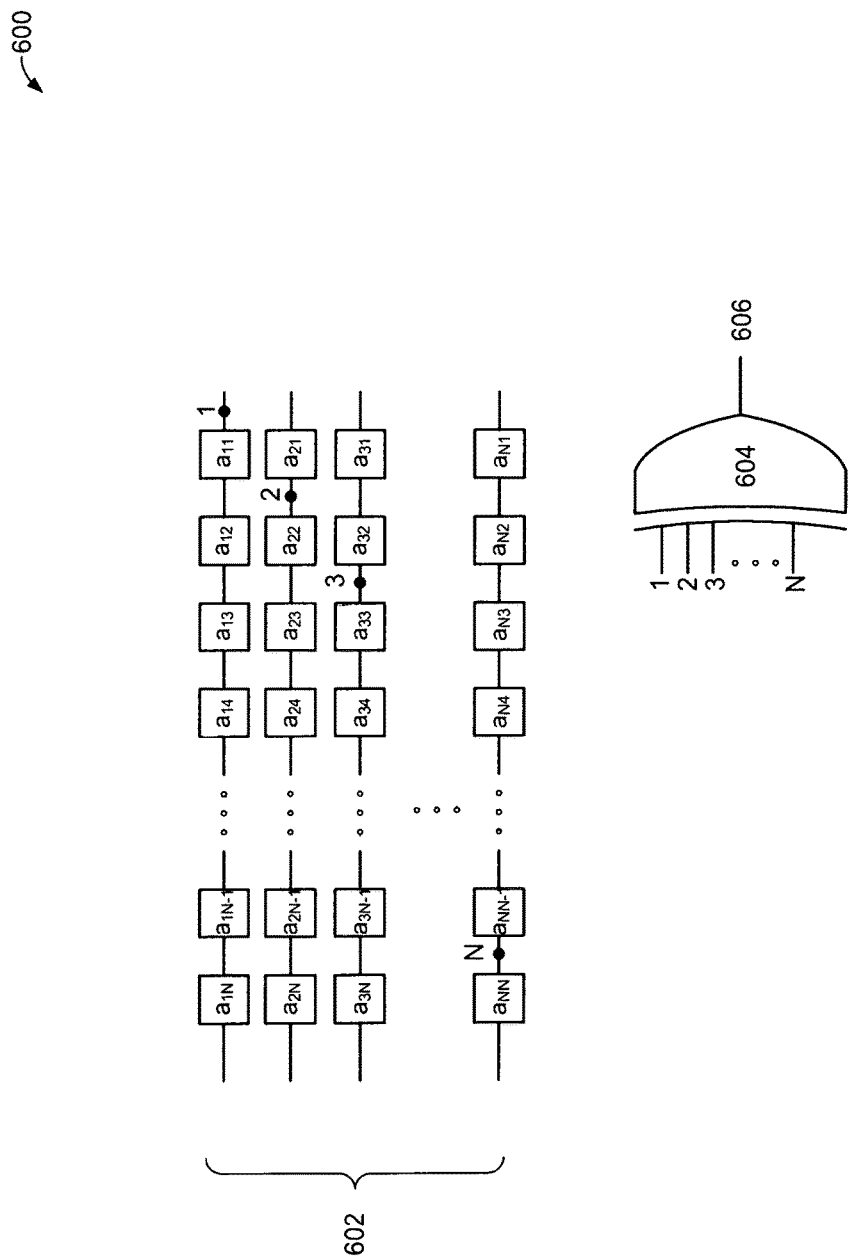
FIG. 6 illustrates one embodiment of the invention showing "straight" diagonal taps.

FIG. 6 shows, generally at 600, one embodiment of the invention where symbolically are shown diagonal taps from 1 to N on a series of scan chains 602 comprised of a first row of scan cell boxes $a_{11}$, $a_{12}$, $a_{13}$, $a_{14}$, $a_{1N-1}$, and $a_{1N}$, a second row of scan cell boxes $a_{21}$, $a_{22}$, $a_{23}$, $a_{24}$, $a_{2N-1}$, and $a_{2N}$, a third row of scan cell boxes $a_{31}$, $a_{32}$, $a_{33}$, $a_{34}$, $a_{3N-1}$, and $a_{3N}$, and an Nth row of scan cell boxes $a_{N1}$, $a_{N2}$, $a_{N3}$, $a_{N4}$, $a_{NN-1}$, and $a_{NN}$, scan cells, which are fed into an XOR 604 to get a diagonal set out 606.

As noted above a "straight" diagonal as shown in FIG. 6 is not the only "diagonal" possible and the taps may be placed as noted above in a variety of locations and even a scatter pattern. Again if the recirculating approach is used even with a scatter pattern a whole variety of combination of terms emerge.

Now because the scan cells all need to be shifted out anyway, that is all the columns must be shifted out, when we recirculate we automatically get all the combination terms we want and the only penalty is that the scan in is now separated from the scan out (e.g. separate operations) so the scan in cannot immediately be pipelined so it takes twice as long to perform the scan in. However this is offset by any shorter scan rows as indicated earlier. Additionally since we can now remove many more Xs without masking bits, etc. the improvement can be significant.

While the recirculation of all the bits from the output is shown and generally will yield the "largest" diagonal set the invention is not so limited and the recirculation may be from any chain output to any chain input and in fact may be cross-chain.

Figure 7:
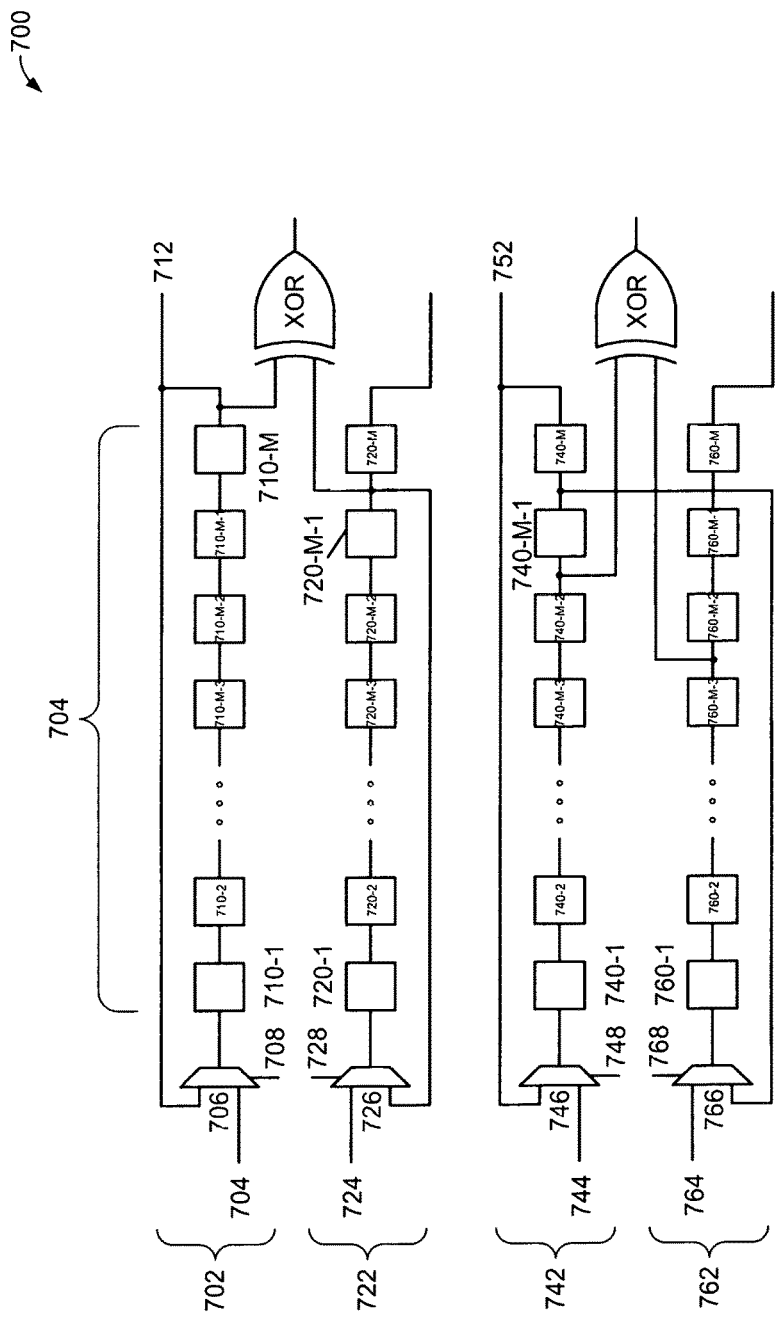
FIG. 7 illustrates various embodiments of the invention showing scan chains with various tap arrangements.

FIG. 7 shows an embodiment where the scan chains are 704 long and at chain 702 the output from the last scan cell 710-M is fed back to the first scan cell 710-1 (via 712) through multiplexer 706 controlled by 708. 708 in another mode selects chain in 704. At 722 the scan chain is 704 long however the next to last scan cell 720-M-1 output is fed back to the first scan cell 720-1 through multiplexer 726 controlled by 728. 728 in the other mode selects chain input 724. At 742 the scan chain is 704 long however as can be seen the next to last scan cell 740-M-1 output is fed back to the first scan cell 760-1. of scan chain 762 thus showing a cross-chain example. At 742 multiplexer 746 selects via control 748 scan in 744 in regular mode and in recirculate mode the output of the last chain cell via 752 as the input to chain cell 740-1. In chain 762 multiplexer 766 via control 768 selects chin input 764 in regular mode and in recirculate mode the output of 740-M-1 as the input for scan cell 760-1.

Figure 8:
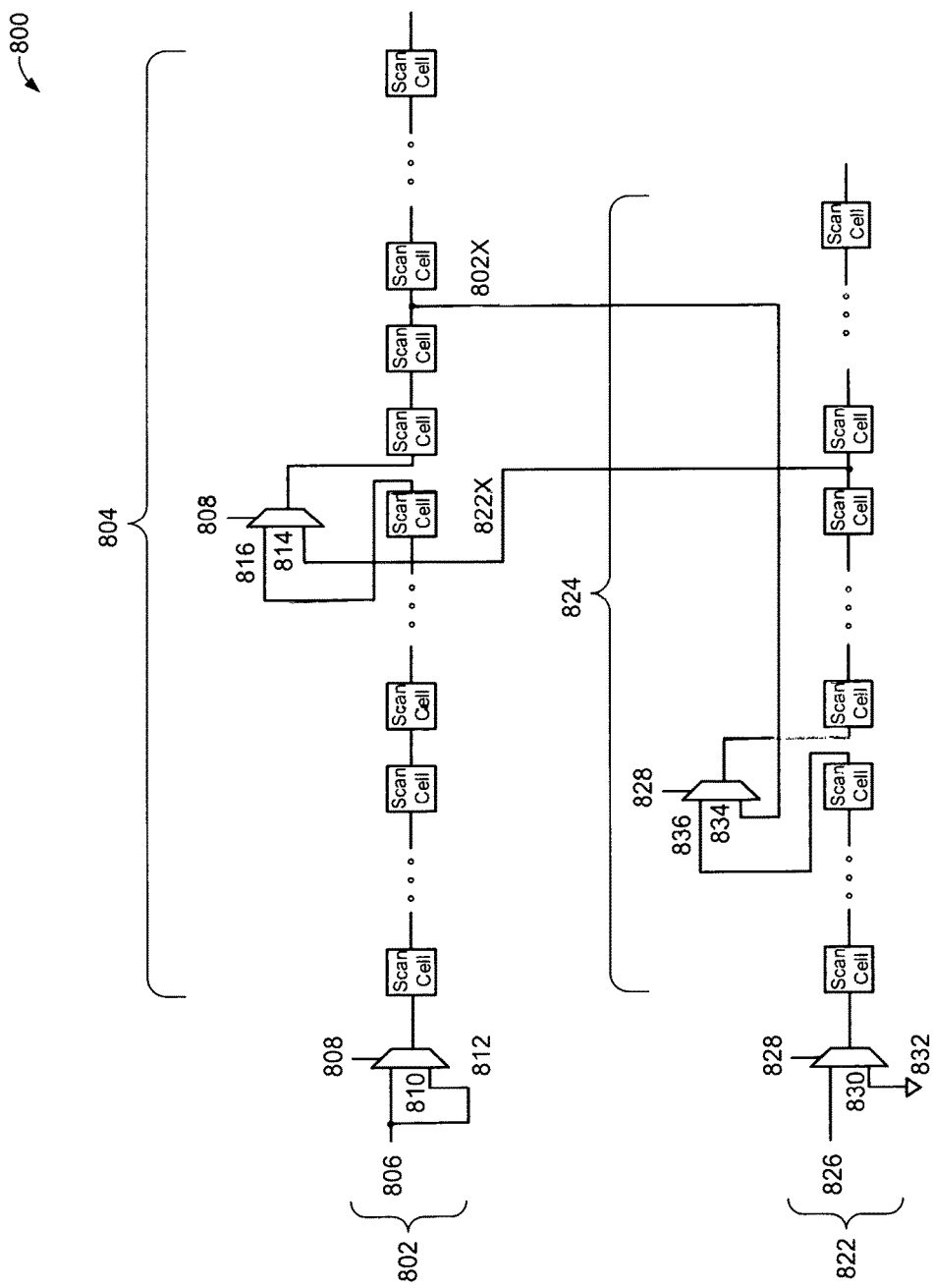
FIG. 8 shows one embodiment of the invention showing scan chains of different lengths.

FIG. 8 shows an embodiment where the scan chain 802 is 804 long. Scan chain 822 is 824 long. Note that chain length 804 and 824 need not be the same length. At 802X is tap which may be anywhere in chain 802. That is it may be any of the cells in length 804. Tap 802X goes into multiplexer 834 controlled by 828. In one mode input 836 goes to the next chain cell and in the other mode 802X goes to the next chain cell. In this way recirculation is controlled. Multiplexer 830 has scan input 826 and in this embodiment a ground 832. In one mode input 826 goes to the first chain cell and in the other mode a logic low (ground) goes to first chain cell. In this way recirculation is controlled by 828 at 830 and 834. In one mode the chain 822 first scan cell receives logic zero which does not get selected by 834, as 834 is selecting the 802X path to recirculate. In the other mode 830 and 834 allow scan in 826 and the input from 836 to pass to the next cell. Likewise an arbitrary tap along length 824 denoted as 822X is fed to any point along chain length 804 as illustrated. At multiplexer 810 both inputs 806 and 812 are from scan in 806 regardless of the state of 808. In one embodiment 810 need not be present since multiplexer 814 controls the recirculation. Multiplexer 814 in one mode controlled by 808 allows the scan chain in signal to propagate down chain 804. In the other mode multiplexer 814 allows signal 822X to enter the scan chain. What is to be appreciated is that scan chain recirculation is not limited to the beginning or end of a scan chain and that inner points of one or more scan chains may be used.

While embodiments of the invention have shown recirculation for the length of a scan chain to get a full set of "diagonal" combinations, the invention is not so limited and multiple diagonals may be obtained not only by cross connections between chains but also clocking for more than a scan length.

For example, if the $a_{3N}$ row $r_3$ output is fed back to the row $r_1$ $a_{11}$ input and the $a_{1N}$ row $r_1$ output is fed back to the row $r_3$ $a_{31}$ input the example shown in FIG. 46 would obtain differing "diagonals".

For example, if the N=5 and rows=3 then we would obtain the "diagonals" shown in FIKG. 47A.

At initial clock we have $d_1=a_{15} \oplus a_{25} \oplus a_{34}$

At the next clock we have the layout shown in FIG. 47B:

$$d_2=a_{14} \oplus a_{24} \oplus a_{33}$$

This can be repeated and eventually we reach the layout shown in FIG 47C:

Where $r_1$ and $r_3$ cell values have been switched.

And we now have the equation:

$$d_x=a_{14} \oplus a_{25} \oplus a_{35}$$

which is different than $$d_1=a_{15} \oplus a_{25} \oplus a_{34}$$

We could continue to recirculate and get differing "diagonals". The point to be appreciated is that by a combination of taps and recirculation we can obtain many different "diagonals" that assist in removing unknown X values.

For example, in the illustration shown in FIG. 47A, assume an X at $a_{15}$ as shown in FIG. 48A.

So initially we have $d_1=X \oplus a_{25} \oplus a_{34}$

Now upon clocking we have as shown in FIG. 48B:

$$d_2=a_{14} \oplus a_{24} \oplus a_{33}$$

As shown in FIG. 48C

$$d_3=a_{13} \oplus a_{23} \oplus a_{32}$$

As shown in FIG. 48D

$$d_4=a_{12} \oplus a_{22} \oplus a_{31}$$

and as shown in FIG. 48E

$$d_5=a_{11} \oplus a_{21} \oplus X$$

So now using $d_1$ and $d_3$ we have.

$$d_1 \oplus d_3 = X \oplus a_{25} \oplus a_{34} \oplus a_{11} \oplus a_{21} \oplus X$$

and we can remove the X as shown above and we have $$d_1 \oplus d_3 = a_{11} \oplus a_{21} \oplus a_{25} \oplus a_{34}$$

Which looks like XORing these terms shown in FIG. 48F:

While the techniques described above have referred to "taps" to obtain the various "diagonals" the invention is not is limited and "diagonals" may be obtained by utilizing delays or delay elements.

Figure 9:
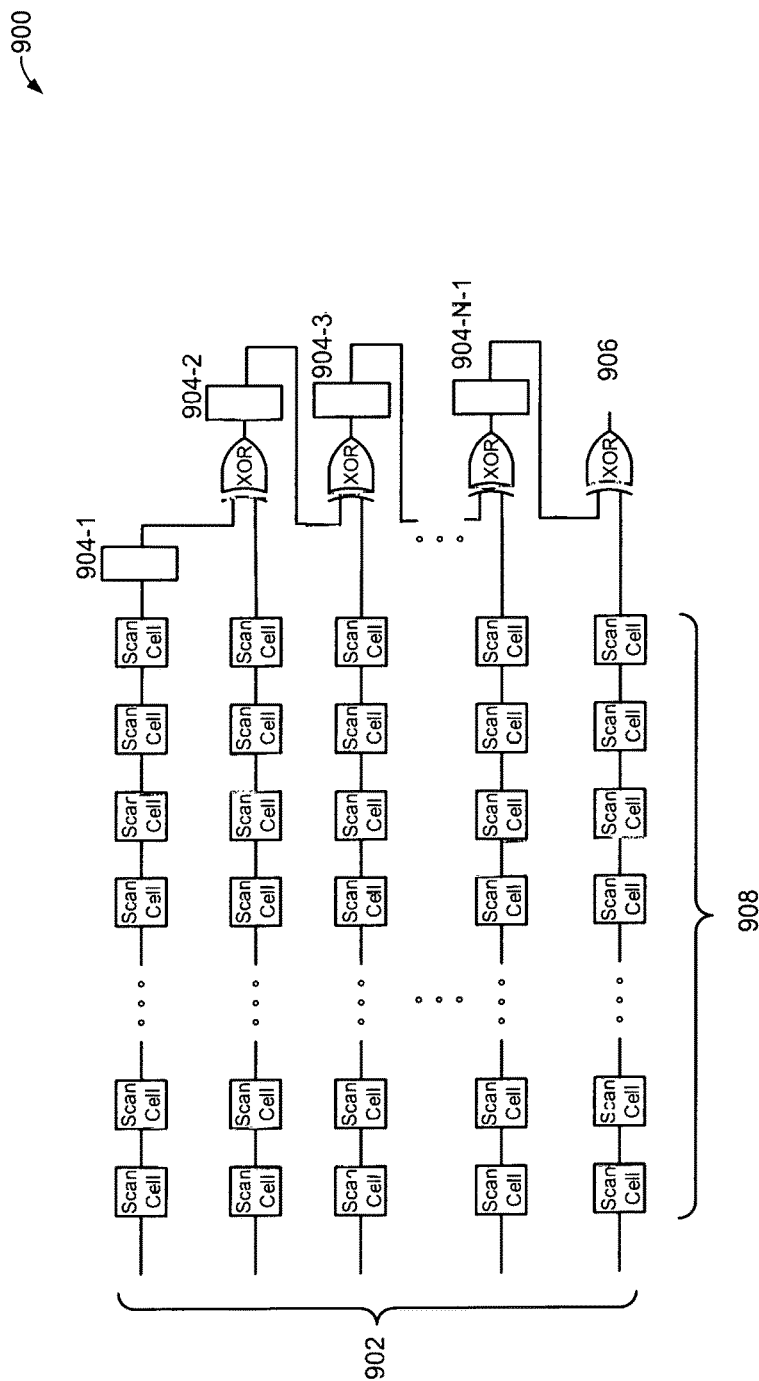
FIG. 9 illustrates one embodiment of the invention showing using delay elements to obtain a "straight" diagonal.

FIG. 9 illustrates, generally at 900, one embodiment of the invention showing using delay elements to obtain a "straight" diagonal. This is similar to the diagonal shown in FIG. 6 At 904-1 through 904-N are delay elements, for example, but not limited to, a D or T flip flop. At 902 are the scan chains of a given length 908. At 906 is the "diagonal" output.

FIG. 9 illustrates a "straight" diagonal, however the invention is not so limited and the delay elements are any memory element. Additionally, while only a single memory element are shown at 904-1 through 904-N-1 the invention is not so limited and one or more delays or memory elements may be at each 904 location. For example 1 or more delay elements may be at 904-1, one or more delay elements may be at 904-2, one or more delay elements may be at 904-2, and similarly one or more delay elements may be at any location including 904-N-1. Further the one or more at each location need not be the same for example 904-1 may consist of 5 deals elements, 904-2 of one delay element, 904-3 or 7 elements and 904-N-1 of 2 delay elements. Further the output 906 may be delayed by zero or more delay elements. Here 906 is shown with zero delay elements. When various combinations of delay elements are used the diagonal is not necessarily "straight".

In one embodiment of the invention the number of rows (for example 902 in FIG. 9) equals the number of scan cells in a chain (for example 908 in FIG. 9). That is if LSC represents the length of a scan chain and NSC represents the number of scan chains then LSC=NSC. For straight diagonals LSC=NSC is an optimal choice.

In one embodiment of the invention, after an error (D) is detected in an XOR of rows, columns, "diagonals", etc. then all values can be treated as a potential unknown (X) or variable where there other faulty combinations ($f_x$). If $f_1 \oplus f_2$=a correct value then all values are removed at the potential source of the D(=1/0) or D(0/1) where the notation D(g/b) denotes an error D and g denotes a good machine value (correct value), and b denotes a bad or faulty machine value (incorrect value). Thus by using the techniques above to remove unknown values (X) we can use the same techniques to find the potential source of an error (D) by simply treating it as we would an unknown.

While embodiments of the invention have shown both LSC=NSC and LSC≠NSC it is advantageous in some embodiments to have LSC=NSC. When LSC=NSC we refer to this a perfect square. An imperfect square can be turned into a perfect square by several methods. For example if a 3×5 structure is present it can be decimated to a 3×3 for testing purposes. That is not all cells are used. Additionally, it may be possible to configure a 3×5 into a 4×4 structure with one of the cells being denoted as a fixed value since a 3×5 has 15 entries and a 4×4 has 16 entries. It is also possible to square up a structure. For example a 3×5 structure can be squared up to a 5×5 with dummy values placed in the 2×5 that are not directly mapped.

Figure 10:
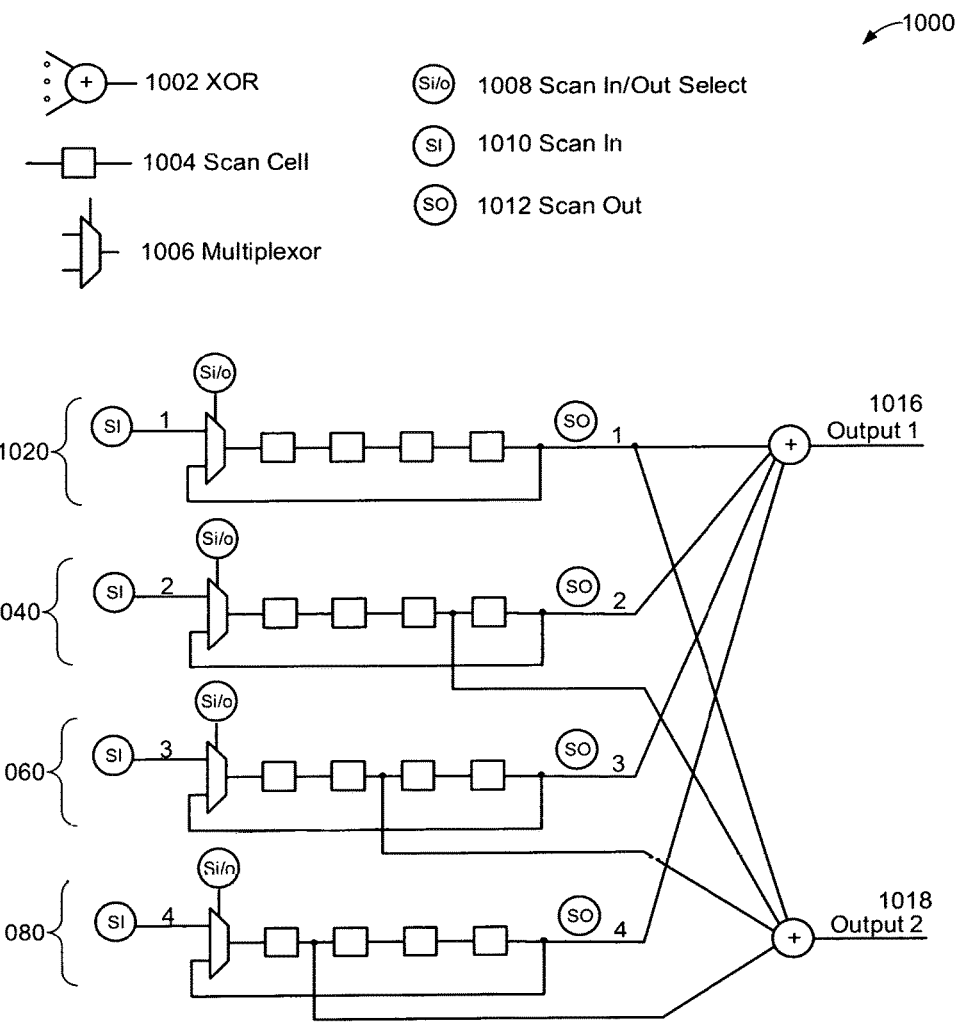
FIG. 10 illustrates various embodiments of the invention showing a generalized approach of using inner scan chain sampling at tap points and scan chain cycling to the multiplexer.

FIG. 10 illustrates, generally at 1000, a block diagram showing an example of the generalized approach of using inner scan chain sampling at tap points and scan chain cycling to the multiplexer. Symbol 1002 denotes an XOR function, symbol 1004 denotes a scan cell, symbol 1006 denotes a multiplexer, symbol 1008 denotes a scan in/out selection, symbol 1010 denotes a scan in, and symbol 1012 denotes a scan chain out. Shown here for simplicity is a small number of scan cells (only 4) and a small number of scan chains (only 4) and only two outputs. The invention is not so limited and any number of scan cells and scan chains are possible. Numbers 1, 2, 3, and 4 refer to the respective chains and inputs SI and outputs SO for 1020, 1040, 1060, and 1080 respectively.

At 1020, 1040, 1060, and 1080 are four scan chains denoted 1, 2, 3, and 4 respectively for the scan chain in SI 1, 2, 3, and 4 as well as scan out SO 1, 2, 3, and 4. Additionally each scan chain 1020, 1040, 1060, and 1080 has associated with it a multiplexer and scan in/out selection Si/o. Output 1 1016 represents a column output since the inputs to the XOR come from the last scan cell in each chain. Output 2 1018 represents a diagonal output since the inputs to the XOR come from differing taps on each scan chain. For chain 1020 it comes from the last scan cell. For 1040, 1060, and 1080 the tap is from an inner chain node and so it represents an inner scan chain sampling.

What is to be appreciated is that by using inner scan chain samples (and possibly a scan output) a new output can be created that is useful for removing unknown values (Xs).

While the techniques disclosed have used a "diagonal" in combination with a row and/or column outputs, the invention is not so limited and rather than a column output which consists of all rows, it is possible to have a row output consisting of all columns.

For example FIG. 10 at Output 1 1016 represents a column output of all rows 1020, 1040, 1060, and 1080 at one point in time, while Output 2 represents a diagonal output of all rows 1020, 1040, 1060, and 1080 at one point in time.

Figure 12:
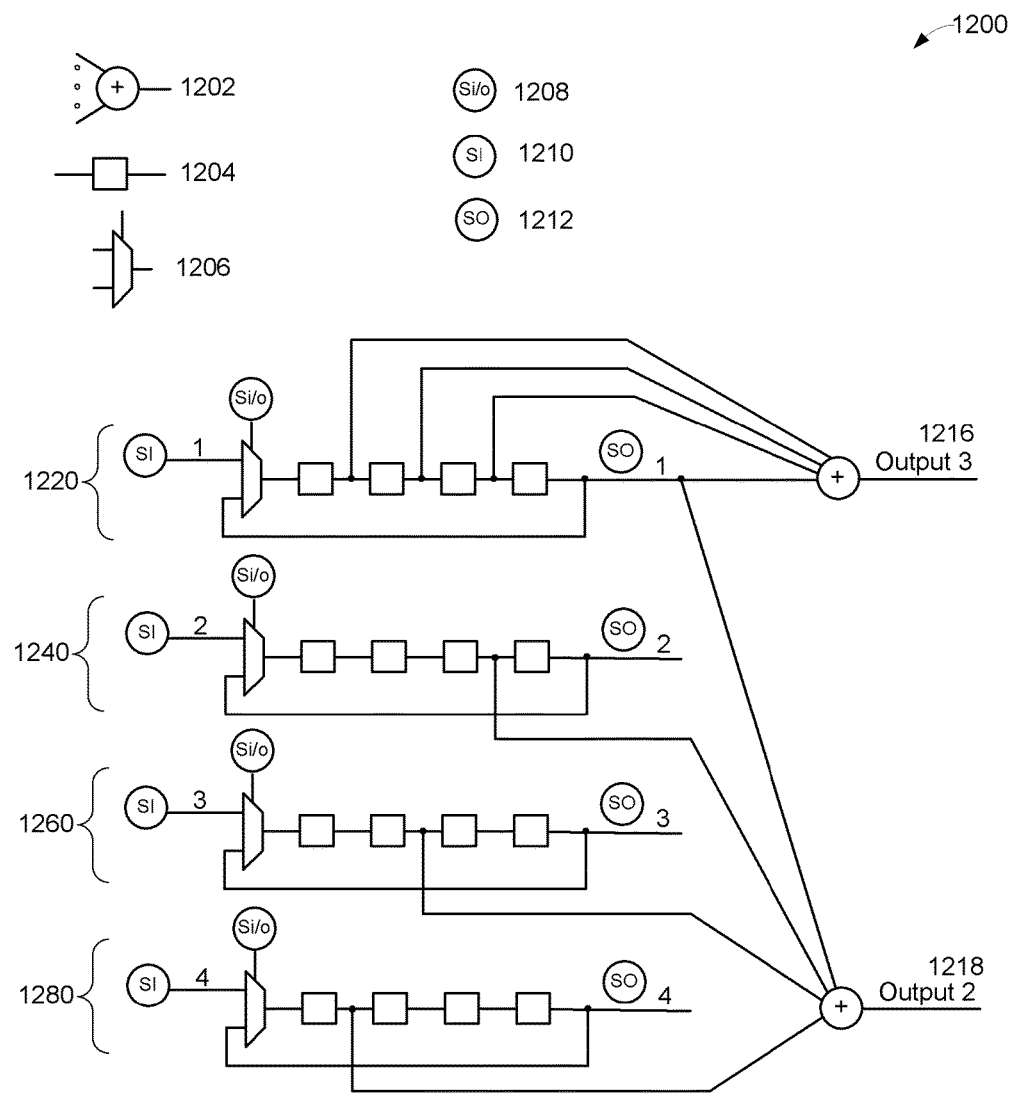
FIG. 12 illustrates an embodiment of the invention showing a row output consisting of all columns at a point in time and a diagonal output.

FIG. 12 illustrates, generally at 1200, one embodiment of the present invention showing a row Output 3 1216 consisting of a row output consisting of all columns at a point in time. Output 2 1218 is a diagonal output.

FIG. 12 illustrates, generally at 1200, a block diagram showing an example of the generalized approach of using inner scan chain sampling at tap points and scan chain cycling to the multiplexer. Symbol 1202 denotes an XOR function, symbol 1204 denotes a scan cell, symbol 1206 denotes a multiplexer, symbol 1208 denotes a scan in/out selection, symbol 1210 denotes a scan in, and symbol 1212 denotes a scan out. Shown here for simplicity is a small number of scan cells (only 4) and a small number of scan chains (only 4) and only two outputs. The invention is not so limited and any number of scan cells and scan chains are possible. Numbers 1, 2, 3, and 4 refer to the respective chains and inputs SI and outputs SO for 1220, 1240, 1260, and 1280 respectively.

At 1220, 1240, 1260, and 1280 are four scan chains denoted 1, 2, 3, and 4 respectively for the scan chain in SI 1, 2, 3, and 4 as well as scan out SO 1, 2, 3, and 4. Additionally each scan chain 1220, 1240, 1260, and 1280 has associated with it a multiplexer and scan in/out selection Si/o. Output 3 1216 represents a row output since the inputs to the XOR come from each scan cell in chain 1220. Output 2 1218 represents a diagonal output since the inputs to the XOR come from differing taps on each scan chain. For chain 1220 it comes from the last scan cell. For 1240, 1260, and 1280 the tap is from an inner chain node and so it represents an inner scan chain sampling.

What is to be appreciated is that by using inner scan chain samples (and possibly a scan output) a new output can be created that is useful for removing unknown values (Xs).

Embodiments of the present invention can be combined to yield further embodiments. For example, FIG. 10 and FIG. 12 may be combined to yield at Output 1 a column output, at Output 2 a diagonal, and at Output 3 a row.

The embodiment shown in FIG. 12 at Output 3 1216 shows a single row output however the invention is not so limited and any number of row outputs may be implemented. Nor is the row implementation restricted to inner scan chain tap points. If O is the output, i is the row and j the scan cell length for scan cells c then:

$$O_i = c_{i1} \oplus c_{i2} \oplus \ldots \oplus c_{ij}$$

As long as this output function is produced we have a row output.

In one embodiment of the invention a row output is produced without the need for internal scan chain taps.

Figure 13:
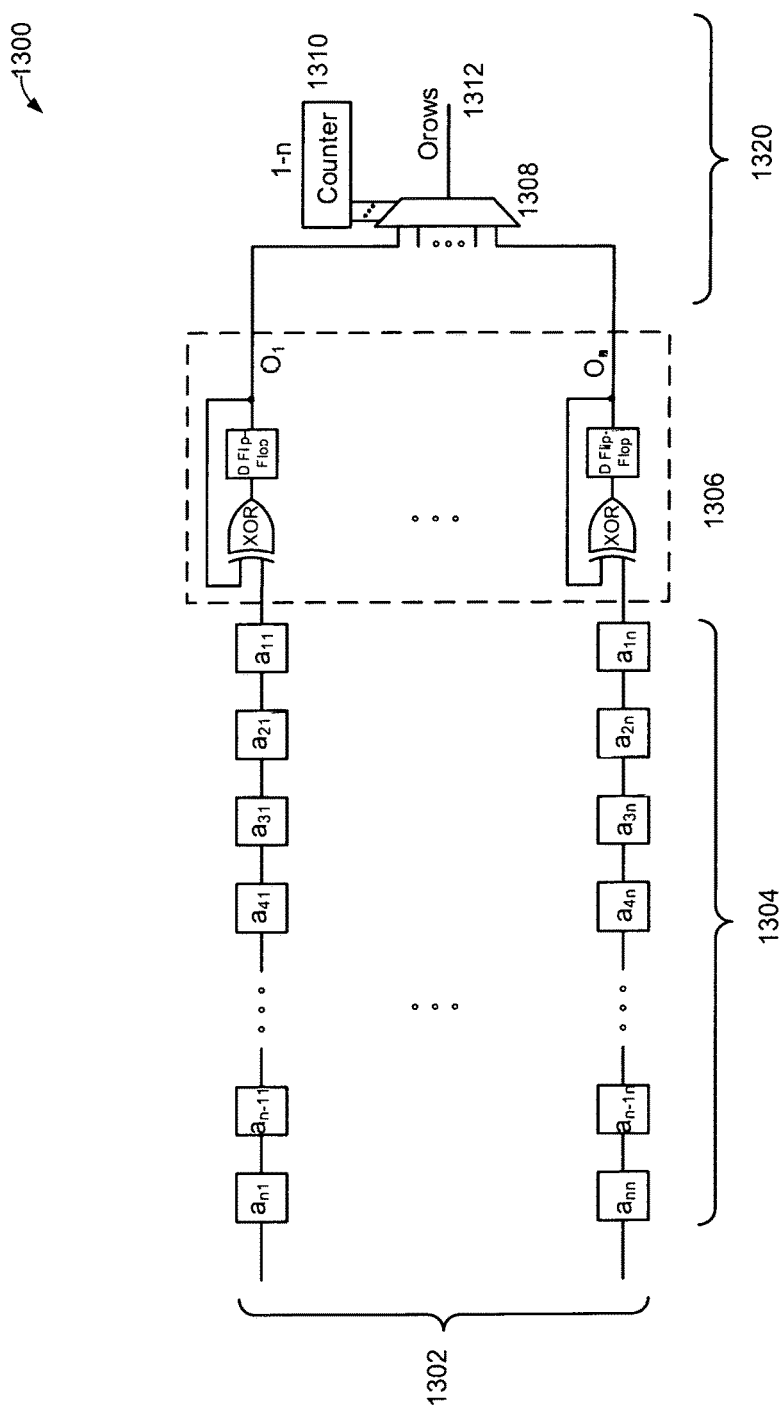
FIG. 13 illustrates an embodiment of the invention showing row outputs being generated without internal scan chain taps.

FIG. 13 illustrates, generally at 1300, one embodiment of the invention showing row outputs being generated without internal scan chain taps. At 1302 are n rows and at 1302 n columns (a square array) running from $a_{11}$ to $a_{n1}$ and $a_{1n}$ to $a_{nn}$. 1306 (dashed box) is one embodiment of logic XOR and a storage element to produce row outputs $O_1$ to $O_n$. 1320 is one possible embodiment to implement O rows output 1312 using a multiplexer and a 1-n (1 to n) counter. In one embodiment of the invention 1320 is not a part of the compactor. Nor is 1320 the only way to implement this function. Ultimately what is produced on the O rows output 1312 for a row i and a scan chain of length j is:

$$O_i = a_{i1} \oplus a_{i2} \oplus \ldots \oplus a_{ij}$$

Which in this embodiment shifts out during a shift in.

Figure 14:
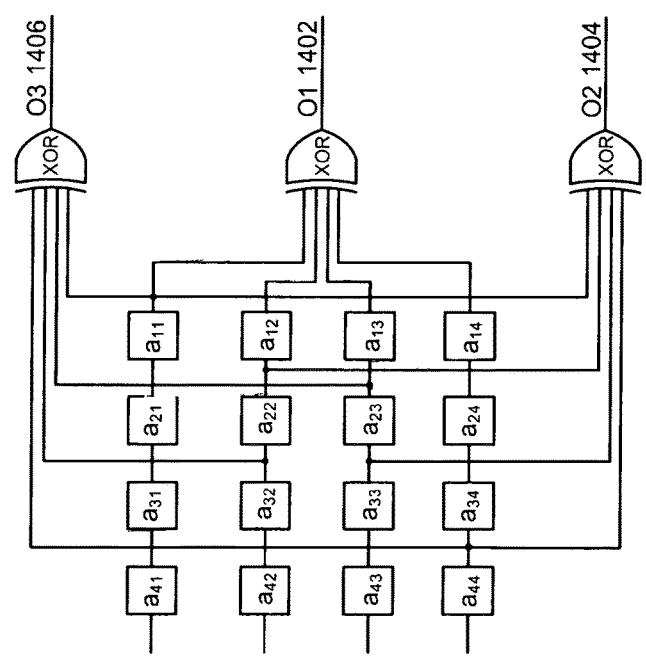
FIG. 14 illustrates an embodiment of the invention showing various taps and outputs.

FIG. 14 illustrates, generally at 1400, one embodiment of the invention. Shown for illustration purposes is a small 4×4 array, comprised of a first row of scan cell boxes $a_{11}$, $a_{21}$, $a_{31}$, and $a_{41}$, a second row $a_{12}$, $a_{22}$, $a_{32}$, and $a_{42}$, a third row $a_{13}$, $a_{23}$, $a_{33}$, and $a_{43}$, and a fourth row $a_{14}$, $a_{24}$, $a_{34}$, and $a_{44}$, however the invention is not so limited and the number of scan cells and scan chains can be of any size, nor need they be square. In this embodiment 3 different outputs are produced O1 1402, O2 1404, and O3 1406 using the various taps as indicated. As illustrated in this embodiment output 1 O1 1402 is a column output, output 2 O2 1404 is a "straight" diagonal output, and output 3 O3 1406 is a diagonal but not a straight one. In this embodiment output 3 O3 1406 uses a tap from each of the four scan chains, however, the invention is not so limited and no tap is needed from each scan chain and/or more than one tap may be used from a scan chain.

Figure 15:
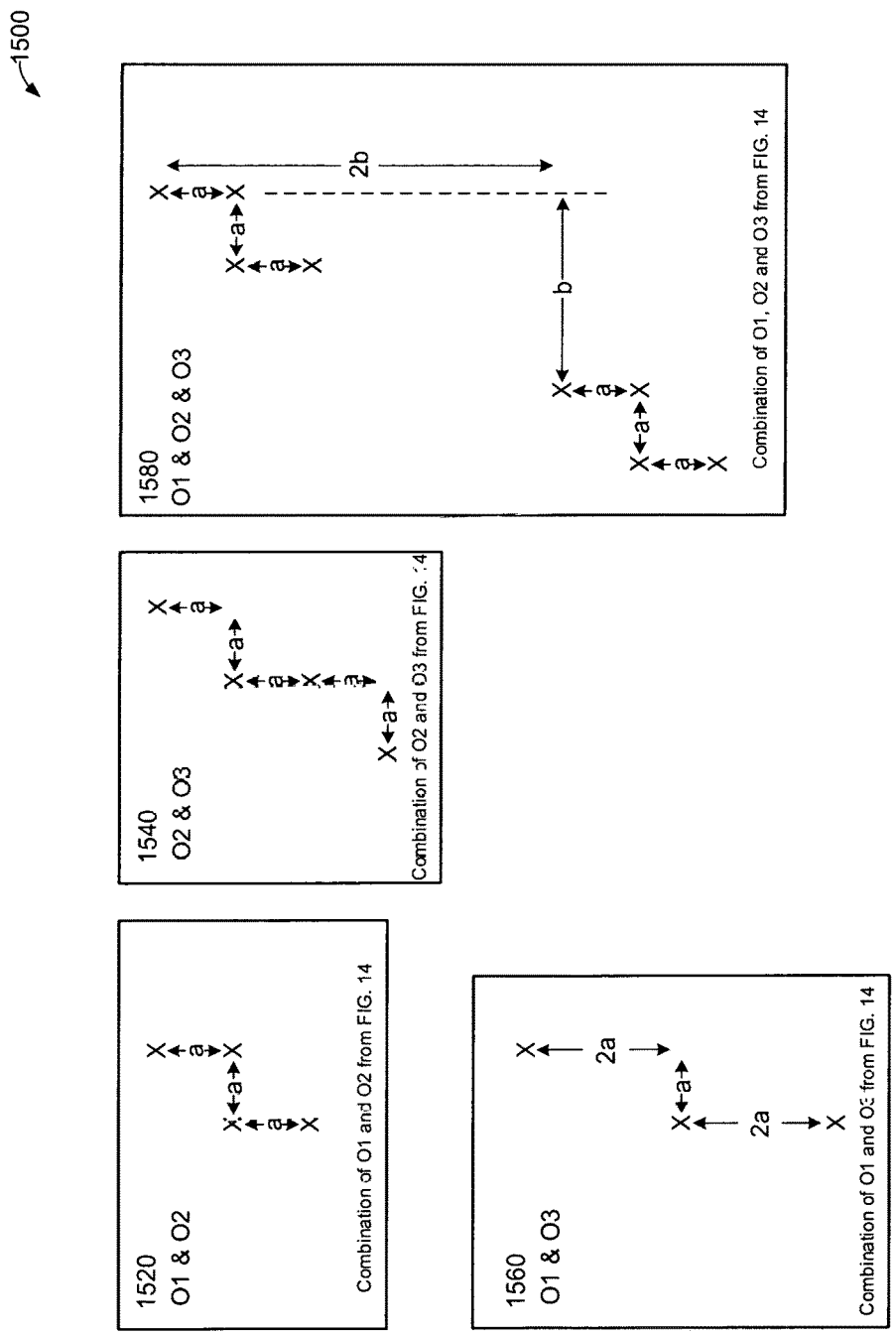
FIG. 15 illustrates an embodiment of the invention showing X patterns for the various outputs in FIG. 14.

FIG. 15 illustrates, generally at 1500, one embodiment of the invention showing X patterns for the various outputs in FIG. 14. That is for FIG. 14 O1 1402, O2 1404, and O3 1406 are shown the various patterns of unknowns (Xs) that can be removed by the combination of the shown outputs. At 1502 is the combination of FIG. 14 O1 1402 and O2 1404. The distance "a" can of any size, that is the X's are on a straight diagonal. Additionally this pattern of X may be anywhere within the scan cells array. At 1240 is the combination of FIG. 14 O2 1404 and O3 1406. Here as may be seen the repeating pattern as one move in the x direction of "a" and two moves in the y direction of "a". Move is just indicative of the X's in an actual scan cell. At 1260 is the combination of FIG. 14 O1 1402 and O3 1406. As can be seen here for each step (move) in the x direction, two are made in the y direction. Note x direction and y direction refer to x,y coordinates and not to unknowns (capital X). At 1280 is the combination of FIG. 14 O1 1402 and O2 1404 and O3 1406. Here distance "b" can be any size including equal to "a".

In one embodiment of the invention a technique for finding the X patterns is that for any output that has 2 Xs search if all other outputs that cross those Xs have a second X in them. If not then the Xs can be removed. If all solutions (e.g. combinations that remove the Xs in the search) have a non-empty intersection then the intersection is a blind spot. For a "diagonal" that contains a D and Xs find all other diagonals that remove 1 or more Xs. Then XOR one with the original diagonal. See if Xs remain and keep going until there are no more Xs left. This defines a need for a search algorithm. The search space is a tree and trees can be traversed, for example, with a breadth first search (BFS) or a depth first search (DFS).

Figure 16:
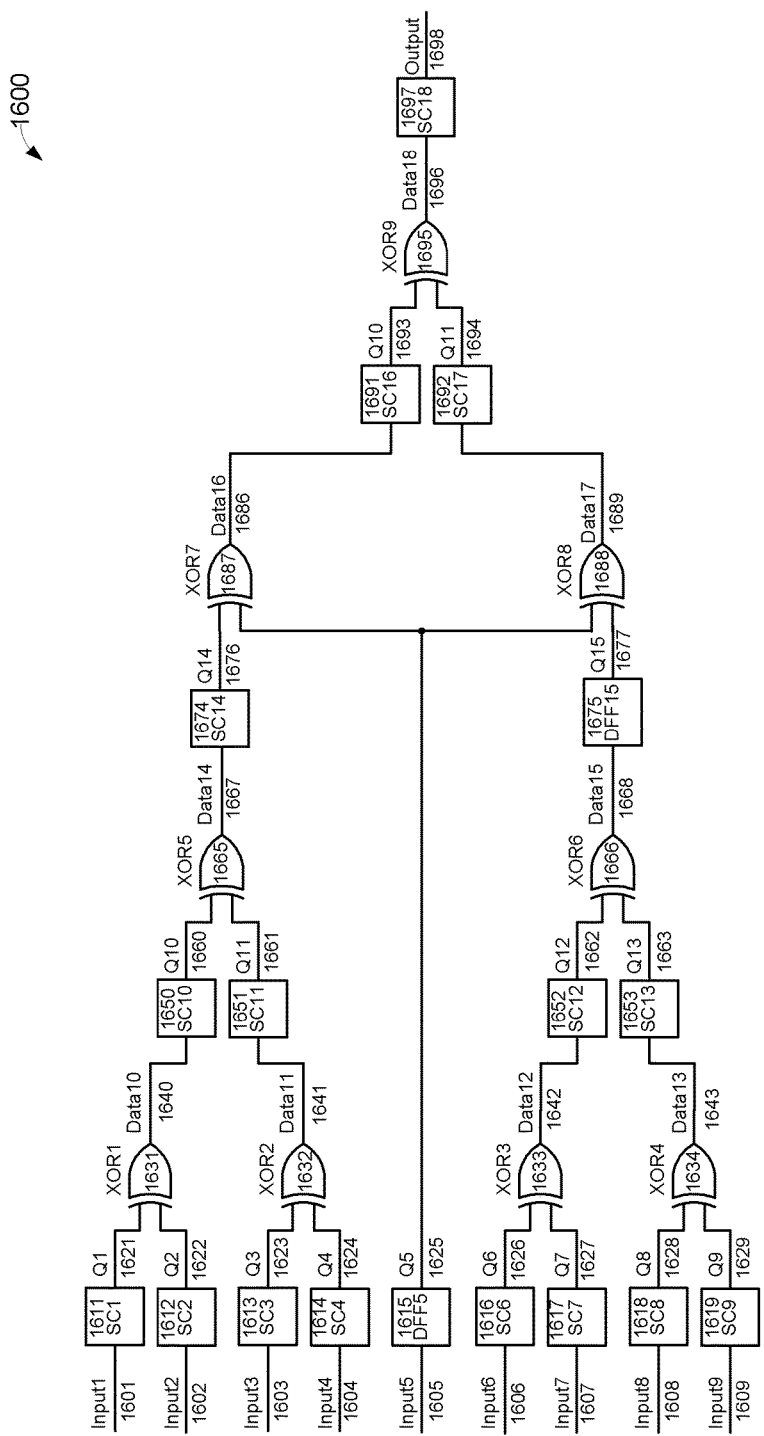
FIG. 16 shows a design in functional mode which will be used to illustrate the techniques discussed.
Figure 18:
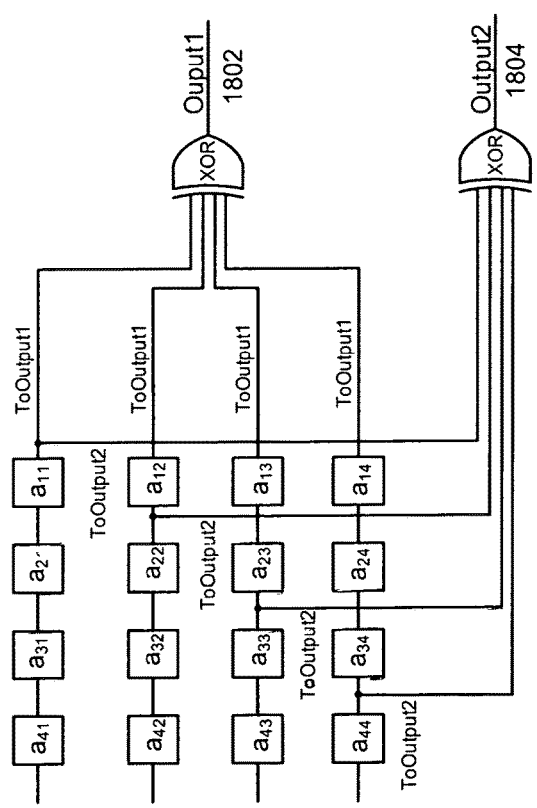
FIG. 18 illustrates one embodiment of the invention showing how the FIG. 16 scan chains and FIG. 17 scan chains are wired to create Outputs.

FIG. 16 illustrates, generally at 1600, one embodiment of the invention showing a design in functional mode which will be used to illustrate the techniques discussed. A register is denoted $r_{ij}$ whether it has an associated scan cell or not (e.g. flip flop or latch). In the schematic of FIG. 18 registers having a scan cell are denoted scan cell (SCx) and those not having a scan cell are denoted as a D type flip flop (DFFx). All scan cells and DFF are also noted as being with an associated logic function to which the scan cell or DFF is associated. That is, it is functional mode to which we are observing the scan cells in this example circuit. At 1601 through 1609 are Input1 through Input9 respectively. At 1611 through 1614 are scan cells SC1 through SC4 respectively. At 1615 is a D type flip flop. At 1616 through 1619 are scan cells SC6 through SC9 respectively. At 1621 through 1624 are scan cells SC1 through SC4 outputs Q1 through Q4 respectively. At 1625 is D type flip flop output Q5. At 1626 through 1629 are scan cells SC6 through SC9 outputs Q6 through Q9 respectively. At 1631 through 1634 are XOR1 through XOR4 respectively. At 1640 through 1643 are XOR1 through XOR4 outputs Data10 through Data13 respectively. At 1650 through 1653 are scan cells SC10 through SC13. respectively. At 1660 through 1663 are SC10 through SC13 outputs Q10 through Q13 respectively. At 1665 and 1666 are XOR5 and XOR6 respectively. At 1667 and 1668 are XOR5 and XOR6 outputs respectively. At 1674 and 1675 are scan cells SC14 and SC15 respectively. At 1676 and 1677 are scan cells SC14 and SC15 outputs respectively. At 1687 and 1688 are XOR7 and XOR8 respectively. At 1686 and 1689 are XOR7 and XOR8 outputs respectively. At 1691 and 1692 are scan cells SC16 and SC17 respectively. At 1693 and 1694 are scan cells SC16 and SC17 outputs respectively. At 1695 is XOR9 with output Data 18 at 1696. At 1697 is scan cell SC10 with Output 1698.

Figure 17:
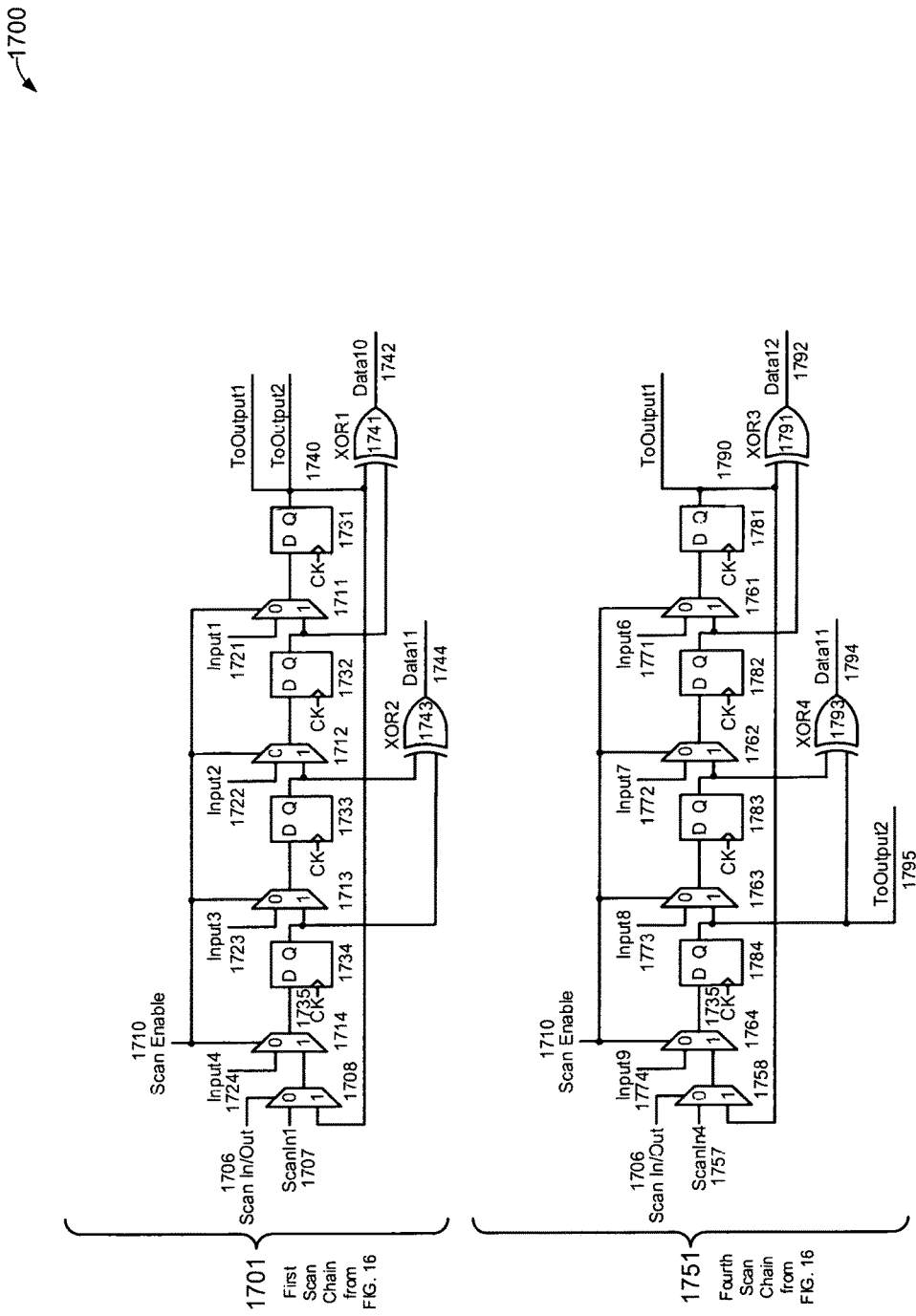
FIG. 17 illustrates one embodiment of the invention showing how FIG. 16 scan chain 1 and scan chain 4 are modified according to embodiments of the present invention.

FIG. 17 illustrates, generally at 1700, one embodiment of the invention showing how FIG. 16 scan chain 1 1701 and scan chain 4 1751 are modified according to embodiments of the present invention as further explained below. Scan chains 2 and 3 are not shown to avoid repetition.

At 1701 ToOutput1 1740 and ToOutput2 1740 are wired to the inputs of XORs that create Output1 and Output2. 1708, and 1711-1714 are multiplexers. Multiplexer 1708 has a Scan In/Out select control 1706 which in a "0" state selects ScanIn1 1707 and when in a "1" state selects 1740 which is also labeled ToOutput1 and ToOutput2.. Multiplexers 1711-1714 have Input1-Input4 1721-1724 respectively on the "0" input. Multiplexers 1711-1714 have the Q output from D flip flops (representing the scan cell outputs) 1731-1734 respectively on the "1" input. The D flip flops 1731-1734 have their input D connected to the multiplexer 1711-1714 outputs respectively. The D flip flops (DFF) 1731-1734 have their clock input tied to a common clock CK 1735. Multiplexers 1711-1714 select control is tied to Scan Enable 1710. When Scan Enable 1710 is in the "0" state it selects Input1-Input4 1721-1724 respectively. XOR gates 1741 XOR1 and 1743 XOR2 produce Data10 1742 and Data11 1744 respectively. The inputs to XOR1 are from the Q outputs of DFFs 1731 and 1732. The inputs to XOR2 are from the Q outputs of DFFs 1733 and 1734.

At 1751 ToOutput1 1790 and ToOutput2 1795 are wired to the inputs of XORs that create Output1 and Output2. 1758, and 1761-1764 are multiplexers. Multiplexer 1758 has a Scan In/Out select control 1706 which in a "0" state selects ScanIn4 1757 and when in a "1" state selects 1790 which is also labeled ToOutput1. Multiplexers 1761-1764 have Input6-Input9 1771-1774 respectively on the "0" input. Multiplexers 1761-1764 have the Q output from D flip flops (representing the scan cell outputs) 1781-1784 respectively on the "1" input. The D flip flops 1781-1784 have their input D connected to the multiplexer 1761-1764 outputs respectively. The D flip flops (DFF) 1781-1784 have their clock input tied to a common clock CK 1735. Multiplexers 1761-1764 select control is tied to Scan Enable 1710. When Scan Enable 1710 is in the "0" state it selects Input6-Input9 1771-1774 respectively. XOR gates 1791 XOR3 and 1793 XOR4 produce Data12 1792 and Data13 1794 respectively. The inputs to XOR1 are from the Q outputs of DFFs 1731 and 1732. The inputs to XOR2 are from the Q outputs of DFFs 1733 and 1734.

FIG. 18 illustrates, generally at 1800, one embodiment of the invention showing how the FIG. 16 scan chains 1, 2, 3, and 4, and FIG. 17 scan chain 1 and scan chain 4 (chain 2 and 3 as noted are not shown in FIG. 17) are wired to create Output1 1802 and Output2 1804 from the rows of scan cells $a_{11}$, $a_{21}$, $a_{31}$, and $a_{41}$, $a_{12}$, $a_{22}$, $a_{32}$, and $a_{42}$, $a_{13}$, $a_{23}$, $a_{33}$, $a_{43}$, and $a_{14}$, $a_{24}$, $a_{34}$, $a_{44}$, with the scan chain stitching illustrated below.

Recall a register is denoted $r_{ij}$ whether it has an associated scan cell or not (e.g. flip flop or latch). At FIG. 19 are shown, generally at 1900, embodiments of the invention. 1910 illustrates the scan chain stitching. 1920 shows the scan Output wiring (Output1 1902 and Output2 1904). 1930 illustrates the resulting matrix. Note in 1930 that since registers 5 and 15 (FIG. 16 at 1615 (DFF5) and 1675 (DFF15) respectively) are not scan cells so they are not in the scan chains. 1940 shows a resulting X map ($r_1$-$r_4$, $r_6$-$r_{14}$, and $r_{16}$=X, $r_{17}$=X, and $r_{18}$=X) where $r_{16}$, $r_{17}$, and $r_{18}$ (FIG. 16 at SC16 (1691), SC17 (1692), and SC18 (1687) respectively) capture X under a sequential depth of 1 (i.e. first clock) because of the presence of $r_5$ and $r_{15}$ (registers 5 and 15 (FIG. 16 at 1615 (DFF5) and 1675 (DFF15) respectively)) in their input. This input is sometimes referred to as an input cone. That is the uncertain state of $r_5$ and $r_{15}$ in the input cones of SC16, SC17 make those outputs unknown and accordingly SC18 will be unknown.

Figure 20:
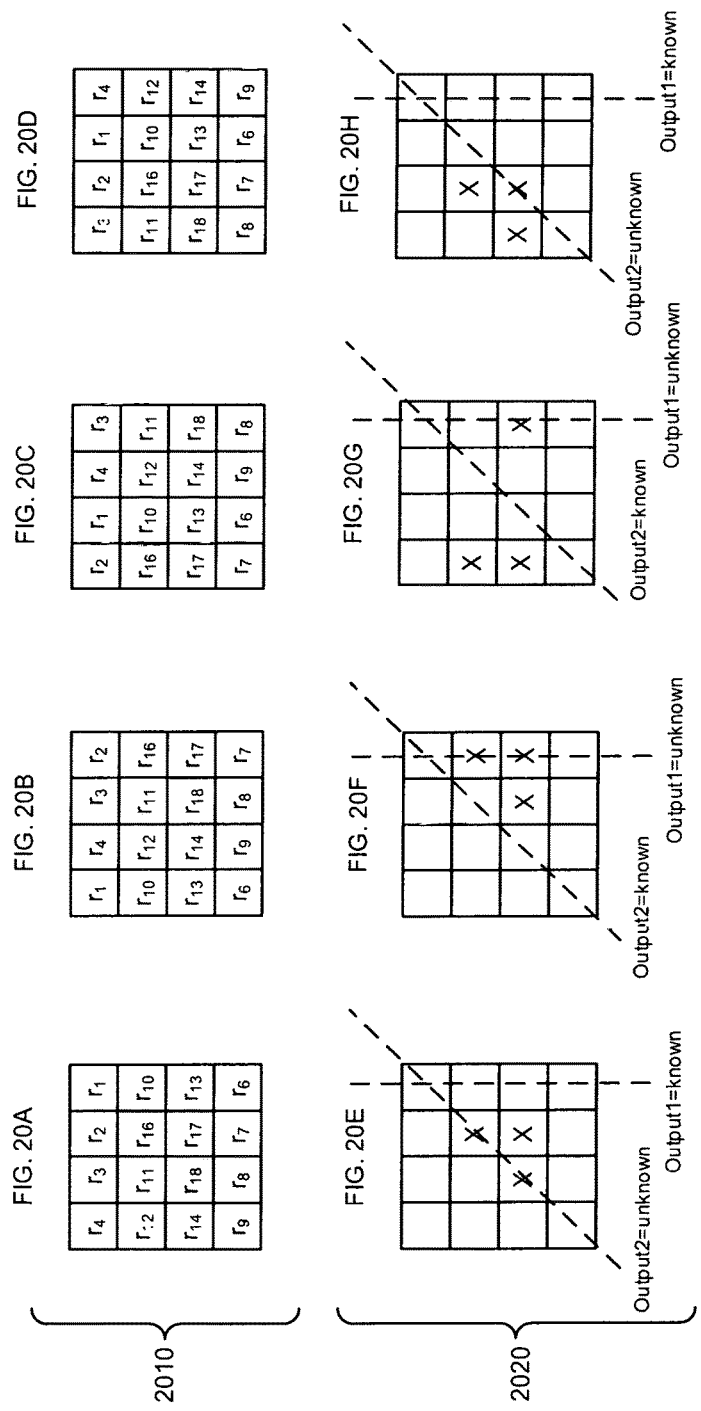
FIG. 20 illustrates one embodiment of the invention showing stitching and outputs.

Given this X map at 1940 $r_8$ becomes blocked or unobservable. FIG. 20 illustrates, generally at 2000, one embodiment of the invention to illustrate using the stitching and outputs of FIG. 19 how $r_8$ becomes blocked or unobservable. Shown at 2010 are the register maps at times Time=1, 2, 3, and 4 at 2031-2034 respectively. In this particular embodiment to assist in understanding we have indicated at 2020 by dashed lines the registers contributing to Output1 and Output2 which in this case are column (Output1) and "straight" diagonal (Output2). At 2010 shaded register entries represent the X unknowns as shown at 2020 for each of the Time=1, 2, 3, and 4. Denoting the Output at a given clock time as $O_z(t)$ where z denotes the output and t the time then we observe (e.g. the clock cycle of observation).

$$O_1(1) = r_1 \oplus r_{10} \oplus r_{13} \oplus r_6$$

and $$O_2(4) = r_4 \oplus r_{10} \oplus r_{17} \oplus r_8$$

Now for the term:

$$O_1(3) \oplus O_2(1) \oplus O_1(2) \oplus O_2(4)$$

does not have $r_8$ as one of its terms so it is not observable. From FIG. 20:

$$O_1(3) = r_3 \oplus r_{11} \oplus r_{18} \oplus r_8$$

where we will later note that $r_{18}$=X $$O_2(1) = r_1 \oplus r_{16} \oplus r_{18} \oplus r_9$$

where we will later note that $r_{16}$=X and $r_{18}$=X $$O_1(2) = r_2 \oplus r_{16} \oplus r_{17} \oplus r_7$$

where we will later note that $r_{16}$=X and $r_{17}$=X $$O_2(4) = r_4 \oplus r_{10} r_{17} \oplus r_8$$

where we will later note that $r_{17}$=X

Now $$O_1(3) \oplus O_2(1) \oplus O_1(2) \oplus O_2(4) = r_3 \oplus r_{11} \oplus r_{18} \oplus r_8 \oplus r_1 \oplus r_{16} \oplus r_{18} \oplus r_9 \oplus r_2 \oplus r_{16} \oplus r_{17} \oplus r_7 \oplus r_4 \oplus r_{10} \oplus r_{17} \oplus r_8$$

Underlining the double r terms 16, 17, 18, and 8 we have $$O_1(3) \oplus O_2(1) \oplus O_1(2) \oplus O_2(4) = r_3 \oplus r_{11} \oplus \underline{r_{18}} \oplus \underline{r_{18}} \oplus r_1 \neq \underline{r_{16}} \oplus \underline{r_{18}} \oplus r_9 \oplus r_2 \oplus \underline{r_{16}} \oplus \underline{r_{17}} \oplus r_7 \oplus r_4 \oplus r_{10} \oplus \underline{r_{17}} \oplus r r_8$$

Rearranging we have $$O_1(3) \oplus O_2(1) \oplus O_1(2) \oplus O_2(4) = r_3 \oplus r_{11} \oplus r_9 \oplus r_2 \oplus r_7 \oplus r_4 \oplus r_{10} \oplus \underline{r_{16}} \oplus \underline{r_{16}} \oplus \underline{r_{17}} \oplus \underline{r_{18}} \oplus \underline{r_{18}} \oplus r_8 \oplus r_8$$

And from above A⊕A=0 and therefore the terms appearing twice are cancelled out and therefore do not appear as XORing a same term removes that term.

So the X terms $r_{16}$, $r_{17}$, and $r_{18}$ are cancelled out—which is good, but so is $r_8$ so $r_8$ is unobservable in this particular case.

$$O_1(3) \oplus O_2(1) \oplus O_1(2) \oplus O_2(4) = r_3 \oplus r_{11} \oplus r_9 \oplus r_2 \oplus r_7 \oplus r_4 \oplus r_{10}$$

Note that all other scan cells can be observed in either one of the two Outputs directly or both or by XORing the Xs out of the result (this case not shown here).

Note that when the Output can observe directly the fault effect the other may still be used to diagnose the exact location of the fault (error) effect by XORing out the Xs in it and then removing the error from the result. The XOR summation that does not contain the error locates the error in its intersection.

Now the present invention is not limited to the embodiment discussed above where $r_8$ was not observable. Indeed by altering the outputs and leaving the current scan chain stitching intact we can obtain a different result.

Figure 21:
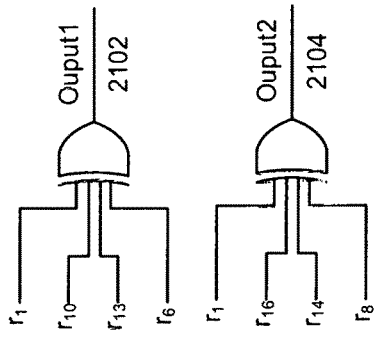

FIG. 21 shows, generally at 2100, embodiments of the invention. 2110 illustrates and has the same scan chain stitching as FIG. 19 at 1910 and the same resulting map at FIG. 19 at 1930. Likewise, 2120 has the same X map as FIG. 19 at 1940. 2130 has the same Output1 2102 as FIG. 19 at 1902. However in FIG. 21 Output2 2104 has several different inputs to the XOR producing Output2. Here at FIG. 21 at 2130 the inputs to the XOR producing the Output2 2104 are $r_1$, $r_{16}$, $r_{14}$, and $r_8$. Thus we see that while $r_1$ and $r_{16}$ are the same as in FIG. 19 Output2 1904, we now have in FIG. 21 at 2130 the terms $r_{14}$ and $r_8$ rather than in FIG. 19 at 1920 where we had terms $r_{18}$ and $r_9$.

Figure 22:
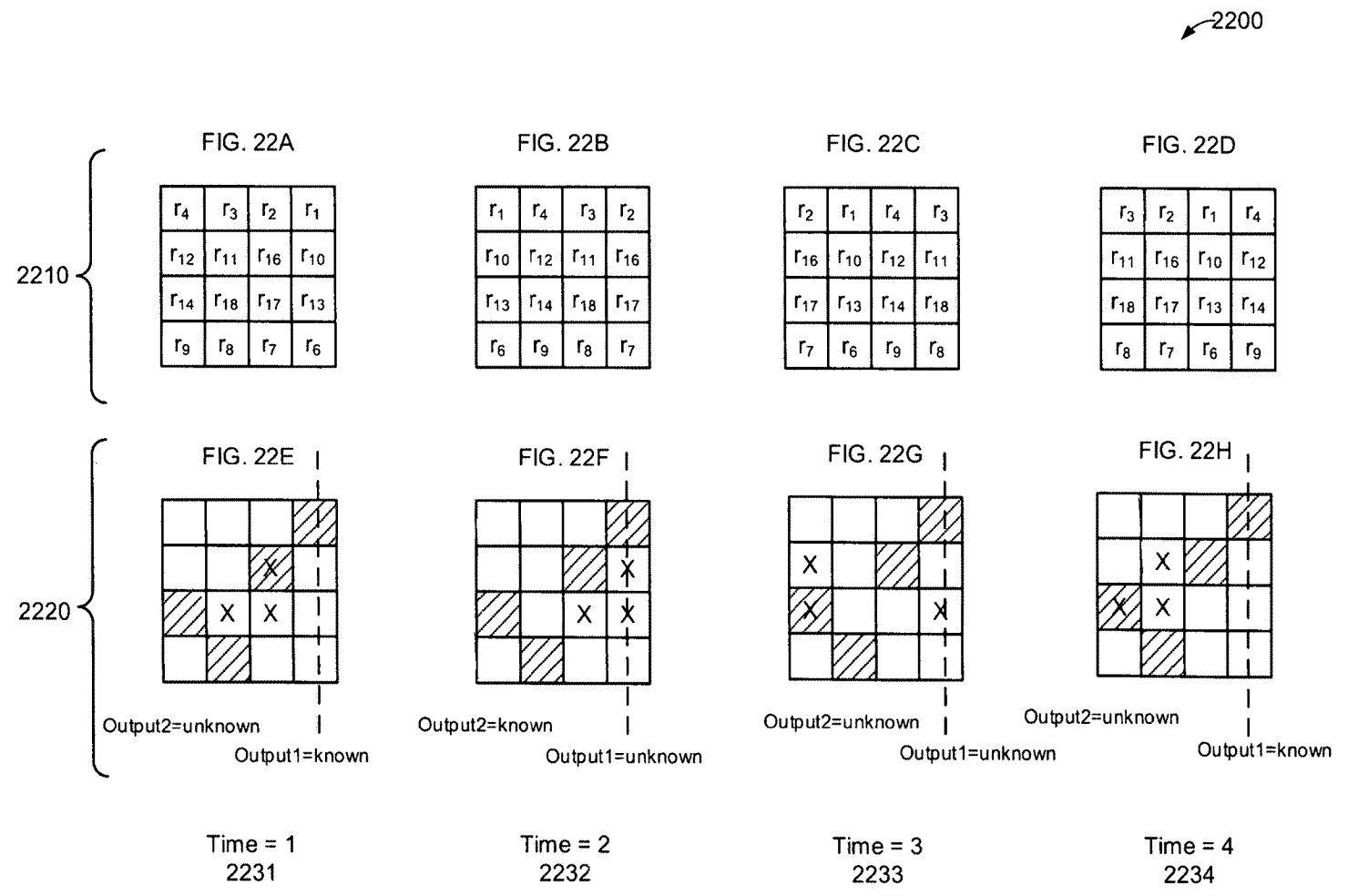

FIG. 22 indicates Output1 via the dashed line as in FIG. 20, however now Output2 terms are indicated via hash shading since a "straight" diagonal is no longer producing the Output2.

Similar to the analysis above for FIG. 20

$$O_1(1) = r_1 \oplus r_{10} \oplus r_{13} \oplus r_6$$

$$O_2(1) = r_1 \oplus r_{16} \oplus r_{14} \oplus r_8$$

where we will later note that $r_{16}=X$ $$O_1(2) = r_2 \oplus r_{16} \oplus r_{17} \oplus r_7$$

where we will later note that $r_{16}=X$ and $r_{17}=X$ $$O_2(2) = r_2 \oplus r_{11} \oplus r_{13} \oplus r_9$$

$$O_1(3) = r_3 \oplus r_{11} \oplus r_{18} \oplus r_8$$

where we will later note that $r_{18}=X$ $$O_2(3) = r_3 \oplus r_{12} \oplus r_{17} \oplus r_6$$

where we will later note that $r_{17}=X$ $$O_1(4) = r_4 \oplus r_{12} \oplus r_{14} \oplus r_9$$

$$O_2(4) = r_4 \oplus r_{10} \oplus r_{18} \oplus r_7$$

where we will later note that $r_{18}=X$

So in this arrangement we see that $O_1(1)$ and $O_2(2)$ and $O_1(4)$ allow us to directly observe from the respective outputs:

$r_1$, $r_{10}$, $r_{13}$, $r_6$ from Output1 at $O_1(1)$ $r_2$, $r_{11}$, $r_{13}$, $r_9$ from Output2 at $O_2(2)$ and $r_4$, $r_{12}$, $r_{14}$, $r_9$ from Output1 at $O_1(4)$ By directly observable we mean that there are no unknowns (Xs) in the output and therefore the cells are observable from the output. If there is an unknown X in the output then we cannot determine what the output should be and so it is not directly observable.

Rearranging these in sequential order $r_1$, $r_2$, $r_4$, $r_6$, $r_9$, $r_{10}$, $r_{11}$, $r_{12}$, $r_{13}$, $r_{14}$ we see that we are missing $r_3$, $r_7$, $r_8$, $r_{16}$, $r_{17}$, $r_{18}$ where $r_{16}$, $r_{17}$, $r_{18}$ are X's so we need to observe $r_3$, $r_7$, $r_8$ Note that in the direct observations we directly observe $r_{13}$ and $r_9$ twice.

Now we observe that $r_3$ is only visible in $O_1(3)$ and $O_2(3)$

Now recall from above:

$$O_1(3) = r_3 \oplus r_{11} \oplus r_{18} \oplus r_8$$

where we will later note that $r_{18}=X$ $$O_2(3) = r_3 \oplus r_{12} \oplus r_{17} \oplus r_6$$

where we will later note that $r_{17}=X$

We need to effectively remove $r_{18}$ from $O_1(3)$ or $r_{17}$ from $O_2(3)$ to observe $r_3$.

Looking for another output that has $r_{18}$ we note that $$O_2(4) = r_4 \oplus r_{10} \oplus r_{18} \oplus r_7$$

has a $r_{17}$ so:

$$O_1(3) \oplus O_2(4) = r_3 \oplus r_{11} \oplus r_{18} \oplus r_8 \oplus r_4 \oplus r_{10} \oplus r_{18} \oplus r_7$$

which reduces to:

$$r_3 \oplus r_{11} \oplus r_8 \oplus r_4 \oplus r_{10} \oplus r_7$$

removing the only X $r_{18}$ so now $r_3$ is observable.

We also want to observe $r_7$, and $r_8$

Fortunately from the above $O_1(3) \oplus O_2(4)$ we note that both $r_7$, and $r_8$ are also observable.

So by removing $r_{18}$ we are able to observe $r_3$, $r_7$, $r_8$ which is what we wanted.

Now other combinations may also be possible. For example, looking at the second equation $$O_2(3) = r_3 \oplus r_{12} \oplus r_{17} \oplus r_6$$

where we will later note that $r_{17}=X$

We need to effectively remove $r_{17}$ from $O_2(3)$ to observe $r_3$.

Looking for another output having $r_{17}$ we see that the only other output having $r_{17}$ is:

$$O_1(2) = r_2 \oplus r_{16} \oplus r_{17} \oplus r_7$$

where we will later note that $r_{16}=X$ and $r_{17}=X$ $O_1(2)$ now introduces $r_{16}$ which we also need to remove. So looking for an output having only $r_{16}$ would be helpful and we find such at $$O_2(1) = r_1 \oplus r_{16} \oplus r_{14} \oplus r_8$$

where we will later note that $r_{16}=X$

So $O_2(3) \oplus O_1(2) \oplus O_2(1)$ should allow us to observe $r_3$

Performing the operations:

$$O_2(3) \oplus O_1(2) \oplus O_2(1) = r_3 \oplus r_{12} \oplus r_{17} \oplus r_6 \oplus r_2 \oplus r_{16} \oplus r_{17} \oplus r_7 \oplus r_1 \oplus r_{16} \oplus r_{14} \oplus r_8$$

$$O_2(3) \oplus O_1(2) \oplus O_2(1) = r_3 \oplus r_{12} \oplus r_6 \oplus r_2 \oplus r_7 \oplus r_1 \oplus r_{14} \oplus r_8$$

And here we also note that not only $r_3$ but also $r_7$, and $r_8$ are observable.

The approach above was looking at what cells (terms) could be directly observed and removing them from the total list of terms to be observed and then finding combinations of outputs that would allow the other remaining terms (cells) to be observable.

The invention is not so limited, for example, another "intuitive" approach is to observe the X's and try and find combinations that remove them all. If this can be done then the other cells are all observable.

So, for example, the outputs above that contain the unknowns are:

$O_2(1)=r_1 \oplus r_{16} \oplus r_{14} \oplus r_8$ where we will later note that $r_{16}=X$ $O_1(2)=r_2 \oplus r_{16} \oplus r_{17} \oplus r_7$ where we will later note that $r_{16}=X$ and $r_{17}=X$ $O_1(3)=r_3 \oplus r_{11} \oplus r_{18} \oplus r_8$ where we will later note that $r_{18}=X$ $O_2(3)=r_3 \oplus r_{12} \oplus r_{17} \oplus r_6$ where we will later note that $r_{17}=X$ $O_2(4)=r_4 \oplus r_{10} \oplus r_{18} \oplus r_7$ where we will later note that $r_{18}=X$ Now we need "combinations" that will remove $r_{16}$, $r_{17}$, and $r_{18}$.

We know that $A \oplus A = 0$ so:

$O_1(3) \oplus O_2(4)$ will remove $r_{18}$ since each of these outputs have $r_{18}$.

and $O_2(1) \oplus O_1(2)$ will remove $r_{16}$ however it leaves $r_{17}$ which can be removed by XORing with $O_2(3)$, so $O_2(1) \oplus O_1(2) \oplus O_2(3)$ should remove $r_{16}$ and $r_{17}$ making all cells (terms) observable.

So for $O_1(3) \oplus O_2(4) = r_3 \oplus r_{11} \oplus r_{18} \oplus r_8 \oplus r_4 \oplus r_{10} \oplus r_{18} \oplus r_7 = r_3 \oplus r_{11} \oplus r_8 \oplus r_4 \oplus r_{10} \oplus r_7$ and arranging in order $O_1(3) \oplus O_2(4) = r_3 \oplus r_4 \oplus r_7 \oplus r_8 \oplus r_{10} \oplus r_{11}$ So for $O_2(1) \oplus O_1(2) \oplus O_2(3) = r_1 \oplus r_{16} \oplus r_{14} \oplus r_8 \oplus r_2 \oplus r_{16} \oplus r_{17} \oplus r_7 \oplus r_3 \oplus r_{12} \oplus r_{17} \oplus r_6$ and arranging in order $O_2(1) \oplus O_1(2) \oplus O_2(3) = r_1 \oplus r_2 \oplus r_3 \oplus r_6 \oplus r_7 \oplus r_8 \oplus r_{12} \oplus r_{14}$ So $O_1(3) \oplus O_2(4)$ makes $r_3$, $r_4$, $r_7$, $r_8$, $r_{10}$, and $r_{11}$ observable and $O_2(1) \oplus O_1(2) \oplus O_2(3)$ makes $r_1$, $r_2$, $r_3$, $r_6$, $r_7$, $r_8$, $r_{12}$, and $r_{14}$ observable.

Between these two we have $r_1$, $r_2$, $r_3$, $r_4$, $r_6$, $r_7$, $r_8$, $r_{10}$, $r_{11}$, $r_{12}$, and $r_{14}$ observable which leaves only $r_9$ and $r_{13}$ which we are unable to observe from these two terms. However, as noted above $r_2$, $r_{11}$, $r_{13}$, and $r_9$ are observable directly from Output2 at $O_2(2)$ so we have complete coverage or observability.

FIG. 23 illustrates, generally at 2300, an embodiment of the invention illustrating how error localization can be performed by X removal. 2310 illustrates the scan chain stitching. 2320 shows the scan Output wiring (Output1 2302 and Output2 2304). 2330 shows a resulting X map ($r_1$-$r_4$, $r_6$-$r_{14}$, and $r_{16}$=X, $r_{17}$=X, and $r_{18}$=X). Initial inspection shows that $r_{11}$ and $r_{12}$ are blocked both in Output1 ($O_1$) and Output2 ($O_2$). More careful inspection shows that $r_2$ and $r_3$ are also blocked.

So it looks like all the rest are blocked without using the techniques described.

Figure 24:
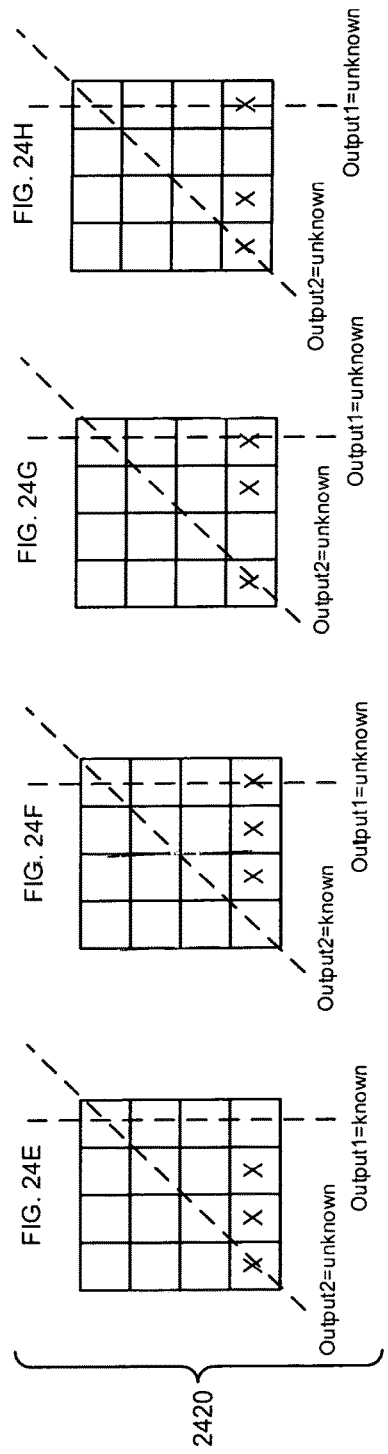

FIG. 24 illustrates, generally at 2400, one embodiment of the invention to illustrate using the stitching and outputs of FIG. 23 and the X map how we can perform error localization. Shown at 2410 are the register maps at times Time=1, 2, 3, and 4 at 2431-2434 respectively. In this particular embodiment to assist in understanding we have indicated at 2420 by dashed lines the registers contributing to Output1 ($O_1$) and Output2 ($O_2$) which in this case are column (Output1) and "straight" diagonal (Output2). At 2410 shaded register entries represent the X unknowns as shown at 2420 for each of the Time=1, 2, 3, and 4. Denoting the Output at a given clock time as $O_z(t)$ where z denotes the output and t the time then we observe (e.g. the clock cycle of observation).

$O_1(1)=r_1 \oplus r_{16} \oplus r_{10} \oplus r_{14}$ $O_2(1)=r_1 \oplus r_7 \oplus r_{12} \oplus r_{18}$ where we will later note that $r_{18}=X$ $O_1(2)=r_2 \oplus r_7 \oplus r_{11} \oplus r_{16}$ where we will later note that $r_{16}=X$ $O_2(2)=r_2 \oplus r_8 \oplus r_{13} \oplus r_{14}$ $O_1(3)=r_3 \oplus r_8 \oplus r_{12} \oplus r_{17}$ where we will later note that $r_{17}=X$ $O_2(3)=r_3 \oplus r_9 \oplus r_{10} \oplus r_{16}$ where we will later note that $r_{16}=X$ $O_1(4)=r_4 \oplus r_9 \oplus r_{13} \oplus r_{18}$ where we will later note that $r_{18}=X$ $O_2(4)=r_4 \oplus r_6 \oplus r_{11} \oplus r_{17}$ where we will later note that $r_{17}=X$ From the above we can directly observe $r_1$, $r_{16}$, $r_{10}$, $r_{14}$ via $O_1(1)$ and $r_2$, $r_8$, $r_{13}$, $r_{14}$ from $O_2(2)$.

Note that direct observation of $r_{14}$ is twice.

The remaining blocked registers are $r_3$, $r_4$, $r_7$, $r_9$, $r_{11}$, and $r_{12}$. X are $r_{16}$, $r_{17}$, and $r_{18}$.

Now $O_1(2) \oplus O_2(3)$ will remove $r_{16}$ since each output has $r_{16}$ and the result will be:

$O_1(2) \oplus O_2(3) = r_2 \oplus r_3 \oplus r_7 \oplus r_9 \oplus r_{10} \oplus r_{11}$ So the only remaining registers that are blocked are $r_4$ and $r_{12}$.

Note that with $O_1(2) \oplus O_2(3)$ we get to observe $r_2$, and $r_{10}$ for a second time.

Now to observe $r_4$ and $r_{12}$ we can look at the 8 equations above and we note that $r_4$ is in $O_1(4)$ and $O_2(4)$ (because $r_4$ is in upper right diagonal at Time=4), and that $r_{12}$ is in $O_2(1)$ and $O_1(3)$.

Several different combinations are possible to observe $r_4$ and $r_{12}$.

For example:

$O_2(1) \oplus O_1(4)$ will allow observation of $r_4$ and $r_{12}$ because $r_{18}=X$ will be removed.

$O_1(3) \oplus O_2(4)$ will allow observation of $r_4$ and $r_{12}$ because $r_{17}=X$ will be removed.

The full expression is:

$O_2(1) \oplus O_1(4) = r_1 \oplus r_7 \oplus r_{12} \oplus r_{18} \oplus r_4 \oplus r_9 \oplus r_{13} \oplus r_{18} = r_1 \oplus r_4 \oplus r_7 \oplus r_9 \oplus r_{12} \oplus r_{13}$ So here we get to observe for the second time $r_1$ and $r_{13}$.

$O_1(3) \oplus O_2(4) = r_3 \oplus r_8 \oplus r_{12} \oplus r_{17} \oplus r_4 \oplus r_6 \oplus r_{11} \oplus r_{17} = r_3 \oplus r_4 \oplus r_6 \oplus r_8 \oplus r_{11} \oplus r_{12}$ So here we get to observe for the second time $r_8$.

Note that because $r_{14}$ can be observed both in $O_1(1)$ and $O_2(2)$ if an error is captured at that scan cell when we XOR both those outputs the error will disappear from both then we know the error was located at $r_{14}$. So post processing equipment can detect the scan cell where an error occurred (by XORing to make the error removed from the terms and then deducing that the error was at the intersection of the XORed diagonals).

Specifically for the $r_{14}$ example:

$$O_1(1)=r_1 \oplus r_{16} \oplus r_{10} \oplus r_{14}$$

$$O_2(2)=r_2 \oplus r_8 \oplus r_{13} \oplus r_{14}$$

and $$O_1(1) \oplus O_2(2)=r_1 \oplus r_{16} \oplus r_{10} \oplus r_{14} \oplus r_2 \oplus r_8 \oplus r_{13} \oplus r_{14}$$

which reduces to:

$$O_1(1) \oplus O_2(2)=r_1 \oplus r_2 \oplus r_8 \oplus r_{10} \oplus r_{13} \oplus r_{16}$$

which has no $r_{14}$ term

Figure 11:
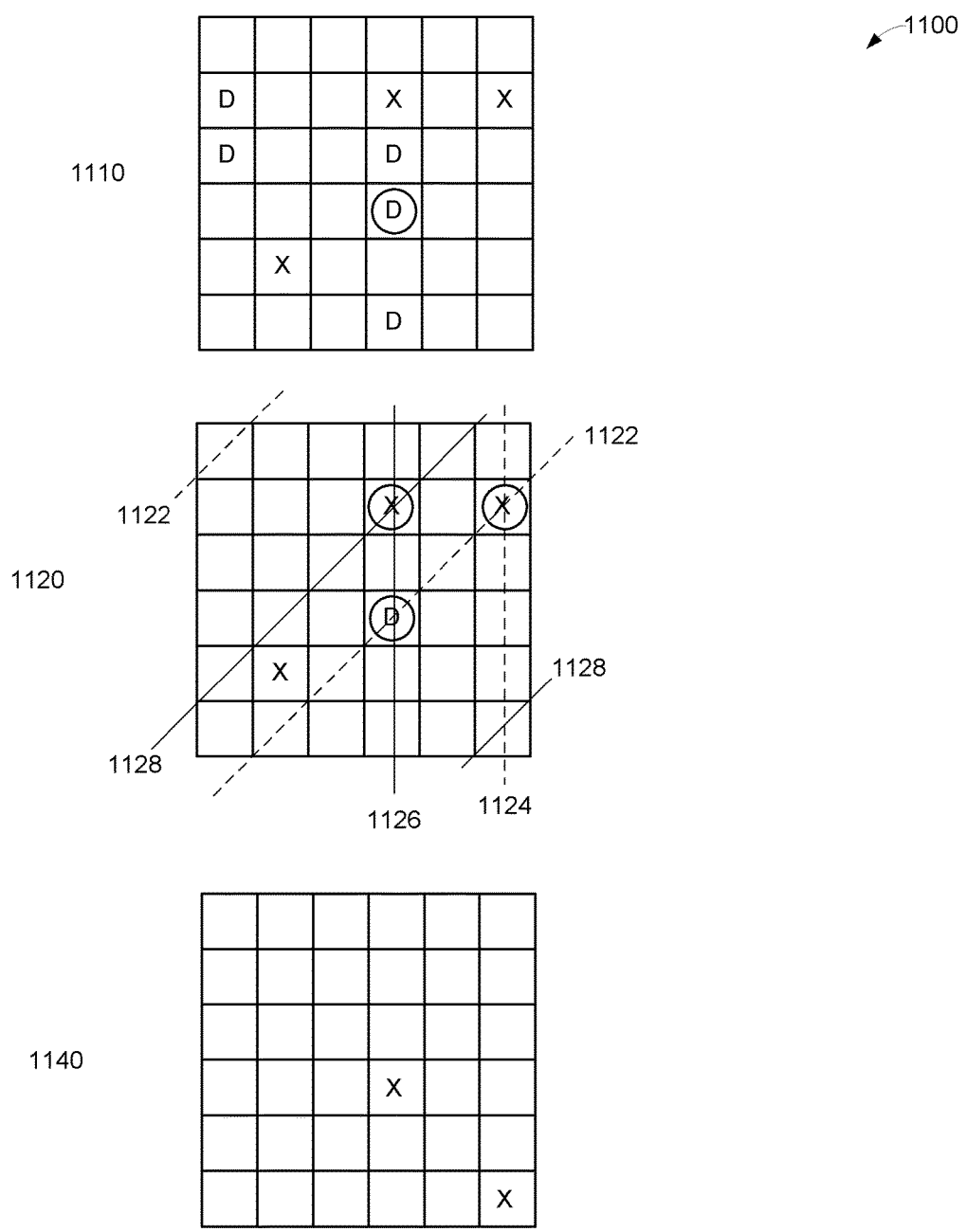
FIG. 11 illustrates an embodiment of the invention showing debugging.

While the techniques disclosed have been primarily orientated to checking a device under test, the invention is not so limited, and the techniques described may be used to debug a device. This may be desired when unexpected defects or errors or faults occur or for just debugging a device to determine more details on a failure mode. We will illustrate this debug capability by example. FIG. 11 at 1100 is one such example.

FIG. 11 illustrates, at 1110 an example of a pattern response. All D's (errors, faults, defects) come from different faults. Because of the single fault assumption only one occurs so let's assume the one D circled occurs. Since this D is masked by the 2 Xs as shown at 1120 circled D where we are assuming that the compaction consists of the columns plus the regular diagonal (straight diagonal). The other D's are removed for clarity. That is circled D is masked by the diagonal 1122 in combination with the column 1126. The tester will only detect the fault (circled D) after computing online XORs. For example the XORs shown in the dashed lines at 1122 and 1124 can be used which will remove the X at the intersection of the 1122 and 1124. Note that diagonal 1122 "wraps" to the upper left.

Likewise an XOR based on solid lines 1126 and diagonal 1128 (note it wraps to lower right) can be used to remove the X at the intersection of 1126 and 1128.

During post processing both these XOR operations may be performed (e.g. offline) and thus detect the circled D spot. At 1140 is shown the intersection of the two X free sets. Since, going back to the potential D locations at 1110, only the center one has a potential D that is the D location.

If the intersection has 2 or more locations it is still a good initial place to look using inspections tools (e.g. microscope) to look for defects because this approach has already narrowed down the search. Defects may be caused by, for example, but not limited to dust particles (e.g. affecting the die, bridges, opens, stuck at one, stuck at zero, shorts, etc.), process variations (e.g. lithography, CMP (chemical mechanical polishing), hot electrons, etc), and performance variations (e.g. race conditions, timing, etc.).

The techniques discussed above were related to a single test in relation to a set of scan cells. However, the invention is not so limited and the techniques may be used for inter-test, that is, between a series of tests.

Figure 49:
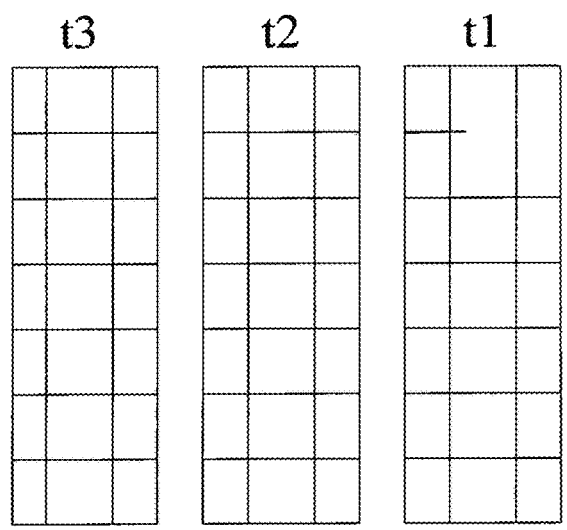
FIG. 49 illustrates the table showing a set of tests denoted by a series of matrices shown in an order, with t1, t2, and t3 denoting respectively test 1, test 2, and test 3, as described in paragraph [0152].

In one embodiment of the invention a set of tests are denoted by a series of matrices (indicative of a scan cell matrix) shown in an order. For example in FIG. 49 are shown t1, t2, and t3 denoting respectively test 1, test 2, and test 3, run respectively in the order t1 then t2 then t3.

Figure 25:
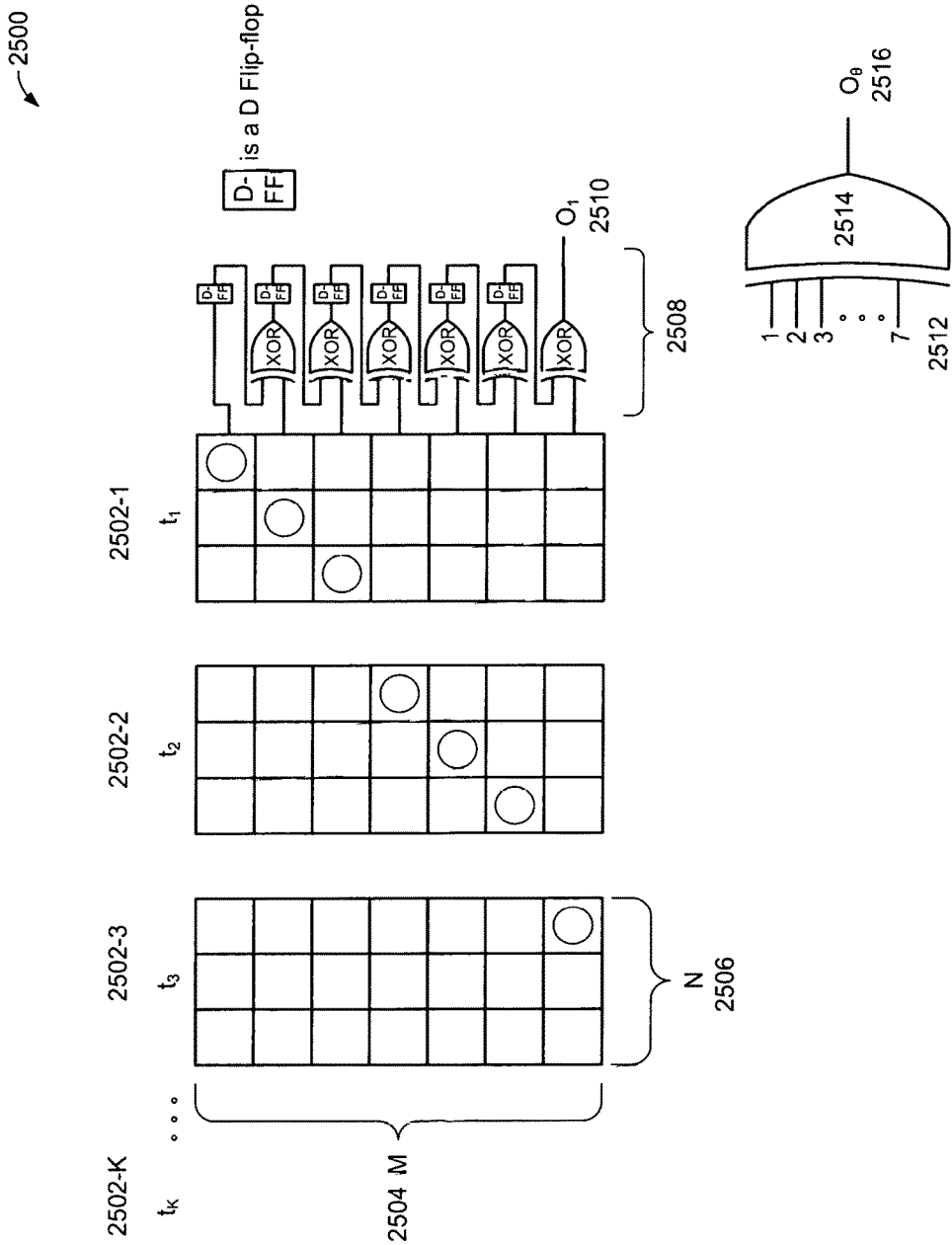
FIG. 25 illustrates one embodiment of the invention showing inter-test operation.

FIG. 25 illustrates, generally at 2500, one embodiment of the invention showing inter-test operation. A series of K tests are shown in sequence $t_1, t_2, t_3, \ldots, t_K$ respectively denoted 2502-1, 2502-2, 2502-3, ..., 2502-K. Each test $t_1$, $t_2$, etc. are of a scan cell matrix size of M×N (2504×2506 respectively). At 2514 is an XOR having M inputs (2512) each input connected to one of the M row scan cell outputs and producing an output $O_\theta$. At 2508 is circuitry using D flip flops or T flip flops similar to that shown in FIG. 9 (and as discussed supra) which produces a "straight" diagonal output $O_1$. As illustrated in FIG. 25 this "straight" diagonal is indicated by the circles in the scan cells figuratively spanning not only test 1 ($t_1$) but also test 2 ($t_2$) and test 3 ($t_3$). That is the diagonal is now spanning inter-test and as such may be used as discussed above (for what we now call intra-test) for testing inter-test.

In one embodiment of the invention, for example, as illustrated in FIG. 25, scan chain outputs are not recirculated. Because there are no recirculated scan chain outputs there is no 2X delay in loading test patterns. That is the 2X delay from separating the loading of the scan chain from the unloading of the scan chain is not present. Therefore, because there are no recirculated scan chains there is no 2X time increase from unloading and then loading test patterns.

Figure 26:
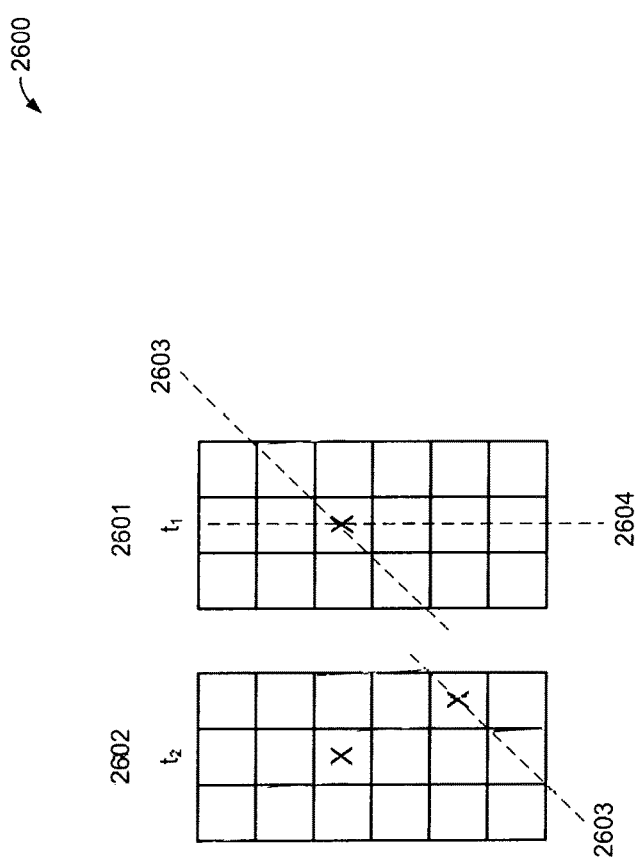
FIG. 26 illustrates a diagonal spanning test patterns each having unknown (X) states.

It should be noted that inter-test diagonals do not reappear at the other side of the scan cell matrix because a new test now occupies the scan cells that were the previous. Other than this inter-test effect, the discussion above with respect to intra-tests applies and the same limitations with blind spots, etc. apply, except that now they appear with Xs that appear in different test response outputs (e.g. $t_1, t_2, \ldots, t_K$). FIG. 26 illustrates, generally at 2600, this situation where at 2016 is test 1 ($t_1$), and at 2602 is test 2 ($t_2$) and respectively in each test are shown the unknown states X and 2603 illustrates a diagonal spanning $t_1$ and $t_2$ and 2604 illustrates a column output as might be generated by FIG. 25 $O_\theta$ at a point in time.

Figure 27:
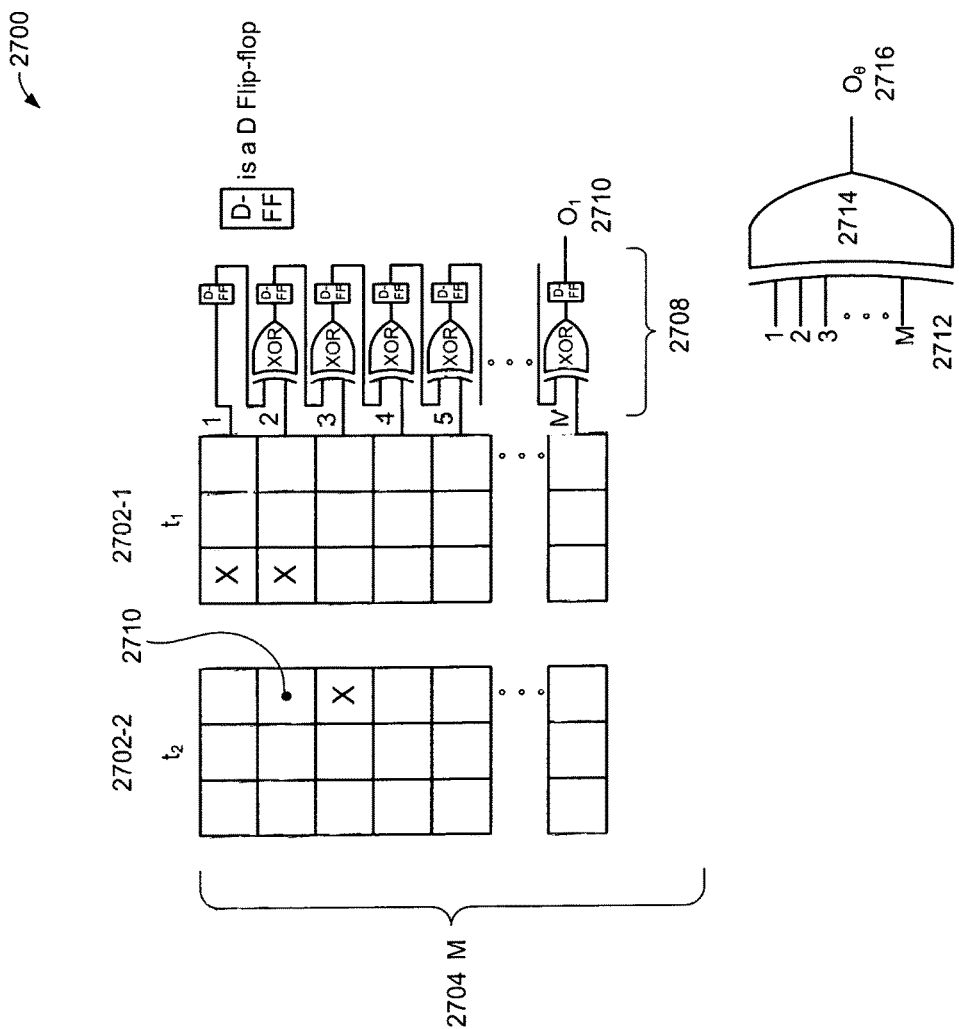
FIG. 27 illustrates one embodiment of the invention showing an inter-test blind spot or blind scan cell.

FIG. 27 illustrates, generally at 2700, an example of the inter-test blind spot or blind scan cell. At 2702-1 is test 1 ($t_1$) and at 2702-2 test 2 ($t_2$). Each test ($t_1$, and $t_2$) shown with the unknown (X) values. At 2708 is the circuitry producing a "straight" diagonal output $O_1$ 2708, and at 2716 is $O_\theta$ from XOR gate 2714 which has inputs 2712 each of which is tied to a scan row output. At 2710 is indicated the inter-test blind spot or blind scan cell.

Referring back to FIG. 25 where the scan cell matrix is M×N, M and N may be of any size and relation. It is noted that if M>N this is considered optimal from a test loading and unloading time standpoint. Additionally, the larger M is compared to N the larger the compaction will be as noted below.

Now for the inter-test scenario where M=number of scan chains (rows), and N=Length of the Scan Chains we have:

Total Test Set Data=(Number of Tests×Length of the Scan Chains (N)+Number of scan chains (M))× Number of Outputs and Total Test Set Data<Number of Scan Cells×Number of Tests so inter-test obtains better data compaction (than non-inter-test) by compacting the response of several tests together.

Time reduction for inter-test=approximately M.

More exactly inter-test time reduction is:

$$\frac{\text{Number of Scan Cells} \times \text{Number of Tests}}{N \times \text{Number of Tests} + M - 1}$$

When Number of Tests is large this equation has a result slightly lower than M.

Figure 28:
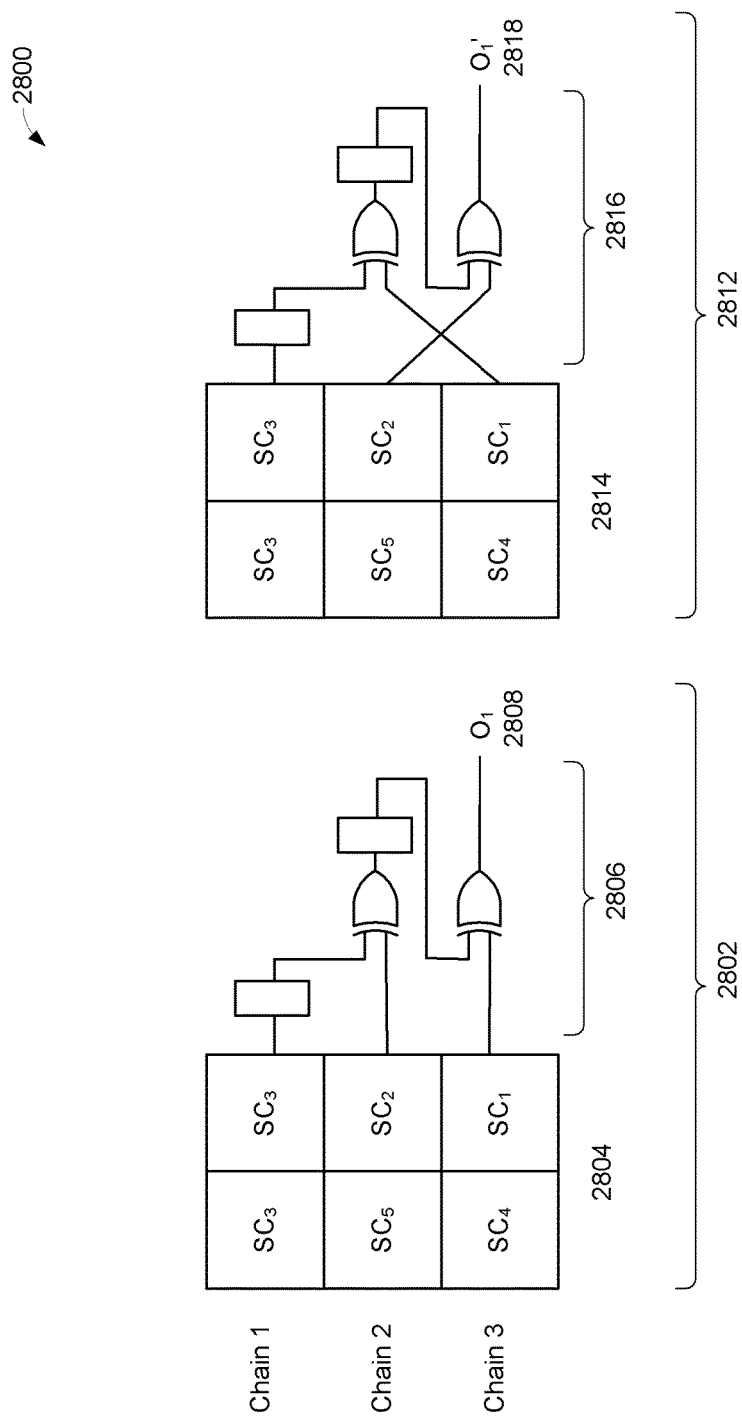
FIG. 28 illustrates embodiments of the invention showing changing the interconnections of scan chain outputs.

Additionally, there are up to M!+1 (M factorial plus one) (counting $O_\theta$) different compaction outputs achievable by changing the interconnections at the scan chain outputs. This is illustrated in FIG. 28. FIG. 28 illustrates, generally at 2800, changing the interconnection at scan chain (SCx) outputs where x=1, 2, 3, ..., p. At 2802 is shown 3 scan chains: chain 1, chain 2, and chain 3 respectively cells at 2804 $SC_6$ and $SC_3$; $SC_5$ and $SC_2$; and $SC_4$ and $SC_1$. As may be seen by the connections to circuitry 2806 it produces at 2808 $O_1$ a "straight" diagonal. 2812 has the same 3 scan chains at 2814 however the outputs from the scan cells into circuitry 2816 are changed via interconnections so that 2818 $O_1'$ produces a non-"straight" diagonal.

With respect to FIG. 28, when the output of the scan Chain 1 is always connected to the same position of the compactor (e.g. circuitry 2806, 2816) you get two possible connections for the other two. Scan chain 1 can be connected into other positions of the output compactor thereby generating the M! possibilities for connections where M is the number of scan chains.

Figure 29:
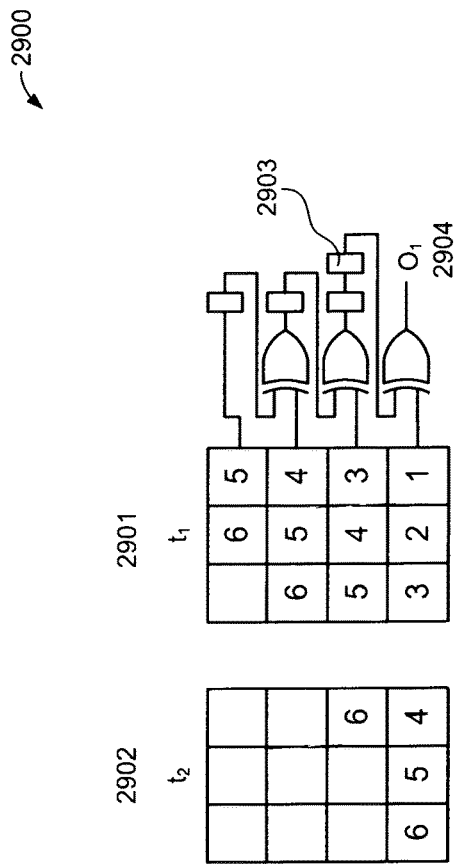
FIG. 29 illustrates one embodiment of the invention showing an extra delay in an output combination.

Additionally, as noted above and in the FIG. 9 description the number of memory or delay elements may vary in the scan cell output circuitry so as to produce varying diagonals. For example, in FIG. 29 is shown, generally at 2900, one embodiment of the invention showing at 2901 test 1 ($t_1$) and at 2902 test 2 ($t_2$), and at 2903 an extra delay, and at 2904 the output ($O_1$). The numbers in the cells are the clock cycle in which the respective scan cell values are shifted out.

Figure 30:
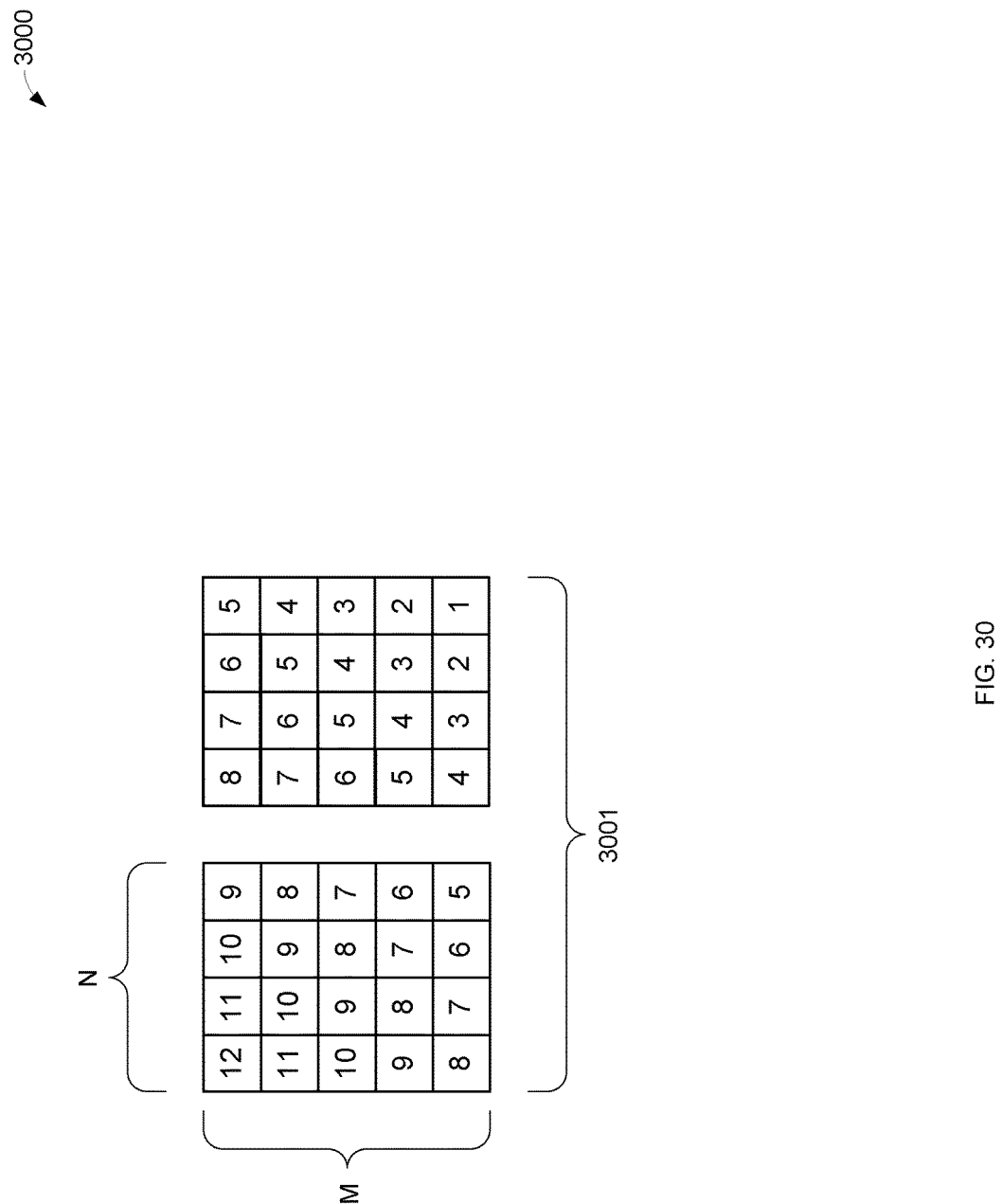
FIG. 30 illustrates one embodiment of the invention showing clock cycles carrying data.

Additionally, note for the inter-test total data above that if the column output (denoted $O_\theta$) is used the total data is slightly lower. This is because there are less clock cycles that carry data in that output. For example, as illustrated generally at 3000 in FIG. 30 is one embodiment of the invention showing this. Here $O_1$ considered the diagonal output has a length of 12 meaning that there are 12 sequential bits of information while $O_\theta$ has a length of 8 (3001) column cycles. So if t=number of tests and M=number of scan rows, and N=length of scan chain then:

Length of $O_\theta = t \times N$ and

Length of $O_1 = t \times N + M - 1$ where Length=the number of sequential bits in the output.

Also it should be noted that for the M!+1 possibilities we can use any combination of 2, 3, 4, ..., M!+1. For example, in FIG. 31, shown generally at 3100, is an embodiment showing combinations that result in 3 outputs $O_0$ (3110), $O_1$ (3111), and $O_2$ (3112). Thus we can generate as many inter-test diagonals as needed. Note that in FIG. 31 only a single delay is used (and none on the output), however, as noted and explained above any combination of delay elements (memory) are possible.

Thus a Method and Apparatus for Concurrent Inter-Test Response Compaction and Diagnosis have been described.

Because of various considerations in embodiments of the present invention (for example, scan taps, logic functions, etc.) specialized hardware is required.

Figure 1:
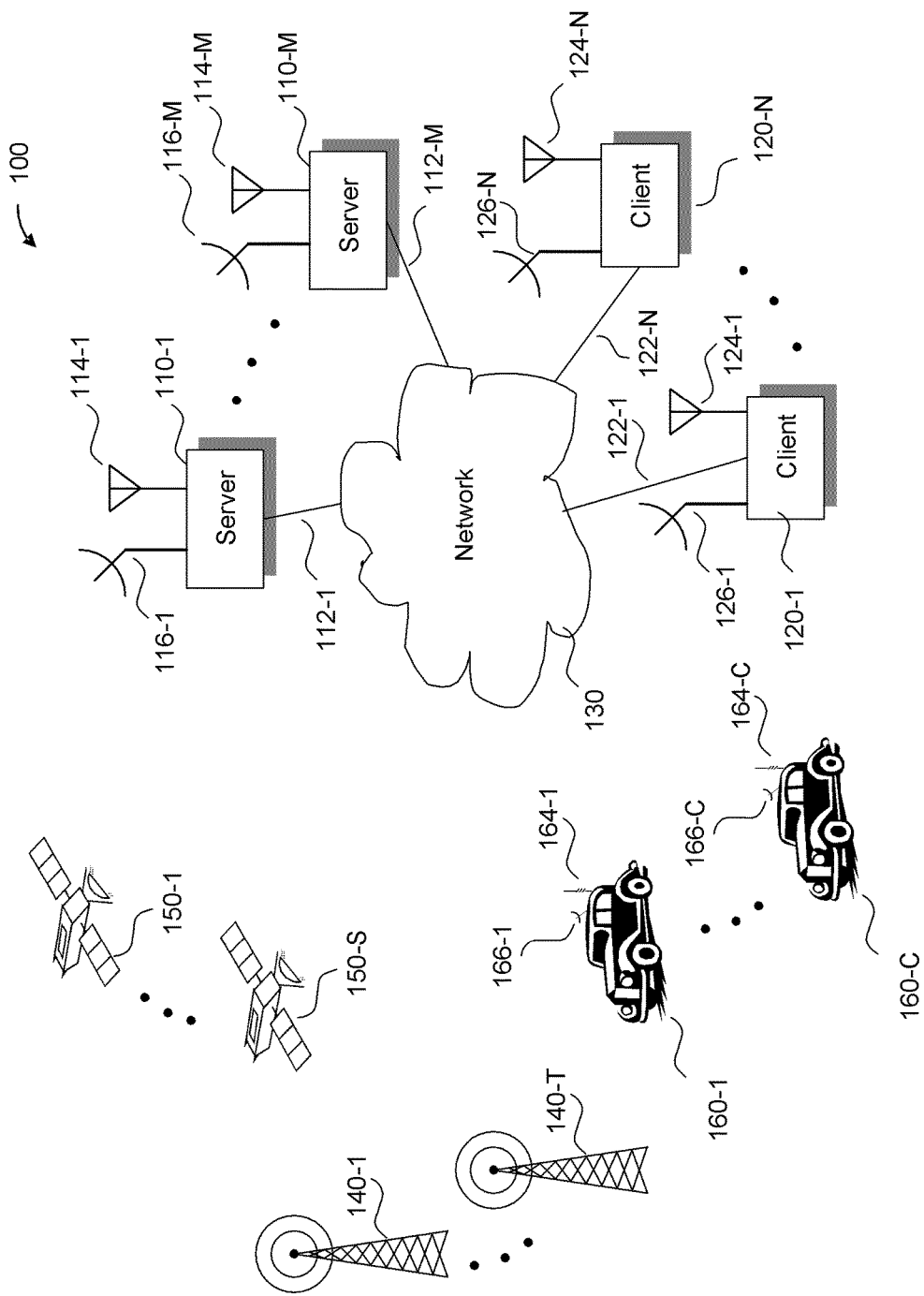
FIG. 1 illustrates a network environment in which the method and apparatus of the invention may be implemented.

FIG. 1 illustrates a network environment 100 from which the techniques described may be accessed and/or controlled. The network environment 100 has a network 102 that connects S servers 104-1 through 104-S, and C clients 108-1 through 108-C. More details are described below.

Figure 2:
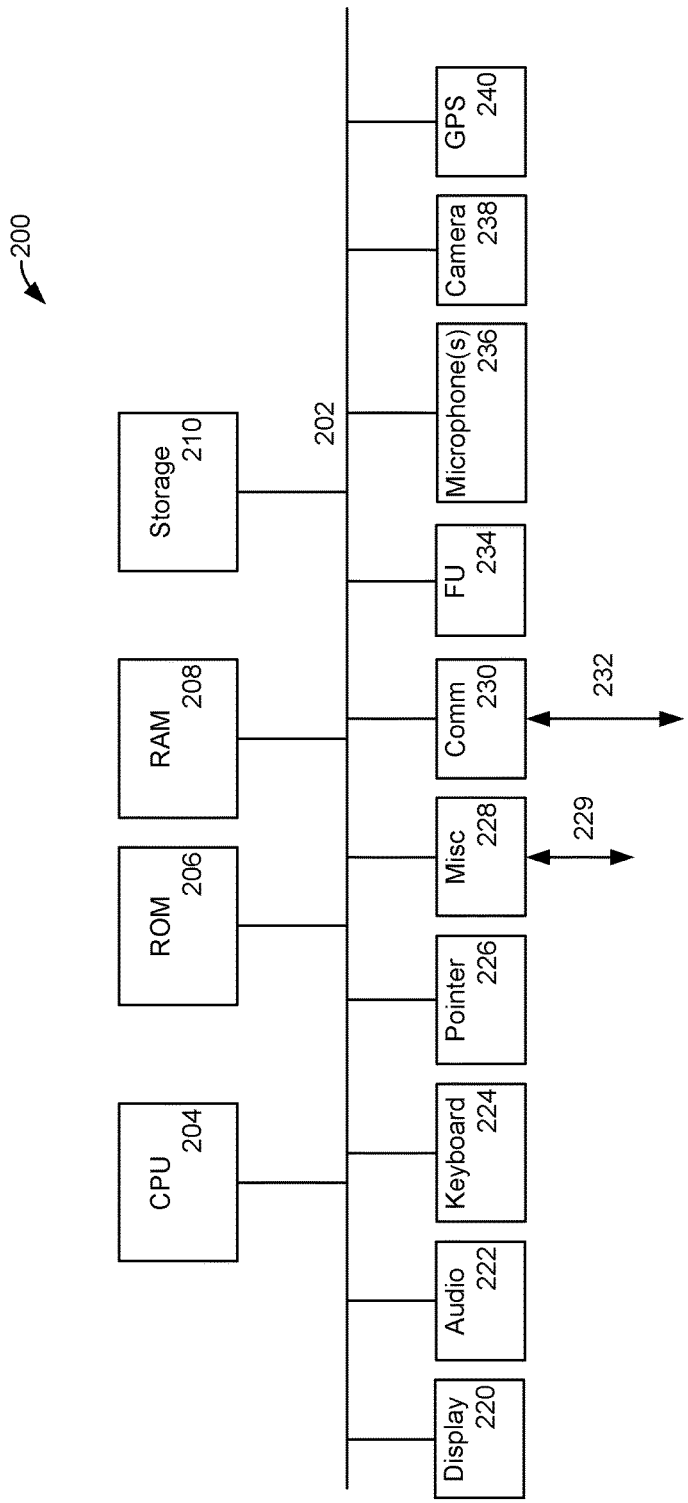
FIG. 2 is a block diagram of a specialized system which may implement some embodiments of the invention.

FIG. 2 is a block diagram of a specialized system 200 which some embodiments of the invention may employ parts of in conjunction with required specialized hardware and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied, accessed, and/or controlled. A plurality of specialized systems are shown in the form of M servers (110-1 through 110-M), and N clients (120-1 through 120-N), which are coupled to each other via network 130. A plurality of terrestrial based wireless communications links are shown in the form of T towers (140-1 through 140-T). A plurality of space based communications links are shown as S satellites (150-1 through 150-S). A plurality of vehicles are shown in the form of C cars (160-1 through 160-C). The M servers and N clients may also be coupled to each other via space based communications links 150-1 through 150-S, as well as terrestrial based wireless communications links 140-1 through 140-T, or a combination of satellite and terrestrial wireless links. Additionally, the C cars 160-1 through 160-C may be in communication with the satellites 150-1 through 150-S and/or the terrestrial wireless links 140-1 through 140-T.

Servers 110-1 through 110-M may be connected to network 130 via connections 112-1 through 112-M, respectively. Servers 130-1 through 130-M may be connected to the terrestrial links 140-1 through 140-T via antennae 114-1 through 114-M, respectively. Servers 110-1 through 110-M may be connected to space based communications links 150-1 through 150-S via dish antennae 116-1 through 116-M.

Clients 120-1 through 120-N may be connected to the network 130 via connections 122-1 through 122-N. Clients 120-1 through 120-N may be connected to the terrestrial links 140-1 through 140-T via antennae 124-1 through 124-N. Clients 120-1 through 120-N may be connected to space based communications links 150-1 through 150-S via dish antennae 126-1 through 126-N.

Cars 160-1 through 160-C may be connected to the terrestrial links 140-1 through 140-T via antennae 164-1 through 164-C. Cars 160-1 through 160-C may be connected to space based communications links 150-1 through 150-S via antennae 166-1 through 166-C.

Clients 120-1 through 120-N may consist of, but are not limited to, for example, a receiver, a communications device, a radio system, or other receiving devices such as portable cell phones, smartphones, etc. Applications may be running on the clients 120-1 through 120-N, while web pages and information being browsed may reside on the servers 110-1 through 110-M. Broadcasts may be coming from terrestrial sources 140-1 through 140T, and/or satellite links 150-1 through 150-S. For purposes of explanation, a single communication channel will be considered to illustrate one embodiment of the present techniques. It will be readily apparent that such techniques may be easily applied to multiple communication channels as well as simultaneous communications.

Network 130 may be a Wide Area Network (WAN), which includes the Internet, or other proprietary networks. Note that alternatively the network 130 may include one or more of a Local Area Network (LAN), satellite link, fiber network, cable network, or any combination of these and/or others. Network 130 may also include network backbones, long-haul telephone lines, Internet service providers, and various levels of network routers.

The servers may represent, for example, disk storage systems alone or storage and computing resources. Likewise, the clients may have computing, storage, and viewing capabilities. The method and apparatus described herein may be accessed and/or controlled by essentially any type of communicating means or device whether local or remote, such as a LAN, a WAN, a system bus, etc. For example, a network connection which communicates via for example wireless may control an embodiment of the invention having a wireless communications device.

Terrestrial links 140-1 through 140-T may be, for example, wireless cellular telephone service providers. Space based communications links 170-1 through 170-S may be, for example, satellite broadcasters, global positioning satellites (GPS), etc. Communications system 100 may be implemented in any number of environments.

Referring back to FIG. 2, FIG. 2 illustrates a specialized system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228 via link 229, and communications 230 via port 232, Functional Unit (FU) 234, Microphone(s) 236, Camera 238, and GPS 240. Communications 230 may include, but is not limited to, Ethernet, WAN, LAN, Internet connection, WiFi, WiMax, etc. The bus system 202 may be for example, one or more of such buses as a system bus, Peripheral Component Interconnect (PCI), PCI Express (PCIe), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc., all non-transitory medium. Display 220 might be, for example, used by an embodiment of the present invention. Note that depending upon the actual implementation of a specialized system, the specialized system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a memory. These algorithmic descriptions and representations are used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate non-transitory physical quantities and are merely convenient labels applied to these quantities. Unless specifically stated otherwise as apparent from the discussion, it is appreciated that throughout the description, discussions utilizing terms such as "processing" or "calculating" or "determining" or "displaying" or the like, can refer to the action and processes of a specialized system, or similar electronic device, that manipulates and transforms data represented as physical (electronic) quantities within the specialized system's registers and memories into other data similarly represented as physical quantities within the specialized system memories or registers or other such information storage, transmission, or display devices.

An apparatus for performing the operations herein can implement the present invention. This apparatus is specially constructed for the required purposes. Such a specially constructed apparatus may stored information in a non-transitory readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of non-transitory media suitable for storing electronic instructions either local to the specially constructed apparatus or remote to the specially constructed apparatus.

A specialized apparatus to perform the required methods is required. For example, any of the methods according to the present invention can be implemented in hard-wired circuitry specifically designed for the functionality disclosed, or by programming special hardware having, for example, in one embodiment, a particular machine such as a CPU specifically designed with a 16 bit or greater barrel shifter and a carry look ahead arithmetic logic unit. As disclosed Applicant submits that any results are tied to a particular machine or apparatus and/or transform a particular article into a different state or thing and that such particulars and/or things are non-trivial. For example, in FIG. 2 at 220 is a display. The results of the specialized machine may return an electronic value and such a value can be stored in hardware on the specialized machine and transformed into a graphical representation that can be displayed to a user of the specialized machine. For example, in one embodiment, the returned value may be stored as a group of physical electrons on a trapped gate of a flash memory device. These physical electrons may then be transformed into a graphical representation, for example, by twisting the molecules of a liquid crystal display so that a carrier signal can be modulated and produces on reception a molecular change in a rod and cone receptor of a human user to produce physical electrons thus producing a tangible useful result and transformation tied to a particular machine specifically designed, for example, with a 16 bit or greater barrel shifter and a carry look ahead arithmetic logic unit. For example the specialized hardware is required for logical operations and comparisons of values. For example, in one embodiment, the returned value may be stored as a series of holes on a paper tape that may be read by a person (e.g. a blind person) by tactile sensation (e.g. output from a KSR-33 Teletype). As disclosed Applicant submits that these results are tied to a particular machine or apparatus and/or transform a particular article into a different state or thing and that such particulars and/or things are non-trivial and as such satisfy Bilski.

The methods of the invention may be implemented using instructions on the specialized hardware as noted supra. If written in a programming language conforming to a recognized standard, sequences of instructions designed to implement the methods can be compiled for execution on the specialized hardware. In addition, the present invention is not described with reference to any particular programming language. It will be appreciated that a variety of programming languages may be used to implement the teachings of the invention as described herein on specialized hardware. Furthermore, it is common in the art to speak of instructions, in one form or another (e.g., program, procedure, application, driver, . . . ), as taking an action or causing a result. Such expressions are merely a shorthand way of saying that execution of the instructions by the specialized hardware causes it to perform an action and produce a tangible concrete non-transitory result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a specialized machine, the expression of that technique may be more aptly and succinctly conveyed and communicated as a formula, algorithm, or mathematical expression. Thus, one of ordinary skill in the art would recognize a block denoting A+B=C as an additive function whose implementation in hardware would take two inputs (A and B) and produce a summation output (C). Thus, the use of formula, algorithm, or mathematical expression as descriptions is to be understood as having a physical embodiment in at least hardware (such as a specialized system in which the techniques of the present invention may be practiced as well as implemented as an embodiment).

A machine-readable medium is understood to include any non-transitory mechanism for storing or transmitting information in a form readable by a machine (e.g., a specialized machine). For example, a non-transitory machine-readable medium includes read only memory (ROM); random access memory (RAM); magnetic disk storage media; optical storage media; flash memory devices; devices having non-transitory storage.

As used in this description, "substantially" or "substantially equal" or similar phrases are used to indicate that the items are very close or similar. Since two physical entities can never be exactly equal, a phrase such as "substantially equal" is used to indicate that they are for all practical purposes equal.

It is to be understood that ATE (automatic test equipment), ATPG (automatic test pattern generator), and integrated circuit (IC) device implementations are possible for one or more embodiments of the present invention.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

It is to be understood that in any one or more embodiments of the invention where alternative approaches or techniques are discussed that any and all such combinations as may be possible are hereby disclosed. For example, if there are five techniques discussed that are all possible, then denoting each technique as follows: A, B, C, D, E, each technique may be either present or not present with every other technique, thus yielding $2^5$ or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus while particular embodiments and applications of the present invention have been illustrated and described, it is to be understood that the invention is not limited to the precise construction and components disclosed herein. Various modifications, changes and variations which will be apparent to one of skill in the art may be made in the arrangement, operation and details of the method and apparatus of the present invention disclosed herein without departing from the spirit and scope of the invention as defined in the claims.

What is claimed is:

1. A method for improving output response testing during the manufacturing process of integrated circuits by locating an error value in a scan cell of a scan chain in a plurality of concatenated test pattern output responses during output response test compression instead of using uncompressed test pattern responses to locate the error value or discarding the entire selections of said test pattern output responses, the method comprising:

Comparing test result values of scan cell selections to the expected result values to identify two or more scan cell selections that contain error values; and XORing a first selection of scan cells containing inner samples of scan chain test response data having said error value with at least one other selection of scan cells containing inner samples of scan chain test response data having said error value to locate said error value, Wherein said first selection of scan cells containing inner samples of scan chain test response data has at least one scan cell containing an inner sample of scan chain data not in common with any of the scan cells in said second selection of scan cells containing inner samples of scan chain test response data, and Wherein at least one of said first and second selections of scan cells containing inner samples of scan chain test response data contains at least one scan cell from a time location different from the time location of at least one other scan cell in said first or said second selections of scan cells containing inner samples of scan chain test response data.

2. The method of claim 1, wherein in said at least one scan cell from a time location different from the time location of at least one other scan cell in said first or second selections of scan cells containing inner samples of scan chain data occurs in the same selection of scan cells containing inner samples of scan chain data.

3. The method of claim 1, further comprising recirculating said scan chain output data to a scan chain input.

4. The method of claim 2, wherein said first and said second selections of scan cells containing inner samples of scan chain data are contained within scan chains and each of said scan chains has an input and an output, and further comprising recirculating said scan chain output data to a scan chain input.

5. The method of claim 1, wherein said first selection of scan cells containing inner samples of scan chain data is a row of scan data having said error and said second selection of scan cells containing inner samples of scan chain data is a vertical, horizontal, or diagonal column of scan data having said error.

6. The method of claim 1, wherein said first and said second selections of scan cells containing inner samples of scan chain data are contained within scan chains and each of said scan chains has an input and an output, wherein one or more of said scan chain outputs is delayed in time, and wherein at least one of said first selection of scan cells containing inner samples of scan chain data and said second selection of scan cells containing inner samples of scan chain data is formed by combining said one or more delayed scan chain outputs with a different of said scan chain outputs.

7. The method of claim 6, further comprising one or more XOR gates, wherein said method further comprises processing at least one of said first and second selections of scan cells containing inner samples of scan chain data through said XOR gates, and wherein said method further comprises performing said XORing inside the circuit through said XOR gates.

8. The method of claim 6, wherein the method further comprises performing said XORing outside said scan chains containing said first and said second selections of scan cells containing inner samples of scan chain data.

9. The method of claim 1, wherein the one of said first selection of scan cells containing inner samples of scan chain data and said second selection of scan cells containing inner samples of scan chain data that contains the at least one scan cell from a time location different from the time location of at least one other scan cell in said first or said second selections of scan cells containing inner samples of scan chain data extends into at least one second test pattern response.

10. A method for improving output response testing during the manufacturing process of integrated circuits by removing an unknown value from a scan chain output for a plurality of concatenated test pattern output responses without discarding the entire selection of said test pattern output responses, the method comprising:
  Comparing test result values of scan cell selections to the result values the scan cell selections would have in the absence of any said unknown values to identify two or more scan cell selections that contain unknown values; and
  XORing a first selection of scan cells containing inner samples of scan chain test response data having said unknown value with a second selection of scan cells containing inner samples of scan chain test response data having said unknown value to remove said unknown value;
  Wherein said first selection of scan cells containing inner samples of scan chain test response data has at least one scan cell containing an inner sample of scan chain test response data not in common with any of the scan cells in said second selection of scan cells containing inner samples of scan chain test response data;
  Wherein at least one of said first and second selections of scan cells containing inner samples of scan chain test response data contains at least one scan cell from a time location different from the time location of at least one other scan cell in said first or said second selections of scan cells containing inner samples of scan chain test response data;
  Wherein the unknown value will be located at the intersection of the said first and second selections of scan cells; and
  Wherein said unknown value is removed when said first selection of scan cells containing inner samples of scan chain test response data having said unknown value is XORed with said second selection of scan cells containing inner samples of scan chain test response data having said unknown value.

11. The method of claim 10 further comprising recirculating said scan chain output data to a scan chain input.

12. The method of claim 10, wherein said first selection of scan cells containing inner samples of scan chain data is a row of scan data having said unknown value and said second selection of scan cells containing inner samples of scan chain data is a vertical horizontal, or diagonal column of scan data having said unknown value.

13. The method of claim 10, wherein at least one of said first selection of scan cells containing inner samples of scan chain data and said second selection of scan cells containing inner samples of scan chain data is formed by combining delayed scan chain outputs.

14. The method of claim 13, wherein said XORing is performed inside the circuit by XOR gates.

15. The method of claim 10, wherein the one of said first selection of scan cells containing inner samples of scan chain data and said second selection of scan cells containing inner samples of scan chain data that contains the at least one scan cell from a time location different from the time location of at least one other scan cell in said first or said second selections of scan cells extends into at least a second test pattern response.

16. The method of claim 15, wherein said XORing is performed outside the circuit by a computing device.

17. The method of claim 10, wherein in said at least one scan cell from a time location different from the time location of at least one other scan cell in said first or second selections of scan cells containing inner samples of scan chain data occurs in the same selection of scan cells containing inner samples of scan chain data.

18. The method of claim 10, further comprising recirculating said scan chain output data to a scan chain input.

19. An apparatus for testing logic circuits, comprising:
  a plurality of scan chains of scan cells in said logic circuits, each of said plurality of scan chains having an output;
  a plurality of clocked memory elements in said logic circuits, each having a clock, an input, and an output, and a means of connecting said input of one of said clocked memory elements to an output of one of said scan chains;
  a plurality of XOR gates in said logic circuits, each having a first input, a second input, an output, and a means of connecting one input of each of said plurality of XOR gates to the output of one of said clocked memory elements, and a means of connecting the other input of each of said plurality of XOR gates to the output of one of said scan chains;

wherein the data flows in one direction, wherein said plurality of clocked memory elements are ordered from first to last based upon the direction of the data flow, wherein said plurality of XOR gates are ordered from first to last based upon the direction of the data flow, wherein a first one of said plurality of scan chain outputs is fed through said means of connecting said input of said clocked memory elements to an output of one of said scan chains into said input of said first in order of said plurality of clocked memory elements, wherein said output of said first in order of said plurality of clocked memory elements is fed through said means of connecting one input of each of said plurality of XOR gates to the output of one of said clocked memory elements in to a first input of one of said plurality of XOR gates and said one of said plurality of XOR gates second input is coupled to the output of one of said plurality of scan chains outputs other than said first one of said plurality of scan chain is fed through said means of connecting the other input of each of said plurality of XOR gates to the output of one of said scan chains into a second input of said first one of said plurality of XOR gates; and wherein the feeding of said outputs through said plurality of XOR gates results in the grouping of scan cells; and wherein the above-described elements and steps yield one value for each said groupings of scan cells.

20. The apparatus of claim 19, wherein the number of said plurality of clocked memory elements is equal to one less than the number of said plurality of scan chains, wherein the number of said plurality of XOR gates is equal to one less than the number of said plurality of scan chains, and wherein said plurality of scan chain outputs and said plurality of XOR gates are connected to produce a selection of scan cells containing inner samples of scan chain data.

21. The apparatus of claim 19, wherein said clocked memory elements are a type selected from the group consisting of D flip flops, T flip flops, SR flip flops and JK flip flops.

22. The apparatus of claim 19, wherein said first input of one of said plurality of XOR gates is the first in order of said plurality of XOR gates based upon the direction of the data flow.

23. The apparatus of claim 19, wherein the output of the last in order of said plurality of XOR gates based upon the direction of the data flow is output from the apparatus of claim 19.

24. An apparatus for testing logic circuits, comprising:
a plurality of scan chains, each of said plurality of scan chains having a scan chain output;
a plurality of clocked memory elements each having a clock, an input, an output and a means of connecting said input of one of said clocked memory elements to one of said scan chain outputs;
a means of sampling each of said clocked memory elements where said means of sampling has a plurality of means of connecting to one of said clocked memory element outputs;
wherein each of said scan chain outputs is fed through said means of connecting said input of said clocked memory elements;
wherein said plurality of means of connecting to an output of said means of sampling is fed to said plurality of clocked memory element outputs;
wherein each of said memory clock elements has an initial memory value before any said input of said clocked memory elements is fed into said memory clock elements; and
wherein said memory clock elements are configured to maintain their said initial memory value when the input is zero and to switch their memory value when the input is one.

* * * * *